US012388043B2

(12) United States Patent
Yanagida

(10) Patent No.: US 12,388,043 B2
(45) **Date of Patent: *Aug. 12, 2025**

(54) ELECTRONIC DEVICE WITH MULTIPLE RESIN LAYERS REDUCING SUPPRESSION IN RELIABILITY

(71) Applicant: ROHM CO., LTD., Kyoto (JP)

(72) Inventor: Hideaki Yanagida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 332 days.

This patent is subject to a terminal disclaimer.

(21) Appl. No.: 17/811,530

(22) Filed: Jul. 8, 2022

(65) Prior Publication Data

US 2022/0344300 A1 Oct. 27, 2022

Related U.S. Application Data

(63) Continuation of application No. 16/704,961, filed on Dec. 5, 2019, now Pat. No. 11,417,624.

(30) Foreign Application Priority Data

Feb. 26, 2019 (JP) ................................ 2019-032444

(51) Int. Cl.
*H01L 23/00* (2006.01)
*H01L 21/56* (2006.01)
*H01L 23/31* (2006.01)

(52) U.S. Cl.
CPC .............. *H01L 24/45* (2013.01); *H01L 21/56* (2013.01); *H01L 23/3192* (2013.01); *H01L 24/43* (2013.01); *H01L 24/85* (2013.01)

(58) Field of Classification Search
CPC ......... H01L 24/45; H01L 24/85; H01L 24/16; H01L 24/81; H01L 24/13;
(Continued)

(56) References Cited

U.S. PATENT DOCUMENTS 8,003,895 B2 8/2011 Sunohara et al.
8,058,165 B2 11/2011 Kawano et al.
(Continued)

FOREIGN PATENT DOCUMENTS

CN 1700452 A 11/2005
CN 1905141 A 1/2007
(Continued)

OTHER PUBLICATIONS

Office Action issued in Japanese Patent Application No. 2019-032444, Nov. 29, 2022, with summarized machine translation (12 pages).

(Continued)

*Primary Examiner* — Didarul A Mazumder
(74) *Attorney, Agent, or Firm* — HSML P. C.

(57) ABSTRACT

The present disclosure provides an electronic device. The electronic device includes a first resin layer, having a first resin layer main surface and a first resin layer inner surface; a first conductor, having a first conductor main surface and a first conductor inner surface; a first wiring layer, formed adjacent to the first resin layer main surface and connected to the first conductor main surface; a first electronic component, electrically connected with the first wiring layer; a second resin layer, having a second resin layer main surface facing same direction as the first resin layer main surface and a second resin layer inner surface being in contact with the first resin layer main surface; an external electrode; and a second conductor, penetrating the second resin layer, wherein the second conductor is disposed on a periphery of the first electronic component.

14 Claims, 44 Drawing Sheets

(58) Field of Classification Search
CPC ........... H01L 2224/16227; H01L 21/56; H01L 23/3192; H01L 23/552; H01L 2924/15311; H01L 23/3114; H01L 2924/19102; H01L 25/0657; H01L 24/97; H01L 2224/97; H01L 2224/81; H01L 23/3121
USPC .................................. 257/786; 438/612, 666
See application file for complete search history.

(56) References Cited

U.S. PATENT DOCUMENTS

| | | | |
|---|---|---|---|
| 8,482,113 B2 | 7/2013 | Hasegawa et al. | |
| 9,997,474 B2 | 6/2018 | Furuichi et al. | |
| 10,354,936 B2 | 7/2019 | Harada et al. | |
| 11,417,624 B2 * | 8/2022 | Yanagida | H01L 21/56 |
| 2008/0237883 A1 | 10/2008 | Tago et al. | |
| 2008/0265412 A1 | 10/2008 | Hasegawa | |
| 2010/0230823 A1 | 9/2010 | Ihara | |
| 2013/0026653 A1 | 1/2013 | Yamamichi et al. | |
| 2015/0043189 A1 | 2/2015 | Kitazaki et al. | |
| 2015/0279818 A1 | 10/2015 | Hsu | |
| 2018/0019177 A1 | 1/2018 | Harada et al. | |
| 2018/0190591 A1 | 7/2018 | Kim et al. | |
| 2018/0331008 A1 | 11/2018 | Nishimura | |
| 2019/0164906 A1 | 5/2019 | Yanagida | |
| 2019/0287924 A1 | 9/2019 | Moon et al. | |
| 2020/0126897 A1 | 4/2020 | Kiso et al. | |
| 2020/0266178 A1 | 8/2020 | Lee et al. | |
| 2020/0303336 A1 | 9/2020 | Otsubo et al. | |
| 2020/0312757 A1 | 10/2020 | Kang et al. | |

FOREIGN PATENT DOCUMENTS

| | | |
|---|---|---|
| JP | 2005-39227 A | 2/2005 |
| JP | 2005039227 A | 2/2005 |
| JP | 2007-35825 A | 2/2007 |
| JP | 2008-277569 A | 11/2008 |
| JP | 2009094409 A | 4/2009 |
| JP | 2015-57805 A | 3/2015 |
| JP | 2017-220543 A | 12/2017 |

OTHER PUBLICATIONS

Search Report issued in Japanese Patent Application No. 2019-032444, Nov. 30, 2022, with machine translation (46 pages).

Office Action issued in Chinese Application No. 2019109887085, dated Mar. 8, 2023, with English machine translation.

* cited by examiner

ELECTRONIC DEVICE WITH MULTIPLE RESIN LAYERS REDUCING SUPPRESSION IN RELIABILITY

PRIORITY CLAIM AND CROSS-REFERENCE

This application is a continuation application of U.S. patent application Ser. No. U.S. Ser. No. 16/704,961 filed Dec. 5, 2019, the disclosure of which is hereby incorporated by reference in its entirety.

TECHNICAL FIELD

The present disclosure relates to an electronic device comprising electronic components and manufacturing method thereof.

BACKGROUND

Citation document 1 discloses a conventional electronic device which comprises electronic components. The electronic device of the citation document 1 comprises a semiconductor substrate, electronic components (microscopic electronic component chips) and hermetic seal resin (insulative hermetic seal resin). The semiconductor substrate is, for example, Si substrate. The electronic components are mounted on one side of the semiconductor substrate and underpinned by the semiconductor substrate. Therefore, the semiconductor substrate is a supporting part for supporting the electronic components. The hermetic seal resin is, for example, insulative epoxy resin. The hermetic seal resin is formed on the one side of the semiconductor substrate to cover the electronic components. The hermetic seal resin is a protective part for protecting the electronic components against environmental influence, such as light, heat and moisture.

BACKGROUND TECHNOLOGY DOCUMENT

Citation Document

[Citation Document 1] Japan published patent application 2009-94409.

SUMMARY OF THE INVENTION

Problem to be Solved by Present Disclosure

Electronic components of an electronic device generate heat whenever the electronic device is supplied with power. At this point, thermal stress is exerted on the interface between a semiconductor substrate (supporting part) and a hermetic seal resin (protective part) because of the difference in thermal expansion coefficient between the semiconductor substrate and the hermetic seal resin. The thermal stress is likely to cause the hermetic seal resin to be peeled from the semiconductor substrate, i.e., the protective part is peeled from the supporting part. This is the main reason why the reliability of the electronic device decreases.

To address the aforesaid issue, it is an objective of the present disclosure to provide an electronic device and manufacturing method thereof that can suppress reduction in reliability.

Technical Means to Solve Problem

The electronic device provided in the first aspect of the present disclosure comprises: a first resin layer having a first resin layer main surface and a first resin layer inner surface, the first resin layer main surface and the first resin layer inner surface face opposite sides in a first direction; a first conductor having a first conductor main surface and a first conductor inner surface, the first conductor main surface and the first conductor inner surface face opposite sides in the first direction, and the first conductor penetrates the first resin layer in the first direction; a first wiring layer straddling the first resin layer main surface and the first conductor main surface; a first electronic component in the first direction having a first component main surface facing the same side as the first resin layer main surface and a first component inner surface facing the same side as the first resin layer inner surface, and electrically connected with the first wiring layer; a second resin layer having a second resin layer main surface facing the same direction as the first resin layer main surface and a second resin layer inner surface being in contact with the first resin layer main surface, and covering the first wiring layer and the first electronic component; and an external electrode, disposed closer to the side where the first resin layer inner surface faces than the first resin layer and electrically connected to the first conductor.

The manufacturing method of the electronic device provided in the second aspect of the present disclosure comprises: a supporting substrate preparing step, preparing a supporting substrate having a substrate main surface and a substrate inner surface, the substrate main surface and the substrate inner surface face opposite sides in a first direction; a first conductor forming step, for forming a first conductor on the substrate main surface; a first resin layer forming step, for forming a first resin layer for covering the first conductor; a first resin layer grinding step, grinding the first resin layer in the first direction from a side which the substrate main surface faces to a side which the substrate inner surface faces such that a portion of the first conductor is exposed from the first resin layer, so as to respectively form a first conductor main surface and a first resin layer main surface, the first conductor main surface and the first resin layer main surface face the same side as the substrate main surface in the first direction; a first wiring layer forming step, forming a first wiring layer straddling the first resin layer main surface and the first conductor main surface; a first electronic component mounting step, electrically connecting a first electronic component on the first wiring layer; a second resin layer forming step, forming a second resin layer for covering the first wiring layer and the first electronic component; a supporting substrate removing step, removing the supporting substrate to expose a first resin layer inner surface facing opposite side with the first resin layer main surface in the first direction; and an external electrode forming step, forming an external electrode, the external electrode is disposed closer to the side where the first resin layer inner surface faces than the first resin layer, and the external electrode is electrically connected to the first conductor.

Effect of Present Disclosure

The present disclosure provides an electronic device capable of suppressing reduction in reliability and a manufacturing method of the electronic device.

DETAILED DESCRIPTION OF THE EMBODIMENTS

Figure 1:
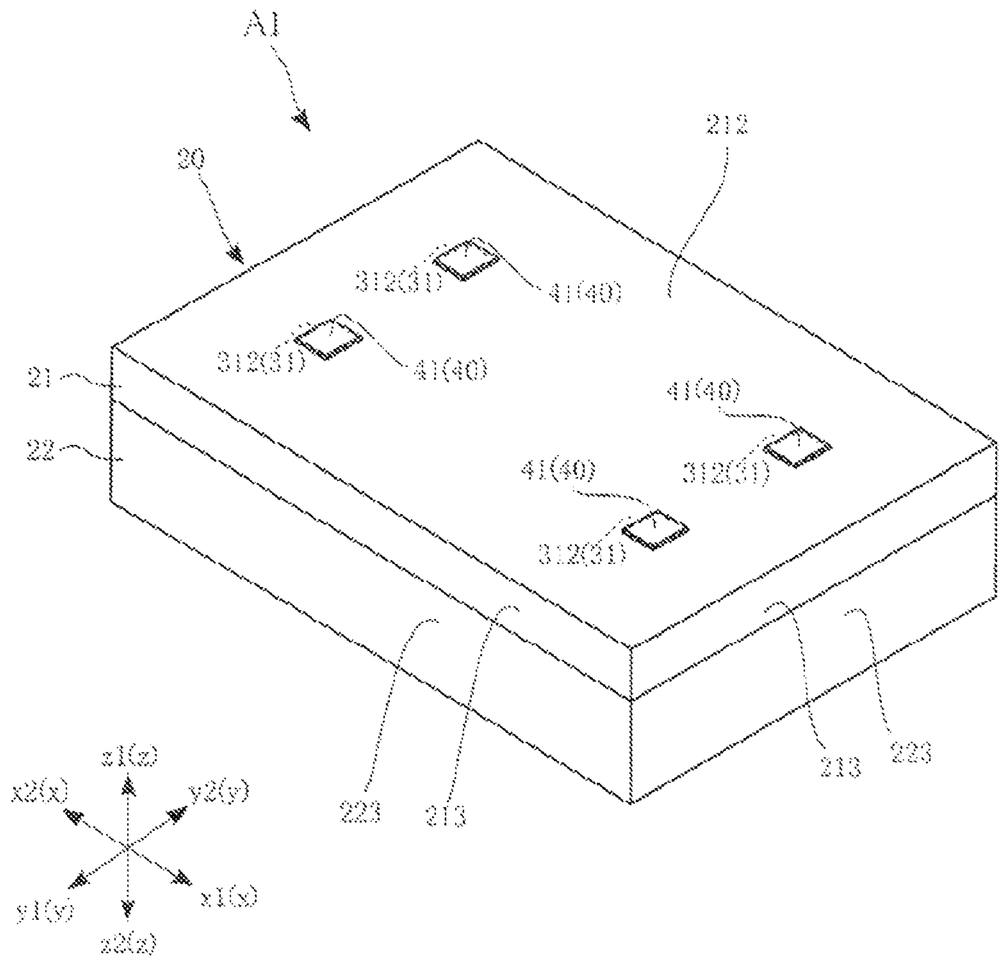
FIG. 1 is a perspective view of an electronic device according to the first embodiment of the present disclosure.

Preferred embodiments of a manufacturing method of an electronic device of the present disclosure are illustrated by accompanying drawings and described hereunder.

Ordinal numbers, such as "first", "second", "third" and the like, used hereunder are intended to distinguish or correlate identical or similar components or structures and do not necessarily imply what order the components or structures are in in terms of space or time.

Unless otherwise specified hereunder, "object A is formed at object B" and "object A is formed on object B" include "object A is directly formed at object B" and "object A is formed at object B in the presence of another object disposed between object A and object B." Likewise, unless otherwise specified, "object A is disposed at object B" and "object A is disposed on object B" include "object A is directly disposed at object B" and "object A is disposed at object B in the presence of another object disposed between object A and object B." Likewise, unless otherwise specified, "object A is on object B" includes "object A is on object B while object A is in contact with object B" and "object A is on object B in the presence of another object disposed between object A and object B." Likewise, unless otherwise specified, "object A is laminated to object B" and "object A is laminated onto object B" include "object A is directly laminated to object B" and "object A is laminated to object B in the presence of another object disposed between object A and object B." Unless otherwise specified, "object A and object B overlap when viewed in a specific direction" includes "object A and object B have identical outlines and cover each other" and "object A and object B overlap."

First Embodiment

FIG. 1~FIG. 4 show an electronic device in the first embodiment of the present disclosure. An electronic device A1 in the first embodiment comprises an electronic component 11, a hermetic seal resin 20, an internal electrode 30, a plurality of external electrodes 40, a plurality of connecting portions 51 and a frame-shaped conductor 61. In this embodiment, the internal electrode 30 comprises a plurality of columnar conductors 31 and a plurality of wiring layers 32.

Figure 2:
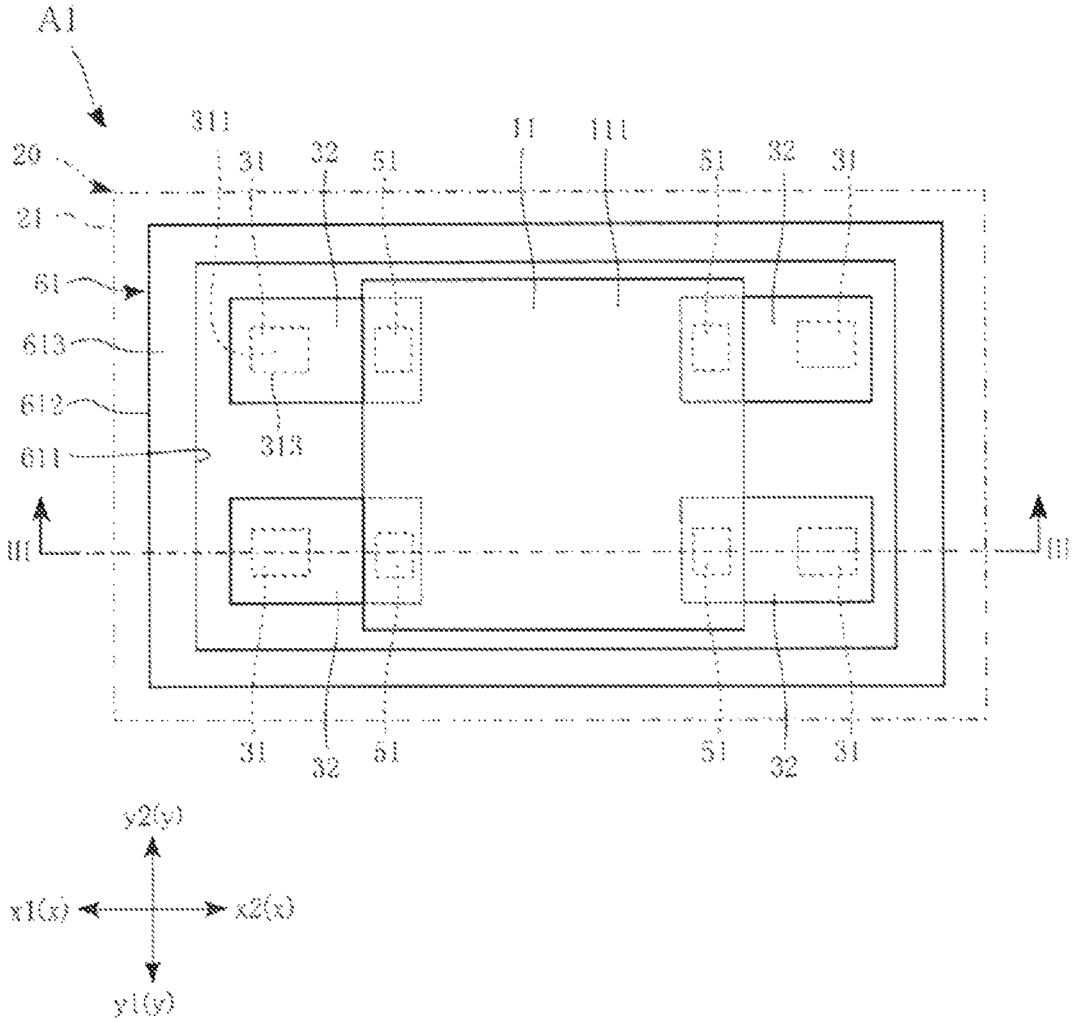
FIG. 2 is a top view of the electronic device according to the first embodiment of the present disclosure.
Figure 3:
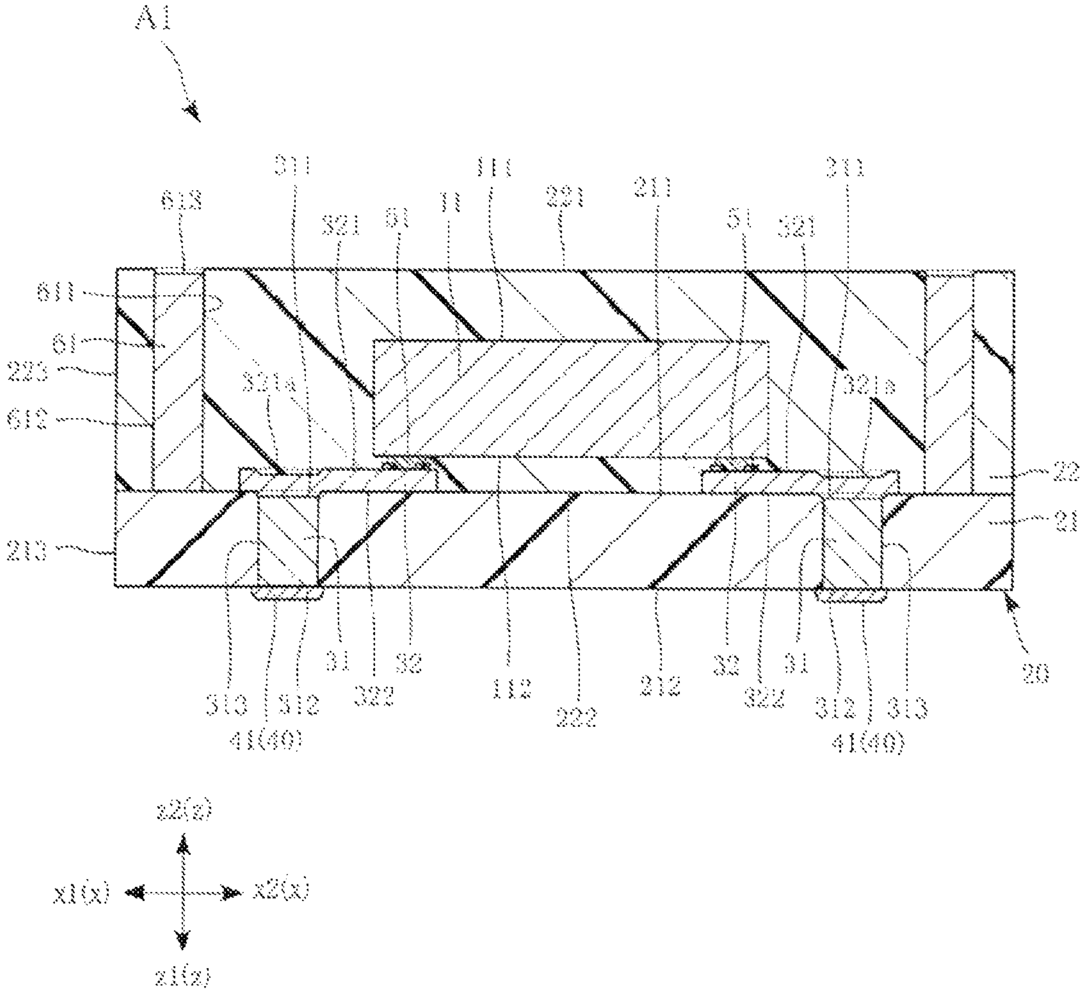
FIG. 3 is a cross-sectional view taken along line III-III of FIG. 2.
Figure 4:
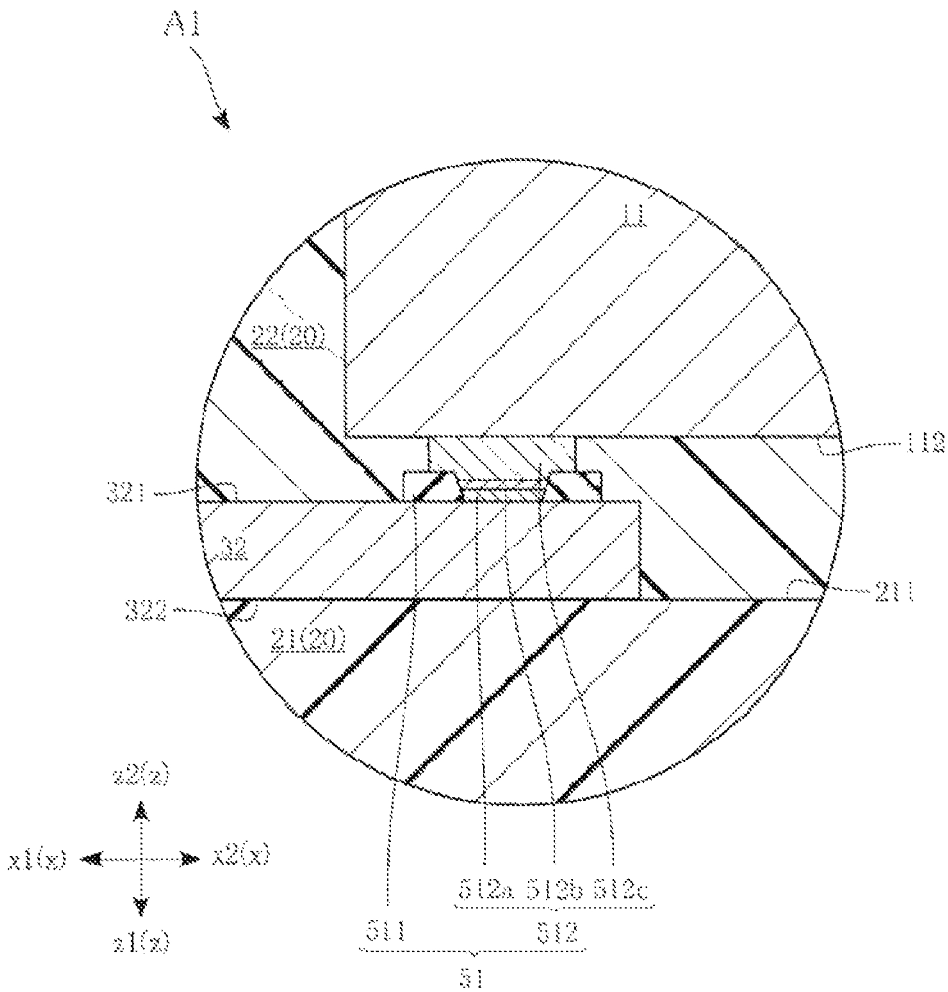
FIG. 4 is a partial enlarged cross-sectional view of a part of FIG. 3.

FIG. 1 is a perspective view of the electronic device A1 when viewed from below. FIG. 2 is a top view of the electronic device A1 and depicts the hermetic seal resin 20 with an imaginary line (a double-dot and dash line). FIG. 3 is a cross-sectional view taken along line III-III of FIG. 2. FIG. 4 is a partial enlarged cross-sectional view of a part of FIG. 3.

For the sake of illustration, three directions which are perpendicular to each other are defined as direction x, direction y, and direction z, respectively. Direction z is the thickness direction of the electronic device A1. Direction x is the lateral direction in the top view of (see FIG. 2) of the electronic device A1. Direction y is the vertical direction in the top view of (see FIG. 2) of the electronic device A1. The two opposite directions of direction x are defined as direction x1 and direction x2, respectively. The two opposite directions of direction y are defined as direction y1 and direction y2, respectively. The two opposite directions of direction z are defined as direction z1 and direction z2, respectively. In this regard, direction z1 is also referred to as "downward" and direction z2 as "upward". Direction z is equivalent to "a first direction" recited in the claims.

The electronic component 11 is crucial to the functioning of the electronic device A1. In this embodiment, the electronic component 11 is a semiconductor component which comprises a semiconductor. The electronic component 11 is an active component, for example, a component for use in voltage control, such as LSI (Large Scale Integration), IC (integrated circuit), and LDO (Low Drop Out), a component for use in amplification, such as an operational amplifier, or a discrete component, such as a transistor and a diode. The electronic component 11 comprises a semiconductor. The component is a passive component, for example, a resistor, an inductor, and a capacitor. The electronic component 11 can be surface mounted. When viewed from above, the electronic component 11 is rectangular in shape, but the present disclosure is not limited thereto. The electronic component 11 is electrically connected and joined to the wiring layers 32 by the connecting portions 51. The electronic component 11 is equivalent to "a first electronic component" recited in the claims. As shown in FIG. 3, the electronic component 11 has a component main surface 111 and a component inner surface 112.

The component main surface 111 and the component inner surface 112 are spaced apart from each other in direction z and face opposite sides. The component main surface 111 faces direction z2. The component inner surface 112 faces direction z1. A plurality of electrode pads (not shown) is formed on the component inner surface 112. The plurality of electrode pads respectively comprises, for example, aluminum (Al). The electrode pads are terminals in the electronic component 11. FIG. 2 is not restrictive of the quantity and position of the plurality of electrode pads. The component main surface 111 and the component inner surface 112 are equivalent to "a first component main surface" and "a first component inner surface" recited in the claims, respectively.

The hermetic seal resin 20, for example, is synthetic resin which uses black epoxy resin as a base (or the hermetic seal resin 20 is any resin, as long as the resin is capable of electrical insulation). As shown in FIG. 3, the hermetic seal resin 20 covers the electronic component 11, the internal electrode 30 and the plurality of connecting portions 51. As shown in FIG. 2, when viewed from above, the hermetic seal resin 20 is rectangular in shape. The hermetic seal resin 20 comprises a first resin layer 21 and a second resin layer 22.

The first resin layer 21 covers a part (a columnar conductor lateral surface 313 to be described later) of each columnar conductor 31. The first resin layer 21 spaces apart the wiring layers 32 for supporting the electronic component 11. The first resin layer 21 is a supporting part for supporting the electronic component 11 in the electronic device A1. The first resin layer 21 has a first resin layer main surface 211, a first resin layer inner surface 212 and a first resin layer lateral surface 213.

The first resin layer main surface 211 and the first resin layer inner surface 212 are spaced apart from each other in direction z and face opposite sides. The first resin layer main surface 211 faces direction z2, and the first resin layer inner surface 212 faces direction z1. A grinding mark is formed on the first resin layer main surface 211 by the first resin layer grinding step to be described later. In this embodiment, a part of each columnar conductor 31 is exposed from the first resin layer inner surface 212. The first resin layer lateral surface 213 connects to the first resin layer main surface 211 and the first resin layer inner surface 212. In this embodiment, the first resin layer lateral surface 213 is perpendicular to the first resin layer main surface 211 and the first resin layer inner surface 212. The first resin layer lateral surface 213 has two opposing surfaces spaced apart in direction x and two opposing surfaces spaced apart in direction y.

The second resin layer 22 covers the electronic component 11, the plurality of wiring layers 32, and a part of the frame-shaped conductor 61. The second resin layer 22 is a protective part disposed in the electronic device A1 and adapted to protect the electronic component 11. The second resin layer 22 has a second resin layer main surface 221, a second resin layer inner surface 222 and a second resin layer lateral surface 223.

The second resin layer main surface 221 and the second resin layer inner surface 222 are spaced apart from each other in direction z and face opposite sides. The second resin layer main surface 221 faces direction z2, and the second resin layer inner surface 222 faces direction z1. A grinding mark is formed on the second resin layer main surface 221 by a second resin layer grinding step to be described later. In this embodiment, a part of the frame-shaped conductor 61 is exposed from the second resin layer main surface 221. The second resin layer lateral surface 223 connects to the second resin layer main surface 221 and the second resin layer inner surface 222. In this embodiment, the second resin layer lateral surface 223 is perpendicular to the second resin layer main surface 221 and the second resin layer inner surface 222. The second resin layer lateral surface 223 has two opposing surfaces spaced apart in direction x and two opposing surfaces spaced apart in direction y.

In the hermetic seal resin 20, the first resin layer 21 and the second resin layer 22 are laminated to each other in direction z, whereas the first resin layer main surface 211 is in contact with the second resin layer inner surface 222. In the hermetic seal resin 20, the first resin layer lateral surface 213 and the second resin layer lateral surface 223 are coplanar.

An electrical connection path of the electronic component 11 and the plurality of external electrodes 40 is formed by the internal electrode 30 in the hermetic seal resin 20. As mentioned above, the internal electrode 30 comprises a plurality of columnar conductors 31 and a plurality of wiring layers 32.

Each columnar conductor 31 is formed in direction z between a corresponding one of the wiring layers 32 and a corresponding one of the external electrodes 40, so as to electrically connect the wiring layer 32 and the external electrode 40. Each columnar conductor 31 penetrates the first resin layer 21 in direction z. In this embodiment, each columnar conductor 31 is columnar and has a substantially rectangular cross section perpendicular to direction z. The cross section is not necessarily rectangular and thus can also be circular, elliptical, or polygonal. For example, each columnar conductor 31 is made of Cu. For example, each columnar conductor 31 comprises a basal layer and a plated layer which are laminated to each other. The basal layer comprises a Ti layer and a Cu layer which are laminated to each other and the thickness is approximately 200~800 nm. The plated layer, for example, comprises Cu and is configured to be thicker than the basal layer. The plurality of columnar conductors 31 is, for example, formed by electroplating. The above description is not restrictive of what material each columnar conductor 31 is made of and how each columnar conductor 31 is formed. The columnar conductors 31 are spaced apart from each other. Each columnar conductor 31 is equivalent to "a first conductor" of the claims. Each columnar conductor 31 has a columnar conductor main surface 311, a columnar conductor inner surface 312 and a columnar conductor lateral surface 313.

The columnar conductor main surface 311 and the columnar conductor inner surface 312 are spaced apart from each other in direction z and face opposite sides. The columnar conductor main surface 311 is exposed from the first resin layer main surface 211. In this embodiment, the columnar conductor main surface 311 dents relative to the first resin layer main surface 211. The depth (in direction z) of the dent is 1 μm approximately. The columnar conductor main surface 311 and the first resin layer main surface 211 are coplanar. The columnar conductor inner surface 312 is exposed from the first resin layer inner surface 212. The columnar conductor inner surface 312 and the first resin layer inner surface 212 are coplanar. The columnar conductor main surface 311 is in contact with the wiring layer 32. The columnar conductor 31 is electrically connected to the wiring layer 32. The columnar conductor inner surface 312 is in contact with the external electrode 40. The columnar conductor 31 is electrically connected to the external electrode 40. The columnar conductor lateral surface 313 is connected to the columnar conductor main surface 311 and the columnar conductor inner surface 312. The columnar conductor lateral surface 313 is perpendicular to the columnar conductor main surface 311 and the columnar conductor inner surface 312. The columnar conductor lateral surface 313 is in contact with the first resin layer 21. In this embodiment, the columnar conductor lateral surface 313 has two opposing surfaces spaced apart in direction x and two opposing surfaces spaced apart in direction y. The columnar conductor main surface 311 and the columnar conductor inner surface 312 are equivalent to "a first conductor main surface" and "a first conductor inner surface" recited in the claims, respectively.

Each wiring layer 32 connects a corresponding one of the columnar conductor main surfaces 311 and a corresponding one of the first resin layer main surfaces 211. In this embodiment, each wiring layer 32 covers the whole of the columnar conductor main surface 311 and a part of the first resin layer main surface 211 of a corresponding one of the columnar conductors 31. The wiring layers 32 are spaced apart from each other. Each wiring layer 32 comprises a basal layer and a plated layer which are laminated to each other. The basal layer comprises a Ti layer and a Cu layer which are laminated to each other and the thickness is approximately 200~800 nm. The basal layer, for example, is formed by sputtering. For example, the plated layer comprises Cu and is configured to be thicker than the basal layer. For example, the plated layer is formed by electroplating. The above description is not restrictive of what material the wiring layers 32 are made of and how the wiring layers 32 are formed. For example, a Ni layer is formed between the basal layer and the plated layer. For example, the Ni layer is formed by electroplating. FIG. 2 is not restrictive of whatever related to the formation of the wiring layers 32.

The wiring layers 32 each have a wiring layer main surface 321 and a wiring layer inner surface 322. The wiring layer main surface 321 and the wiring layer inner surface 322 are spaced apart and face opposite sides in direction z. The wiring layer main surface 321 faces direction z2, and the wiring layer inner surface 322 faces direction z1. The wiring layer main surface 321 is in contact with the second resin layer 22. The wiring layer inner surface 322 is in contact with the first resin layer 21. Each wiring layer 32 has an end surface which faces direction x or direction y and is covered by the second resin layer 22.

Each wiring layer 32 comprises a dent portion **321*a* which dents, in direction z, relative to the wiring layer main surface 321 of the wiring layer 32. When viewed from above, the dent portion 321*a* overlaps the columnar conductor 31. The dent portion 321*a* is not formed when the columnar conductor main surface 311 and the first resin layer main surface 211** are coplanar.

The external electrodes 40 are electrically connected to the internal electrodes 30, respectively, and external conductors of the electronic device A1 are exposed. The external electrodes 40 function as the terminals for use in mounting the electronic device A1 on the circuit substrates of an electronic machine. The plurality of external electrodes 40 is formed by electroless plating. In this embodiment, each external electrode 40 comprises a Ni layer, a Pd layer and a Au layer which are laminated to each other. The direction-z dimension of each external electrode 40 is, for example, 3~10 μm approximately, but the present disclosure is not limited thereto. The aforesaid description is not restrictive of the direction-z dimension of the external electrodes 40, what material the external electrodes 40 are made, and how the external electrodes 40 are formed. For example, each external electrode 40 comprises a Ni layer and a Au layer which are laminated to each other or is made of Sn.

The external electrodes 40 are exposed from the hermetic seal resin 20. Each external electrode 40 is closer to the outside than the first resin layer 21 in direction z1. Therefore, each external electrode 40 is disposed on the bottom side of the electronic device A1. In this embodiment, the external electrodes 40 are electrically connected to the columnar conductors 31, respectively. The external electrodes 40 each comprise a columnar conductor covering portion 41.

The columnar conductor covering portions 41 cover the columnar conductor inner surfaces 312, respectively. The columnar conductor covering portions 41 are in contact with the columnar conductor inner surfaces 312, respectively. In this embodiment, the electronic components 11 are electrically connected to the columnar conductor covering portions 41 by the connecting portions 51, the wiring layers 32 and the columnar conductors 31, respectively. Therefore, the columnar conductor covering portions 41 are the terminals of the electronic device A1 and electrically connect to the electronic component 11. The columnar conductor covering portion 41 is equivalent to "a first conductor covering portion" recited in the claims.

The plurality of connecting portions 51 is each a conductive connecting element formed between the electronic component 11 (i.e., the electrode pad) and a corresponding one of the wiring layers 32. The electronic component 11 is configured in such a manner as to not only allow the plurality of connecting portions 51 to be fixed to the plurality of wiring layers 32 and thereby mounted on the wiring layers 32, but also use the plurality of connecting portions 51 to ensure that the electronic component 11 is electrically connected to the plurality of wiring layers 32. In this embodiment, as shown in FIG. 4, the connecting portions 51 each comprise an insulating layer 511 and a connecting layer 512.

Referring to FIG. 4, the insulating layers 511 are formed on the wiring layers 32, respectively. When viewed from above, each insulating layer 511 is centrally-opened and frame-shaped. When viewed from above, the insulating layers 511 surrounds the connecting layers 512, respectively. In this embodiment, when viewed from above, each insulating layer 511 has the shape of a rectangular frame. When viewed from above, each insulating layer 511 does not necessarily have the shape of a rectangular frame but can also have the shape of a circular frame, an elliptical frame or a polygonal frame. The insulating layers 511 are, for example, made of polyimide resin, but the present disclosure is not limited thereto.

The connecting layers 512 electrically connect the electronic component 11 to the wiring layers 32, respectively. The connecting layers 512 are formed on the wiring layers 32 (wiring layer main surfaces 321), respectively. The connecting layers 512 cover surfaces of the opening portions of the insulating layers 511, respectively. The opening portions of the insulating layers 511 are filled with parts of the connecting layers 512, respectively. In this embodiment, as shown in FIG. 4, the connecting layers 512 each comprise a first layer 512*a*, a second layer 512*b* and a third layer 512*c* which are laminated to each other.

The first layers 512*a* are formed on the wiring layers 32 (wiring layer main surfaces 321), respectively, and are in contact with the wiring layer main surfaces 321, respectively. The first layer 512*a* is made of metal, such as Cu. The second layer 512*b* is formed on the first layer 512*a* and is in contact with the first layer 512*a*. The second layer 512*b* is made of metal, such as Ni. The third layer 512*c* is formed on the second layer 512*b* and is in contact with the second layer 512*b*. The third layer 512*c* is in contact with the electronic component 11 (electrode pads). The third layer 512*c* is made of metal, such as Sn. Examples of the alloy include Sn—Sb based alloy and Sn—Ag based alloy which are typical of lead-free solder. The connecting layers 512 are each equivalent to "a conductive connecting layer" recited in the claims.

When viewed from above, the frame-shaped conductor 61 surrounds the electronic component 11. In this embodiment, when viewed from above, the frame-shaped conductor 61 surrounds the electronic component 11. When viewed from above, the frame-shaped conductor 61 has the shape of a rectangular frame. When viewed from above, the frame-shaped conductor 61 does not necessarily have the shape of a rectangular frame but can also have the shape of a circular frame, an elliptical frame or a polygonal frame. A part of the second resin layer 22 is present between the frame-shaped conductor 61 and the electronic component 11. The frame-shaped conductor 61 is formed on the first resin layer 21 and erected on the first resin layer main surface 211. In this embodiment, the frame-shaped conductor 61 is spaced apart from the internal electrode 30. The frame-shaped conductor 61 is equivalent to "a second conductor" recited in the claims.

The frame-shaped conductor 61 comprises, for example, a basal layer and a plated layer which are laminated to each other. The basal layer comprises Ti layer and Cu layer which are laminated to each other and is approximately 200~800 nm thick. The main constituent of the plated layer is Cu. The plated layer is configured to be thicker than the basal layer. For example, the frame-shaped conductor 61 is formed by electroplating. The above description is not restrictive of the material which the frame-shaped conductor 61 is made of and the method the frame-shaped conductor 61 is formed by.

The frame-shaped conductor 61 has an inner surface 611, an outer surface 612 and a top surface 613. The inner surface 611 is defined by the inner surface of the frame-shaped (when viewed from above) conductor 61. The inner surface 611 faces the electronic component 11. The outer surface 612 is defined by the outer surface of the frame-shaped (when viewed from above) conductor 61. The top surface 613 faces direction x2. The top surface 613 is exposed from the second resin layer 22. The top surface 613 dents relative to the second resin layer main surface 221 of the second resin layer 22. The depth (in direction z) of the dent is 1 μm approximately. The top surface 613 and the second resin layer main surface 221 are coplanar. The top surface 613 is covered by the second resin layer 22. In this embodiment, the top surface 613 is closer to direction z2 than the component main surface 111 in direction z. The top surface 613 is equivalent to "a second conductor main surface" recited in the claims.

FIG. 5~FIG. 17 illustrate a manufacturing method of the electronic device A1 according to the first embodiment of the present disclosure. The manufacturing method described below is about manufacturing multiple electronic devices A1. FIG. 5~FIG. 17 are cross-sectional views illustrative of a step of the manufacturing method of the electronic device A1.

Figure 5:
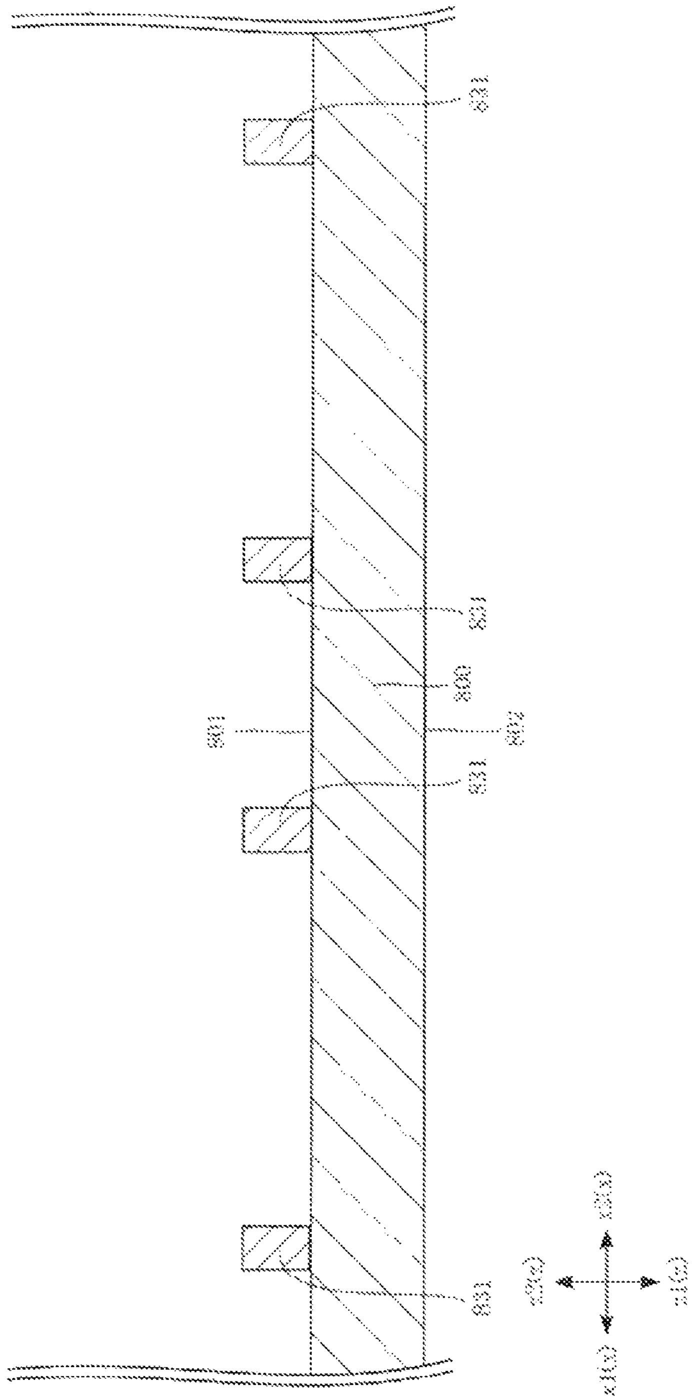
FIG. 5 is a cross-sectional view illustrative of a step of a m manufacturing method of an electronic device according to the first embodiment of the present disclosure.

First, as shown in FIG. 5, the manufacturing method of the electronic device A1 entails preparing a supporting substrate 800. The supporting substrate 800 comprises a monocrystalline semiconductor. In this embodiment, the monocrystalline semiconductor is Si. A step of preparing the supporting substrate 800 (a supporting substrate preparing step), for example, entails preparing a Si wafer which functions as the supporting substrate 800. In this embodiment, the thickness of the supporting substrate 800 is, for example, 725~775 μm approximately. The supporting substrate 800 comprises a supporting substrate main surface 801 and a supporting substrate inner surface 802 which are spaced apart and face opposite sides in direction z. The supporting substrate main surface 801 faces direction z2, and the supporting substrate inner surface 802 faces direction z1. The supporting substrate 800 thus prepared is not necessarily a Si wafer but can also be a glass substrate, for example.

Afterward, as shown in FIG. 5, the manufacturing method of the electronic device A1 entails forming a columnar conductor 831 on the supporting substrate 800. The columnar conductor 831 corresponds to the columnar conductor 31 of the electronic device A1. In a step of forming the columnar conductor 831 (a columnar conductor forming step), the basal layer in contact with the supporting substrate main surface 801 is formed. The basal layer is formed by sputtering. In this embodiment, after the Ti layer in contact with the supporting substrate main surface 801 has been formed, the Cu layer in contact with the Ti layer is formed. Therefore, the basal layer is formed of a Ti layer and a Cu layer which are laminated to each other. In this embodiment, the thickness of the Ti layer is 10~30 nm approximately, the thickness of the Cu layer is 200~800 nm approximately. The above description is not restrictive of the material which the basal layer is made of and the thickness of the basal layer. Afterward, the plated layer in contact with the basal layer is formed. A photoresist pattern is formed on the plated layer by photolithography and electroplating. Specifically speaking, a photosensitive photoresist is coated on the whole of the basal layer, and then the photosensitive photoresist undergoes exposure and development. Therefore, a patterned photoresist layer (hereinafter referred to as the "photoresist pattern") is formed. The photosensitive photoresist is, for example, coated with a spin coater, but the present disclosure is not limited thereto. At this point, a part of the basal layer is exposed from the photoresist pattern. Then, the basal layer functions as a conducting path whereby electroplating is carried out. Therefore, the plated layer is emanated from the basal layer exposed from the photoresist pattern. In this embodiment, the plated layer, for example, comprises Cu. After the plated layer has been formed, the photoresist pattern is removed. At the end of the aforesaid step, the columnar conductor 831 shown in FIG. 5 is formed. In this embodiment, the columnar conductor forming step is equivalent to "a first conductor forming step" recited in the claims.

Figure 6:
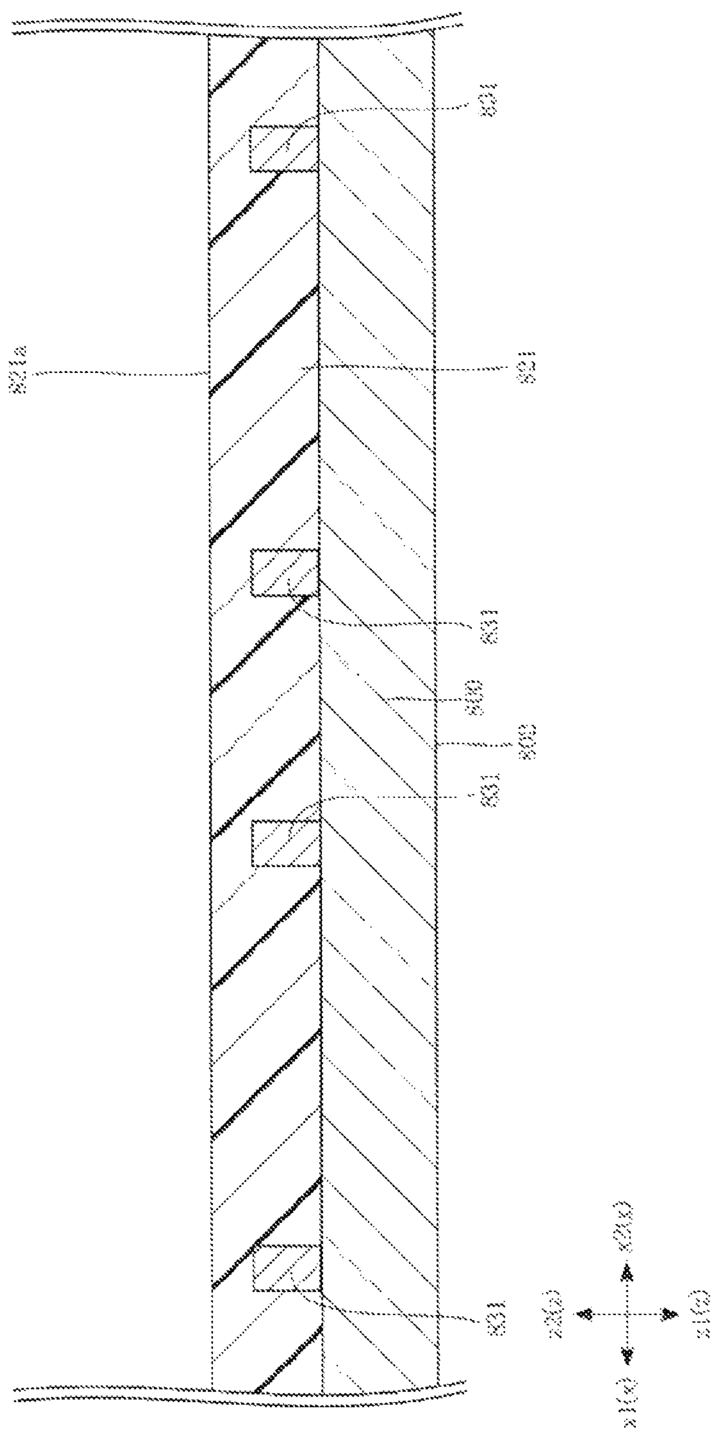
FIG. 6 is a cross-sectional view illustrative of a step of the manufacturing method of the electronic device according to the first embodiment of the present disclosure.

Afterward, as shown in FIG. 6, the manufacturing method of the electronic device A1 entails forming a first resin layer 821 for covering the columnar conductor 831. A step of forming the first resin layer 821 (a first resin layer forming step) is, for example, carried out by die molding. In this embodiment, the first resin layer 821 capable of electrical insulation is, for example, made of synthetic resin which uses black epoxy resin as a base. Owing to the first resin layer forming step, the columnar conductor 831 is fully covered by the first resin layer 821. Therefore, the direction-z2-facing surface (a first resin layer main surface 821*a*) of the first resin layer 821 is closer to the direction z2 than the direction z2-facing surface of the columnar conductor 831.

Figure 7:
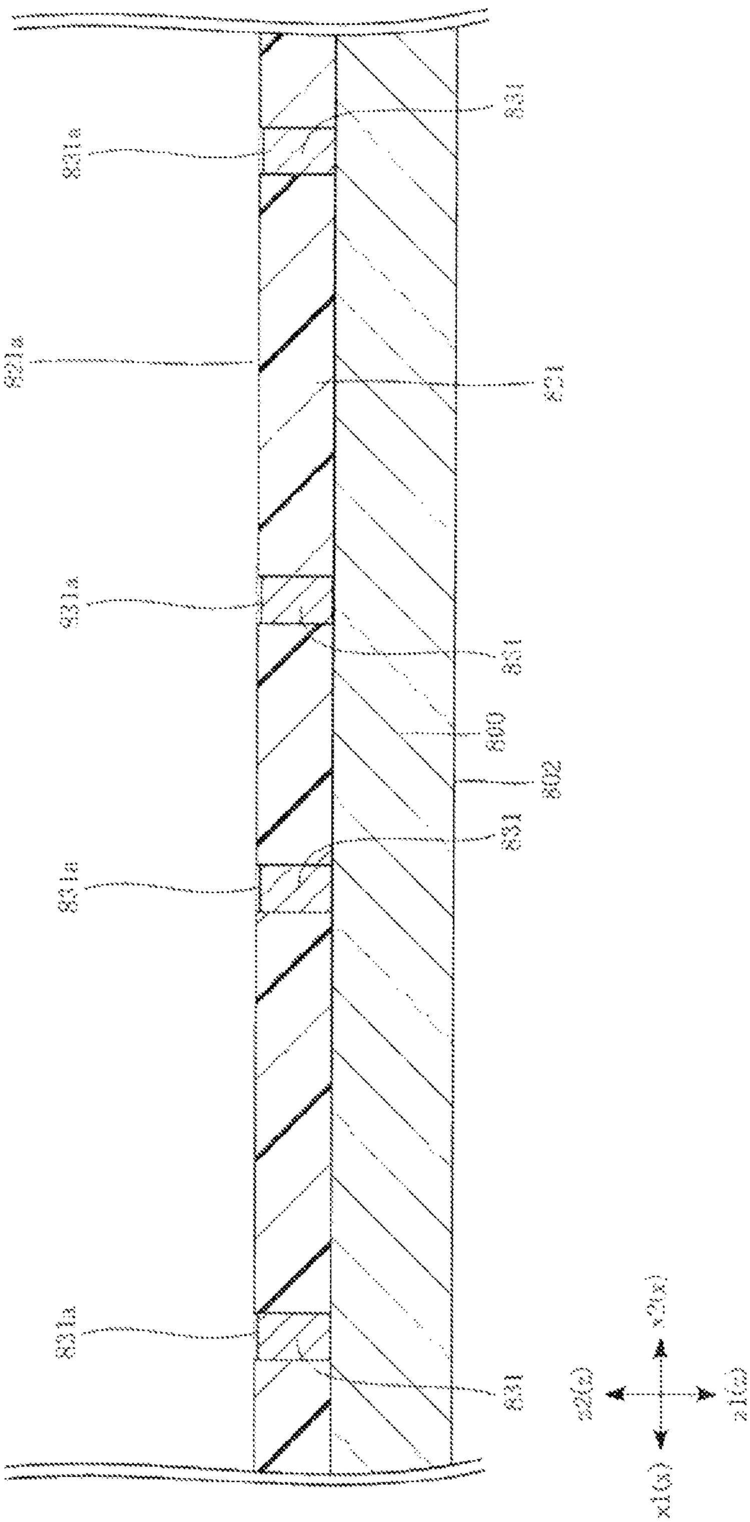
FIG. 7 is a cross-sectional view illustrative of a step of the manufacturing method of the electronic device according to the first embodiment of the present disclosure.

Afterward, as shown in FIG. 7, the manufacturing method of the electronic device A1 entails grinding the first resin layer 821. A step of grinding the first resin layer 821 (a first resin layer grinding step), for example, requires a mechanical grinding wheel. The grinding of the first resin layer 821 is not necessarily performed with a mechanical grinding wheel. In this embodiment, the first resin layer 821 is ground with a grinding stone from the first resin layer main surface 821*a* toward direction z1. At this point, the first resin layer 821 is ground until the columnar conductor 831 is exposed. The first resin layer grinding step enables the first resin layer main surface 821*a* to move in direction z1, and the direction-z2-facing surface (columnar conductor main surface 831*a*) of the columnar conductor 831 is exposed from the first resin layer 821 (first resin layer main surface 821*a*). A grinding mark, i.e., a mark generated with the grinding stone, is formed on the first resin layer main surface 821*a*. In this embodiment, the grinding mark extends from the first resin layer main surface 821*a* to the columnar conductor main surface 831*a*. In this embodiment, the grinding of the first resin layer 821 is accompanied by a smaller degree of the grinding of the columnar conductor 831. Upon completion of the grinding process, a burr is likely to be formed on the columnar conductor main surface 831*a*, because the columnar conductor 831 and the first resin layer 821 are made of different materials. Therefore, in this embodiment, the burr is removed by chemical processing. Therefore, the columnar conductor main surface 831*a* dents in direction z more than the first resin layer main surface 821*a*.

Afterward, as shown in FIG. 8~FIG. 12, wiring layers 832, connecting portions 851 and frame-shaped conductors 861 are formed. The wiring layers 832, the connecting portions 851 and the frame-shaped conductors 861 correspond to the wiring layers 32, the connecting portions 51 and the frame-shaped conductors 61 of the electronic device A1, respectively. They are formed in five steps described below.

Figure 8:
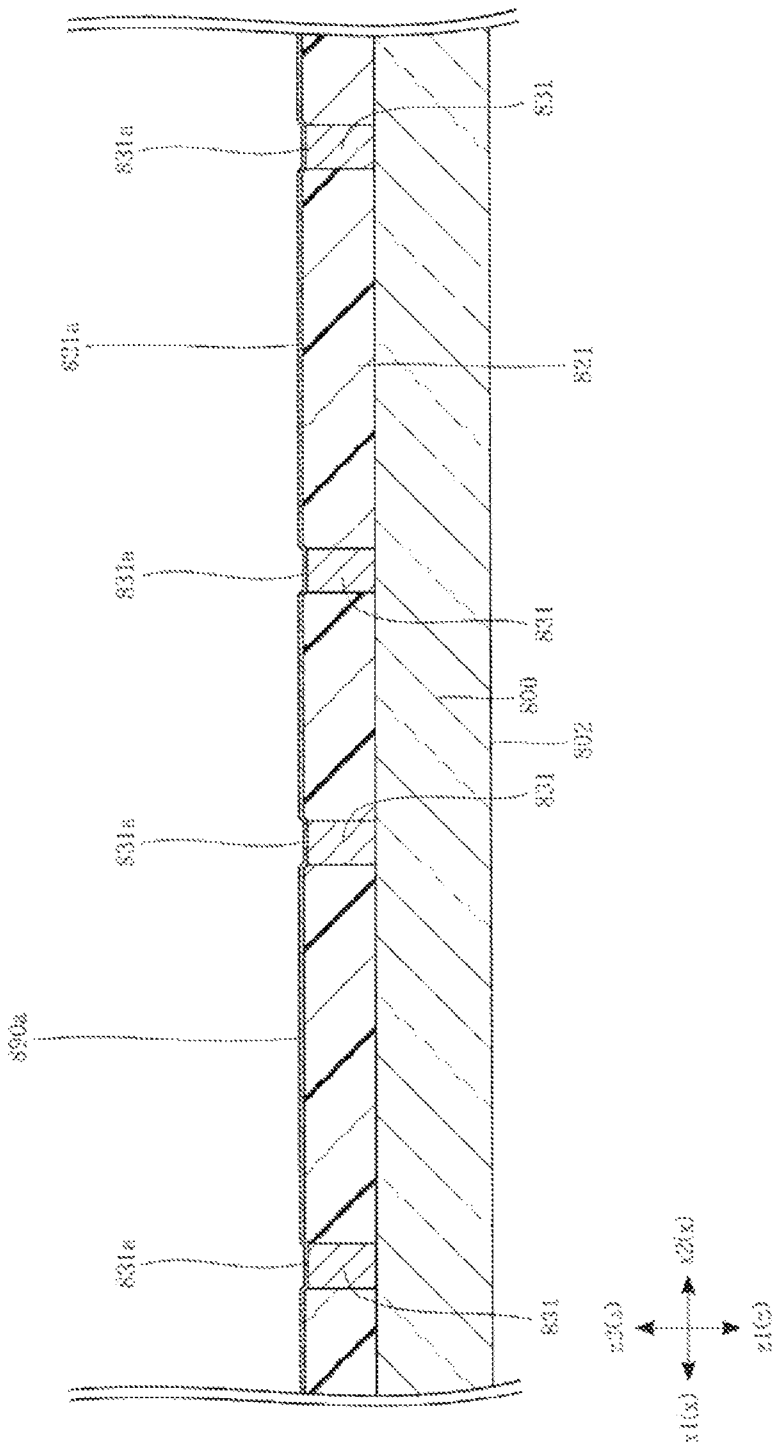
FIG. 8 is a cross-sectional view illustrative of a step of the manufacturing method of the electronic device according to the first embodiment of the present disclosure.

In the first step, as shown in FIG. 8, a basal layer 890*a* is formed. For example, the basal layer 890*a* is formed by sputtering. In the step of forming the basal layer 890*a*, after the Ti layer which covers the whole of the first resin layer main surface 821*a* and the whole of the columnar conductor main surface 831*a* has been formed, the Cu layer in contact with the Ti layer is formed. The basal layer 890*a* is formed of a Ti layer and a Cu layer which are laminated to each other.

Figure 9:
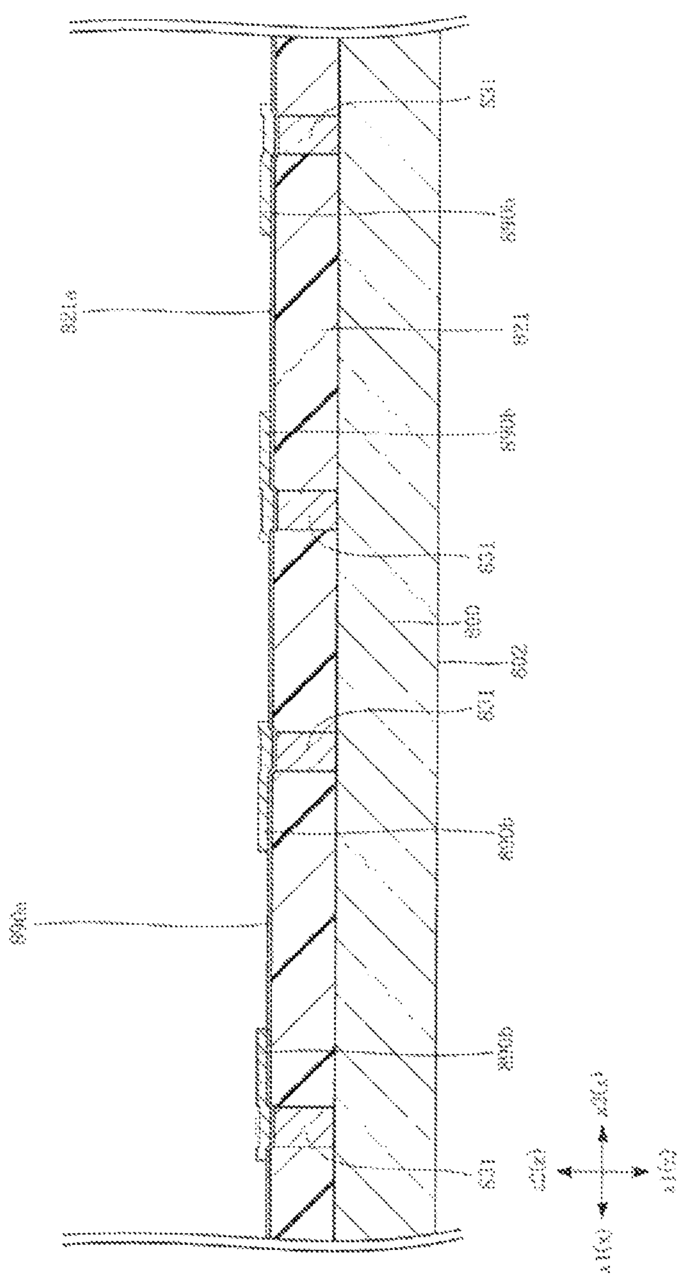
FIG. 9 is a cross-sectional view illustrative of a step of the manufacturing method of the electronic device according to the first embodiment of the present disclosure.

In the second step, as shown in FIG. 9, a plated layer 890*b* is formed. For example, the photoresist pattern is formed on the plated layer 890*b* by photolithography and electroplating. In a step of forming the plated layer 890*b*, the photosensitive photoresist is coated on the whole of the basal layer 890*a* and thereby undergoes exposure and development, so as for the photoresist layer to be patterned. Therefore, the photoresist pattern is formed, and a part (which forms the plated layer 890*b*) of the basal layer 890*a* is exposed from the photoresist pattern. After that, the basal layer 890*a* functions as a conducting path whereby electroplating is carried out, and thus the plated layer 890*b* is emanated from the basal layer 890*a* exposed from the photoresist pattern. In this embodiment, for example, the metal layer functioning as the plated layer 890*b* and comprising Cu is emanated. At this point, the plated layer 890*b* is integrally formed with the basal layer 890*a*. Afterward, the photoresist pattern formed in this step is removed. Therefore, the plated layer 890*b* shown in FIG. 9 is formed. As a result, the plated layer 890*b* and the basal layer 890*a* covered by the plated layer 890*b* become the wiring layers 832. The wiring layers 832 correspond to the wiring layers 32 of the electronic device A1.

Figure 10:
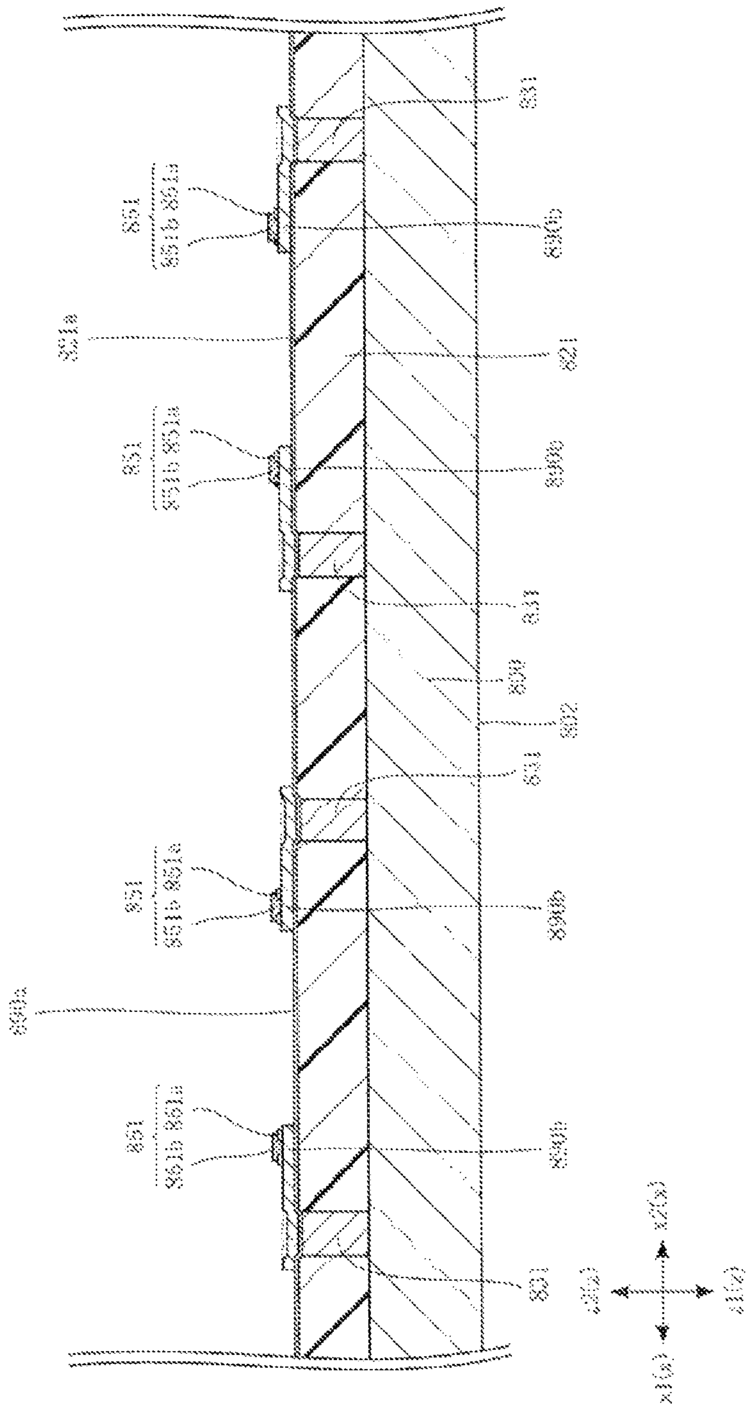
FIG. 10 is a cross-sectional view illustrative of a step of the manufacturing method of the electronic device according to the first embodiment of the present disclosure.

In the third step, as shown in FIG. 10, the connecting portions 851 is formed. In this embodiment, the insulating layers 851*a* and the connecting layers 851*b* are formed to function as the connecting portions 851. In a step of forming the insulating layer 851*a*, photosensitive polyimide is coated on the whole of the plated layer 890*b* and the whole of the basal layer 890*a* exposed from the plated layer 890*b*. The photosensitive polyimide is, for example, coated with a spin coater. Then, the photosensitive polyimide thus coated undergoes exposure and development to form a frame-shaped insulating layer 851*a*. After that, in a step of forming the connecting layers 851*b*, the photoresist pattern for forming the connecting layers 851*b* is formed. The formation of the photoresist pattern entails coating the photosensitive photoresist and performing exposure and development on the coated photosensitive photoresist to pattern the photoresist layer. Therefore, the photoresist pattern is formed, and a part (which forms the connecting layers 851*b*) of the plated layer 890*b* is exposed from the photoresist pattern. The exposed part is located on the inner side of the frame-shaped insulating layer 851*a* when viewed from above. After that, the basal layer 890*a* and the plated layer 890*b* function as a conducting path whereby electroplating is carried out, and thus the connecting layers 851*b* is emanated from the plated layer 890*b* exposed from the photoresist pattern. In this embodiment, the connecting layers 851*b* is formed by sequential lamination of a Cu-containing metal layer, a Ni-containing metal layer and a Sn-containing alloy layer. The Sn-containing alloy layer is, for example, made of Sn—Sb based alloy or Sn—Ag based alloy which is typical of lead-free solder. Afterward, the photoresist pattern formed in this step is removed. Therefore, as shown in FIG. 10, the connecting portions 851 each comprising an insulating layer 851*a* and a connecting layer 851*b* are formed. The connecting portions 851 correspond to the connecting portions 51 of the electronic device A1.

Figure 11:
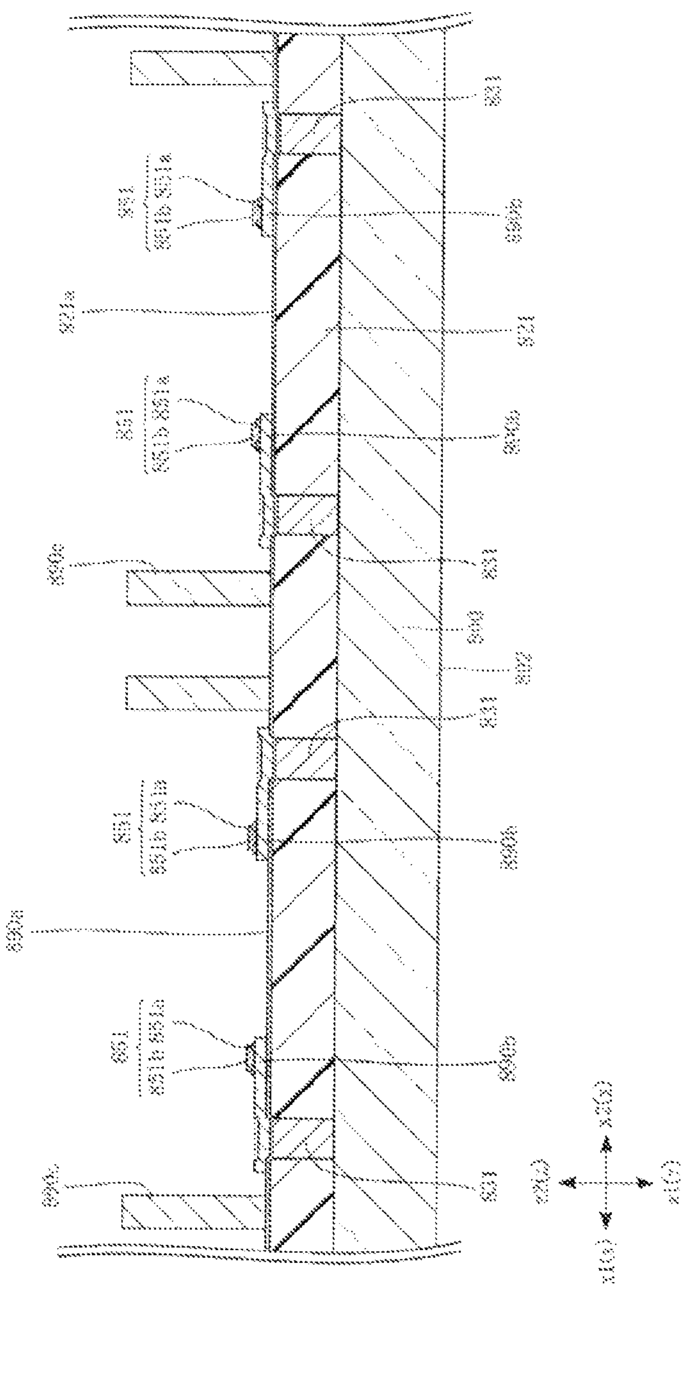
FIG. 11 is a cross-sectional view illustrative of a step of the manufacturing method of the electronic device according to the first embodiment of the present disclosure.

In the fourth step, as shown in FIG. 11, a plated layer 890*c* is formed. For example, the photoresist pattern is formed on the plated layer 890*c* by photolithography and electroplating. The plated layer 890*c* is formed in the same way as the plated layer 890*b*. In a step of forming the plated layer 890*c*, the photoresist pattern for forming the plated layer 890*c* is formed. Therefore, a part (which forms the plated layer 890*c*) of the basal layer 890*a* is exposed from the photoresist pattern thus formed. After that, the basal layer 890*a* functions as a conducting path whereby electroplating is carried out, and thus the plated layer 890*c* is emanated from the basal layer 890*a* exposed from the photoresist pattern. In this embodiment, for example, the metal layer comprising Cu is emanated to function as the plated layer 890*c*. The plated layer 890*c* is integrally formed with the basal layer 890*a*. Afterward, the photoresist pattern formed in this step is removed. Therefore, the plated layer 890*c* shown in FIG. 11 is formed. In this embodiment, the plated layer 890*c* and the basal layer 890*a* covered by the plated layer 890*c* function as the frame-shaped conductor 861. The frame-shaped conductor 861 corresponds to the frame-shaped conductor 61 of the electronic device A1.

Figure 12:
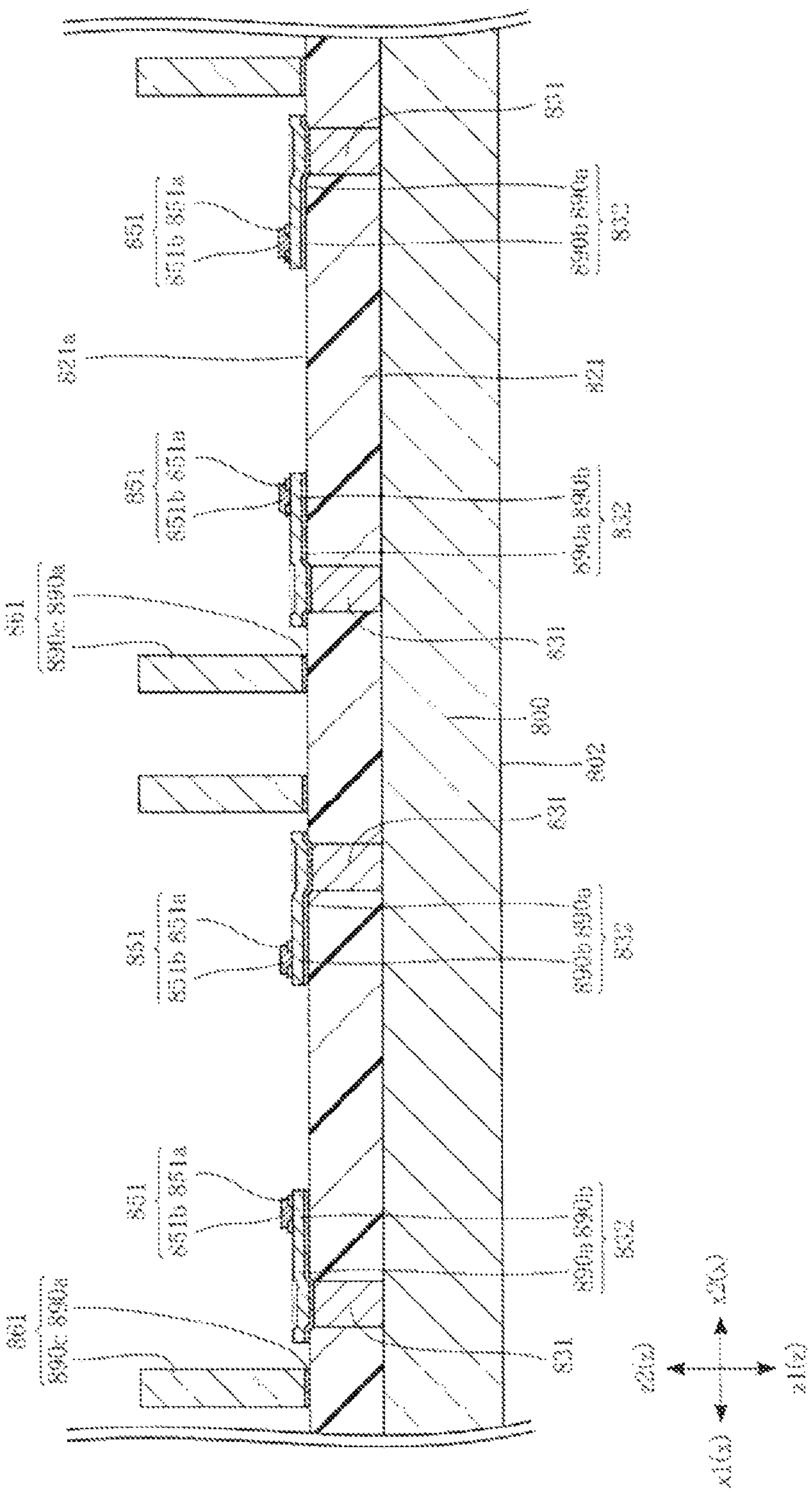
FIG. 12 is a cross-sectional view illustrative of a step of the manufacturing method of the electronic device according to the first embodiment of the present disclosure.

In the fifth step, as shown in FIG. 12, the basal layer 890*a* which is useless is removed. In this embodiment, the basal layer 890*a* not covered by any one of the plated layer 890*b* and the plated layer 890*c* is regarded as the useless basal layer 890*a* and thus removed. The useless basal layer 890*a* is, for example, removed by wet etching, using a mixture solution of sulfuric acid ($H_2SO_4$) and hydrogen peroxide ($H_2O_2$). In the step of removing the useless basal layer 890*a*, as shown in FIG. 12, the basal layer 890*a* formed in the first step is divided into the basal layer 890*a* covered by the plated layer 890*b* and the basal layer 890*a* covered by the plated layer 890*c*. Therefore, as shown in FIG. 12, the plated layer 890*b* and the basal layer 890*a* covered by the plated layer 890*b* are used to form the wiring layers 832, whereas the plated layer 890*c* and the basal layer 890*a* covered by the plated layer 890*c* are used to form the frame-shaped conductor 861. Referring to FIGS. 13~17, the plated layer 890*b* and the basal layer 890*a* covered by the plated layer 890*b* are integrally expressed as the wiring layers 832, whereas the plated layer 890*c* and the basal layer 890*a* covered by the plated layer 890*c* are integrally expressed as the frame-shaped conductor 861.

Referring to FIG. 12, the aforesaid five steps are carried out to form the wiring layers 832, the connecting portions 851 and the frame-shaped conductor 861. In this embodiment, the same basal layer 890*a* is used to form the wiring layers 832 and the frame-shaped conductor 861; however, in a variant embodiment, formation of the wiring layers 832 and formation of the frame-shaped conductor 861 requires formation of different basal layers, respectively. In this embodiment, a step of forming the basal layer 890*a*, a step of forming the plated layer 890*b*, and a step of removing the useless basal layer 890*a* are combined to become a step combo equivalent to "a first wiring layer forming step" recited in the claims, whereas a step of forming the basal layer 890*a*, a step of forming the plated layer 890*c*, and a step of removing the useless basal layer 890*a* are combined to become a step combo equivalent to "a second conductor forming step" recited in the claims.

Figure 13:
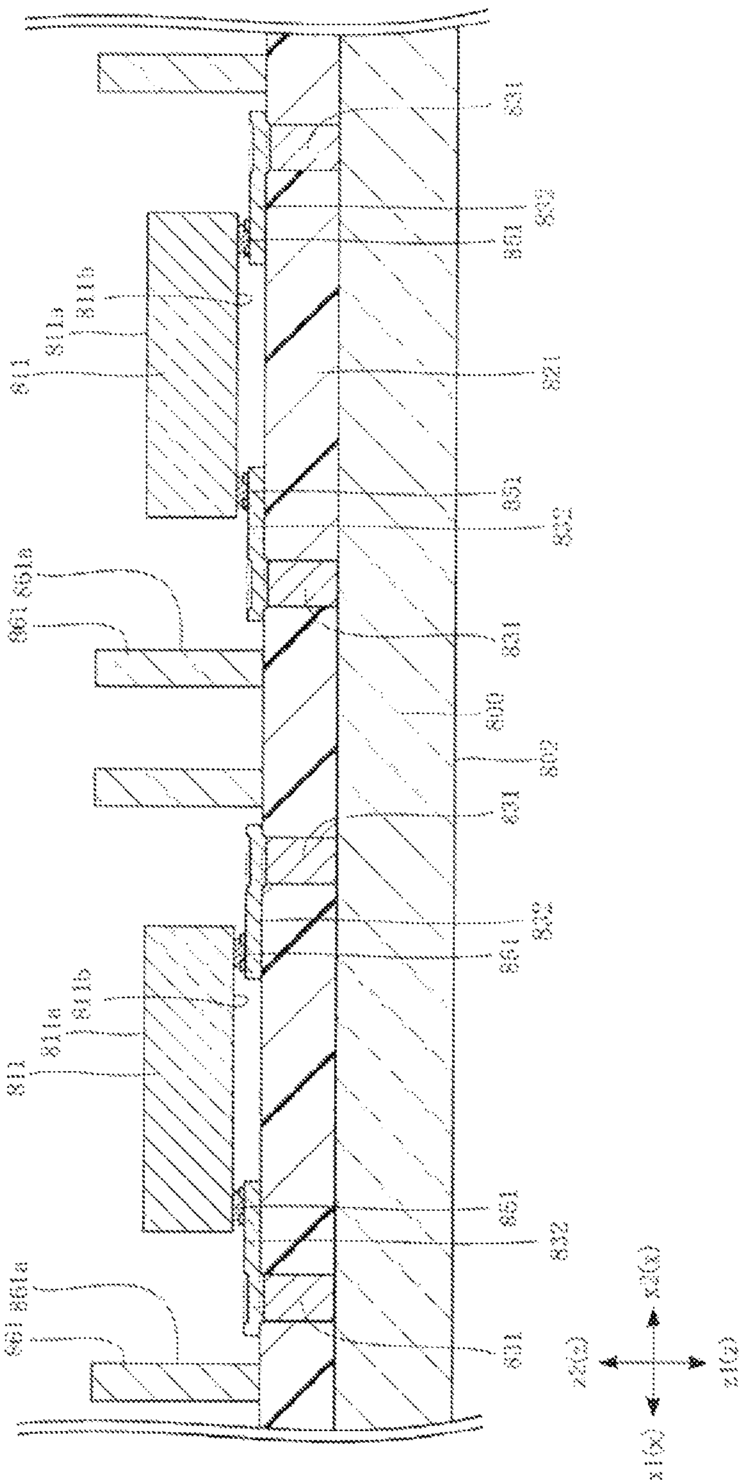
FIG. 13 is a cross-sectional view illustrative of a step of the manufacturing method of the electronic device according to the first embodiment of the present disclosure.

Afterward, as shown in FIG. 13, the manufacturing method of the electronic device A1 entails mounting an electronic component 811. The electronic component 811 corresponds to the electronic component 11 of the electronic device A1. The electronic component 811 has a component main surface 811*a* facing direction z2 and a component inner surface 811*b* facing direction z1, with electrode pads (not shown) formed on the component inner surface 811*b*. A step of mounting the electronic component 811 (a first electronic component mounting step) is carried out by flip-chip bonding. After flux has been coated on the component inner surfaces 811*b* of the electronic components 811, for example, the electronic component 811 is temporarily mounted on the connecting portions 851 with a flip-chip bonder. At this point, the component inner surfaces 811*b* face the wiring layers 832. Each connecting portion 851 is an electrode pad (not shown) formed between the wiring layer 832 and the component inner surface 811*b* formed on the electronic component 811. Afterward, the connecting layers 851*b* of the connecting portions 851 are melted by reflow soldering and thus coupled to the electrode pads. Then, the connecting layers 851*b* of the connecting portions 851 are cooled and solidified. Therefore, the electronic component 811 is mounted on the wiring layers 832 such that the electrode pads of the electronic component 811 are electrically connected to the wiring layers 832 by the connecting portions 851.

Figure 14:
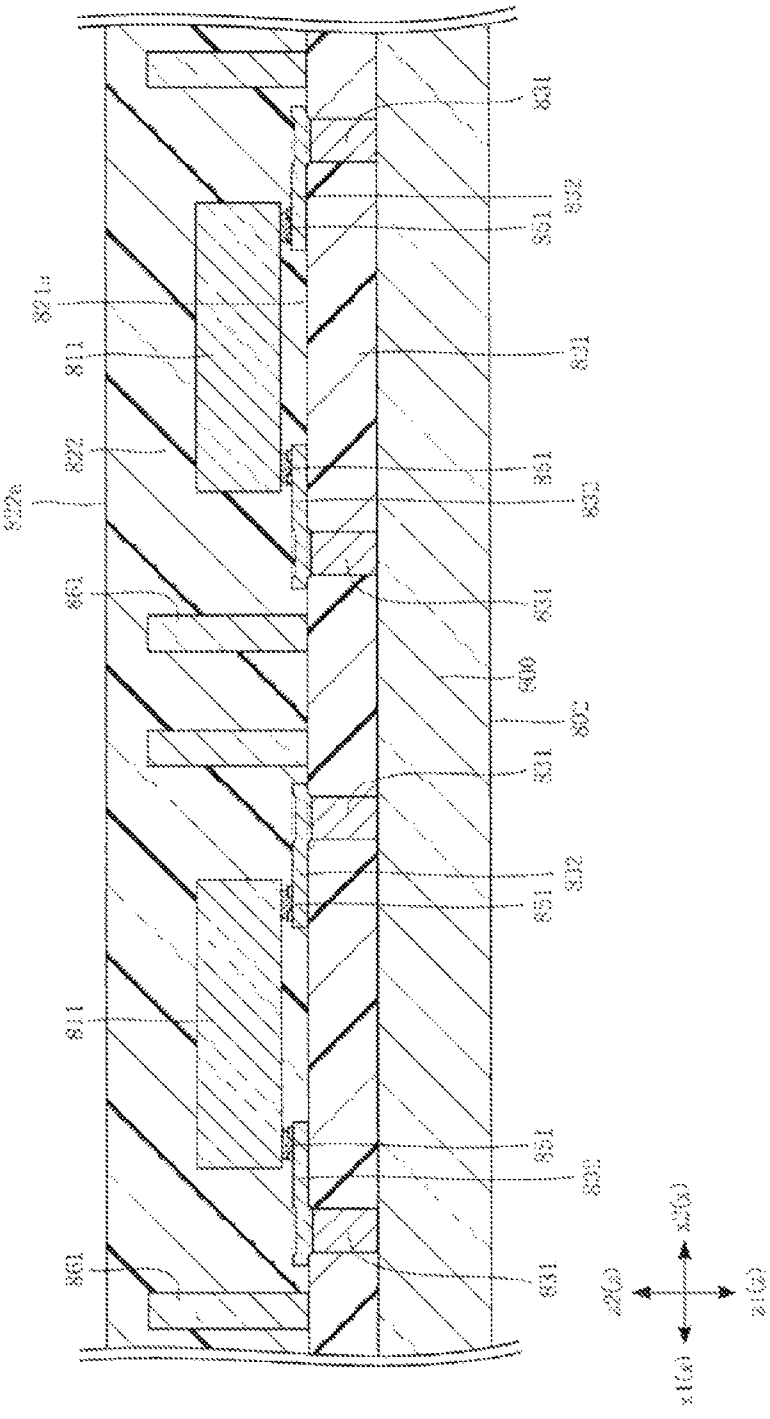
FIG. 14 is a cross-sectional view illustrative of a step of the manufacturing method of the electronic device according to the first embodiment of the present disclosure.

Afterward, as shown in FIG. 14, the manufacturing method of the electronic device A1 entails forming a second resin layer 822. A step of forming the second resin layer 822 (a second resin layer forming step) is, for example, carried out by die molding. Both the second resin layer 822 and the first resin layer 821 are capable of electrical insulation and are, for example, made of synthetic resin which uses black epoxy resin as a base. In this embodiment, the second resin layer 822 for covering the electronic component 811 and the frame-shaped conductor 861 is formed on the first resin layer 821. The second resin layer 822 formed in the second resin layer forming step fully covers the electronic component 811 and the frame-shaped conductor 861. Therefore, the direction-z2-facing surface (a second resin layer main surface 822*a*) of the second resin layer 822 is closer to direction z2 than any one of the direction-z2-facing surface of the frame-shaped conductor 861 and the component main surface 811*a*. Prior to performing die molding, the second resin layer forming step involves applying, for example, underfill, which uses epoxy resin as a base, to the electronic component 811 from below (between the electronic component 811 and the first resin layer main surface 821*a*).

Figure 15:
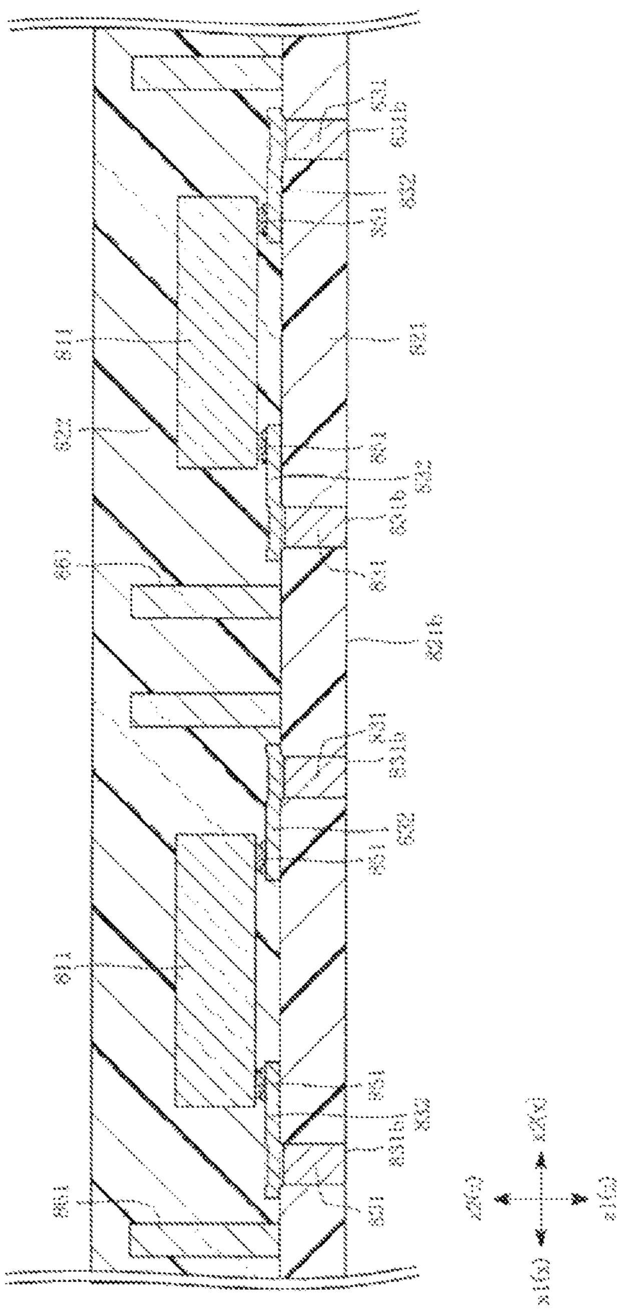
FIG. 15 is a cross-sectional view illustrative of a step of the manufacturing method of the electronic device according to the first embodiment of the present disclosure.

Afterward, as shown in FIG. 15, the manufacturing method of the electronic device A1 entails removing the supporting substrate 800. In a step of removing the supporting substrate 800 (a supporting substrate removing step), grinding is performed with a mechanical grinding wheel. However, the grinding is not necessarily performed with a mechanical grinding wheel. In this embodiment, the supporting substrate 800 is ground from the supporting substrate inner surface 802 toward direction z2 until the supporting substrate 800 is fully removed. In this embodiment, not only is the supporting substrate 800 ground and fully removed, but the basal layer of the columnar conductor 831 is also ground. Therefore, the plated layer, which is a Cu-containing metal layer, functions as the columnar conductor 831. When the basal layer of the columnar conductor 831 is kept intact while the supporting substrate 800 is being ground, the columnar conductor 831 comprises a basal layer and a plated layer. Owing to the step of removing the supporting substrate, both the direction-z1-facing surface (first resin layer inner surface 821*b*) of the first resin layer 821 and the direction-z1-facing surface (columnar conductor inner surface 831*b*) of the columnar conductor 831 are exposed to the outside. When the supporting substrate 800 is a glass substrate, the glass substrate is stripped away by chemical processing or laser irradiation, thereby removing the supporting substrate 800.

Figure 16:
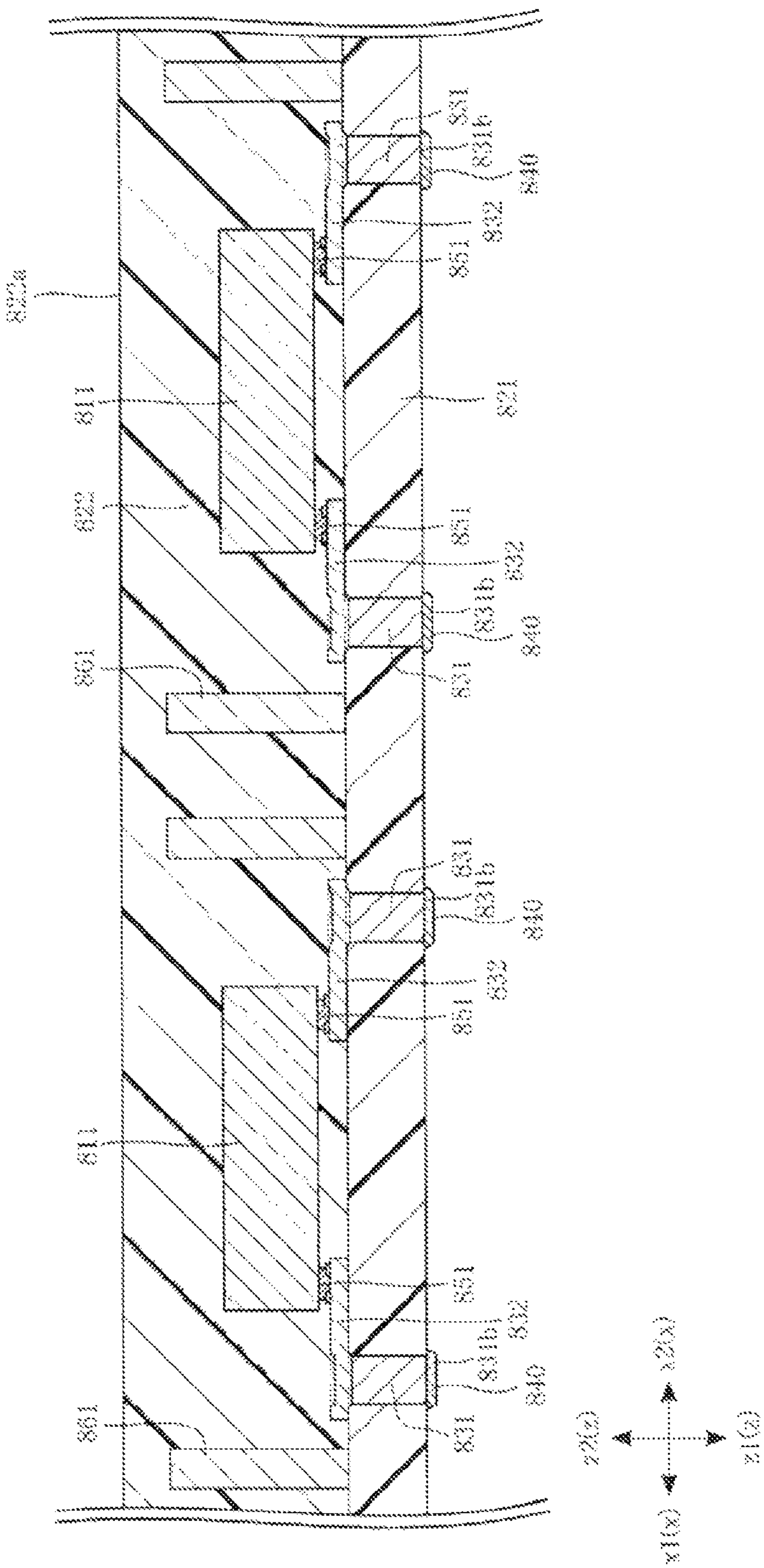
FIG. 16 is a cross-sectional view illustrative of a step of the manufacturing method of the electronic device according to the first embodiment of the present disclosure.

Afterward, as shown in FIG. 16, the manufacturing method of the electronic device A1 entails forming an external electrode 840. A step of forming the external electrode 840 (an external electrode forming step) requires electroless plating. In this embodiment, by electroless plating, the Ni layer, Pd layer and Au layer are emanated sequentially. At this point, the Ni layer which is in contact with the columnar conductor inner surface 831*b* and covers the columnar conductor inner surface 831*b* is formed, the Pd layer is formed on the Ni layer, and the Au layer is formed on the Pd layer. Therefore, the external electrode 840 shown in FIG. 16 is formed. The above description is not restrictive of how the external electrode 840 is formed; hence, the present disclosure allows the Ni layer and Au layer to be emanated sequentially, allows the sole presence of the Au layer, or allows the sole presence of Sn.

Figure 17:
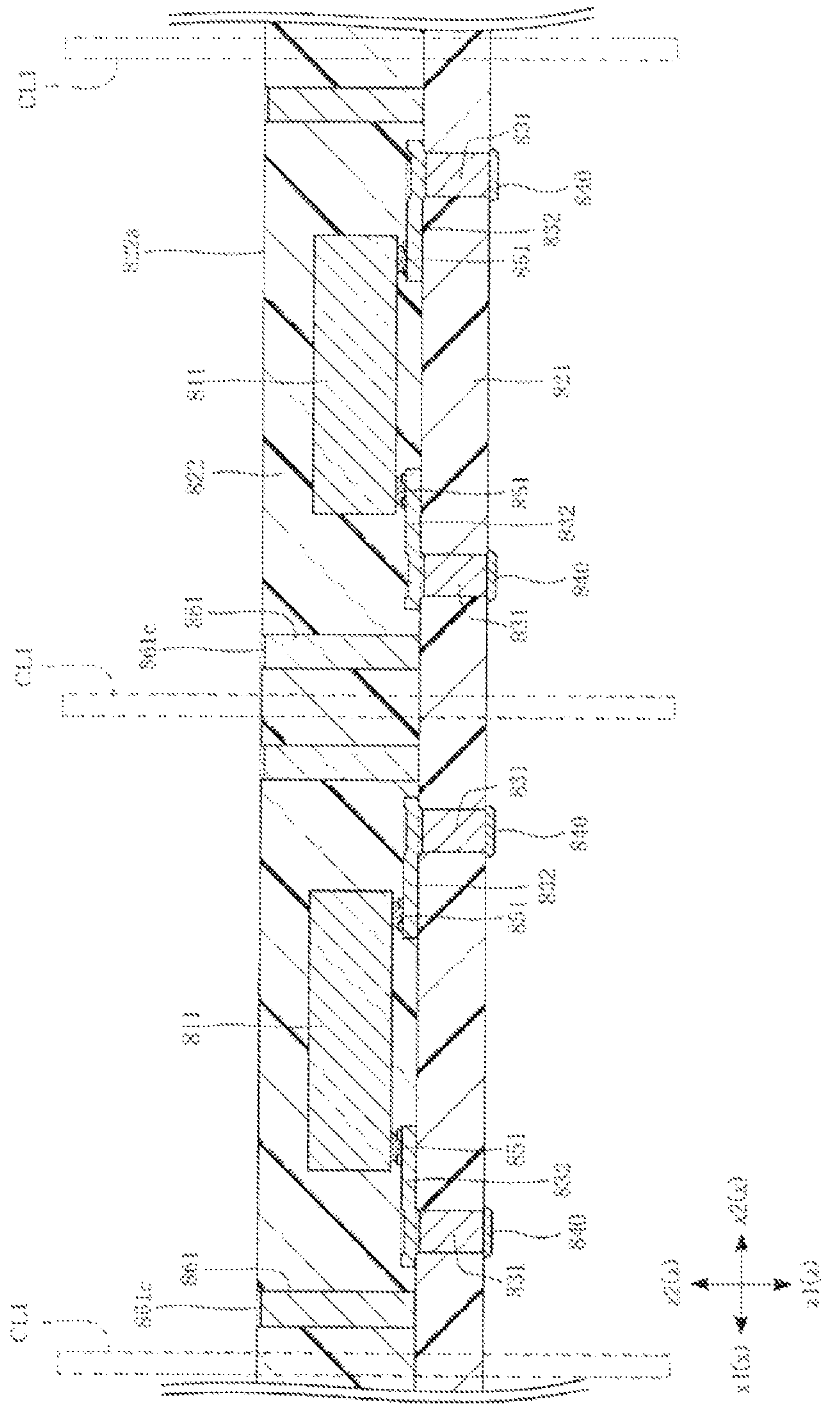
FIG. 17 is a cross-sectional view illustrative of a step of the manufacturing method of the electronic device according to the first embodiment of the present disclosure.

Afterward, as shown in FIG. 17, the manufacturing method of the electronic device A1 entails grinding a second resin layer 822. A step of grinding the second resin layer 822 (a second resin layer grinding step) entails, for example, grinding the second resin layer 822 with a mechanical grinding wheel, such as a grinding stone. The present disclosure is not restrictive of how the second resin layer 822 is ground. In this embodiment, the second resin layer 822 is ground from the second resin layer main surface 822*a* toward direction z1 until the frame-shaped conductor 861 is exposed. Therefore, the second resin layer main surface 822*a* moves in direction z1, and the direction-z-facing surface (a top surface 861*c*) of the frame-shaped conductor 861 is exposed from the second resin layer 822 (the second resin layer main surface 822*a*). In this embodiment, the grinding of the second resin layer 822 is accompanied by a smaller degree of the grinding of the frame-shaped conductor 861. Upon completion of the grinding process, a burr is likely to be formed on the top surface 861*c*, because the frame-shaped conductor 861 and the second resin layer 822 are made of different materials. Therefore, the burr is removed by chemical processing. Therefore, the top surface 861*c* of the frame-shaped conductor 861 dents in direction z more than the second resin layer main surface 822*a*.

Afterward, the manufacturing method of the electronic device A1 entails performing singulation to attain each electronic component 811. In a singulation step (a singulating step), for example, the first resin layer 821 and the second resin layer 822 are cut with a knife blade. At this point, the first resin layer 821 and the second resin layer 822 are cut along a cutting line CL1 shown in FIG. 17 and depicted in a rectangular shape because of the thickness of the knife blade. The cutting process is not necessarily carried out with a knife blade. In a variant embodiment, the cutting process is carried out by laser cutting or plasma cutting. At the end of the singulation step, the first resin layer 821 and the second resin layer 822 are cut and turned into the electronic devices A1, one of which is shown in FIG. 1~FIG. 4.

The aforesaid steps are carried out to manufacture the electronic devices A1, one of which is shown in FIG. 1~FIG. 4. The above description of the manufacturing method of the electronic device A1 merely serves exemplary purposes, and thus the present disclosure is not limited thereto. For example, in a variant embodiment, the second resin layer grinding step precedes the supporting substrate removing step and the external electrode forming step. Under the aforesaid condition, to prevent the external electrode 840 from being formed, by electroless plating, on the top surface 861*c* of the frame-shaped conductor 861 exposed from the second resin layer 822 in the external electrode forming step, a cutting protective tape is adhered to the second resin layer main surface 822*a* of the second resin layer 822 before the external electrode forming step. In a variant embodiment, when a connecting part, such as a solder bump, is formed on electrode pads of the electronic component 811, the connecting layers 851*b* of the connecting portions 851 are formed without carrying out the step of forming the connecting layers 851*b*.

The effect and advantage of the electronic device A1 and the manufacturing method of the electronic device A1 according to the first embodiment are described below.

The electronic device A1 comprises the first resin layer 21 and the second resin layer 22. The first resin layer 21 spaces apart the wiring layers 32 to underpin the electronic component 11. The second resin layer 22 is formed on the first resin layer 21 and covers the electronic component 11. Given the aforesaid structural features, the first resin layer 21 is a supporting part for supporting the electronic component 11, and the second resin layer 22 is a protective part for covering the electronic component 11. Therefore, the difference in thermal expansion coefficient between the supporting part and the protective part decreases. In this embodiment, there is hardly any difference in thermal expansion coefficient between the supporting part and the protective part, because both the first resin layer 21 and the second resin layer 22 are made of epoxy resin. Therefore, thermal stress on the interface between the supporting part (first resin layer 21) and the protective part (second resin layer 22) is lessened by the heat generated by the electronic component 11 while the electronic device A1 is powered. Therefore, the protective part is less likely to be stripped away from the supporting part, thereby enhancing the reliability of the electronic device A1.

Regarding the electronic device A1, the electronic component 11 is underpinned by the first resin layer 21 formed by die molding. Regarding an electronic device different from the electronic device A1 of the present disclosure, for example, an electronic device disclosed in citation document 1, the electronic component 11 is underpinned by the semiconductor substrate (silicon substrate). Therefore, formation of terminals on the bottom side of the electronic device entails forming a penetrating electrode known as TSV (through-silicon via). The formation of the TSV entails, for example, forming a penetrating hole by an etching process known as Bosch process; however, the thicker the semiconductor substrate is, the more difficult the formation of the penetrating hole is. Therefore, it is impossible to form the penetrating electrode which penetrates the supporting part (the semiconductor substrate). According to this embodiment, after the columnar conductor 31 (the columnar conductor 831) has been formed by electroplating, the first resin layer 21 (first resin layer 821) is formed by die molding. Therefore, a penetrating electrode (the columnar conductor 31) which penetrates the supporting part (first resin layer 21) can be formed easily. Therefore, the manufacturing of the electronic device A1 is easier than is the case when the semiconductor substrate is used as the supporting part.

Regarding the electronic device A1, a grinding mark is formed on the first resin layer main surface 211 of the first resin layer 21. Therefore, fine grooves and ridges are formed on the first resin layer main surface 211 because of the grinding mark. Given the structural features, the strength of adhesion between the first resin layer 21 and the second resin layer 22 is augmented by the anchoring effect. Therefore, separation of the protective part (second resin layer 22) from the supporting part (first resin layer 21) is prevented, so as to enhance the reliability of the electronic device A1.

Regarding the electronic device A1, the connecting portions 51 each comprise an insulating layer 511. Given this structural feature, the connecting layers 851*b* is less likely to extend to any unexpected locations when the connecting layers 851*b* (especially parts thereof corresponding to the third layer 512*c*) are melted by heat generated from reflow soldering during the first electronic component mounting step. Therefore, inadvertent short circuits are less likely to occur, thereby reducing the malfunctioning of the electronic device A1.

The electronic device A1 comprises the frame-shaped conductor 61. The frame-shaped conductor 61 is made of metal and surrounds the electronic component 11 when viewed from above. Given this structural feature, electromagnetic shielding achieved by the frame-shaped conductor 61 suppresses electromagnetic waves from the lateral side of the electronic component 11. Therefore, the malfunctioning of the electronic device A1 is less likely.

More embodiments of the electronic device of the present disclosure and the manufacturing method of the electronic device of the present disclosure are described below. Identical or similar structural features are hereunder denoted by identical reference numerals and not described whenever the structural features are disclosed in the first embodiment in the same way as the embodiments to be described below.

Second Embodiment

FIG. 18~FIG. 21 illustrate an electronic device according to the second embodiment of the present disclosure. The main feature which distinguishes an electronic device A2 of the second embodiment from the electronic device A1 is that the electronic device A2 comprises an electronic component 12 which is different from the electronic component 11.

Figure 18:
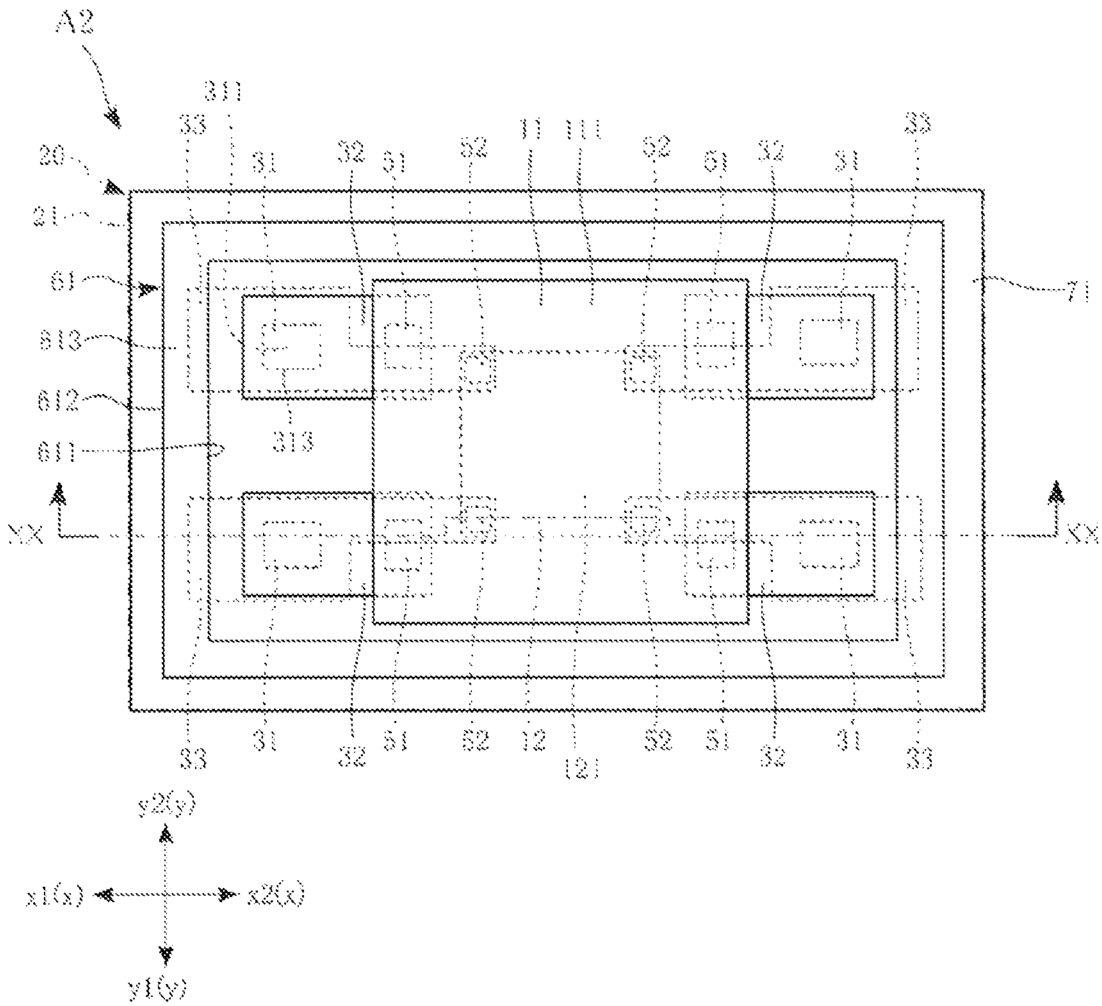
FIG. 18 is a top view of the electronic device according to the second embodiment of the present disclosure.
Figure 19:
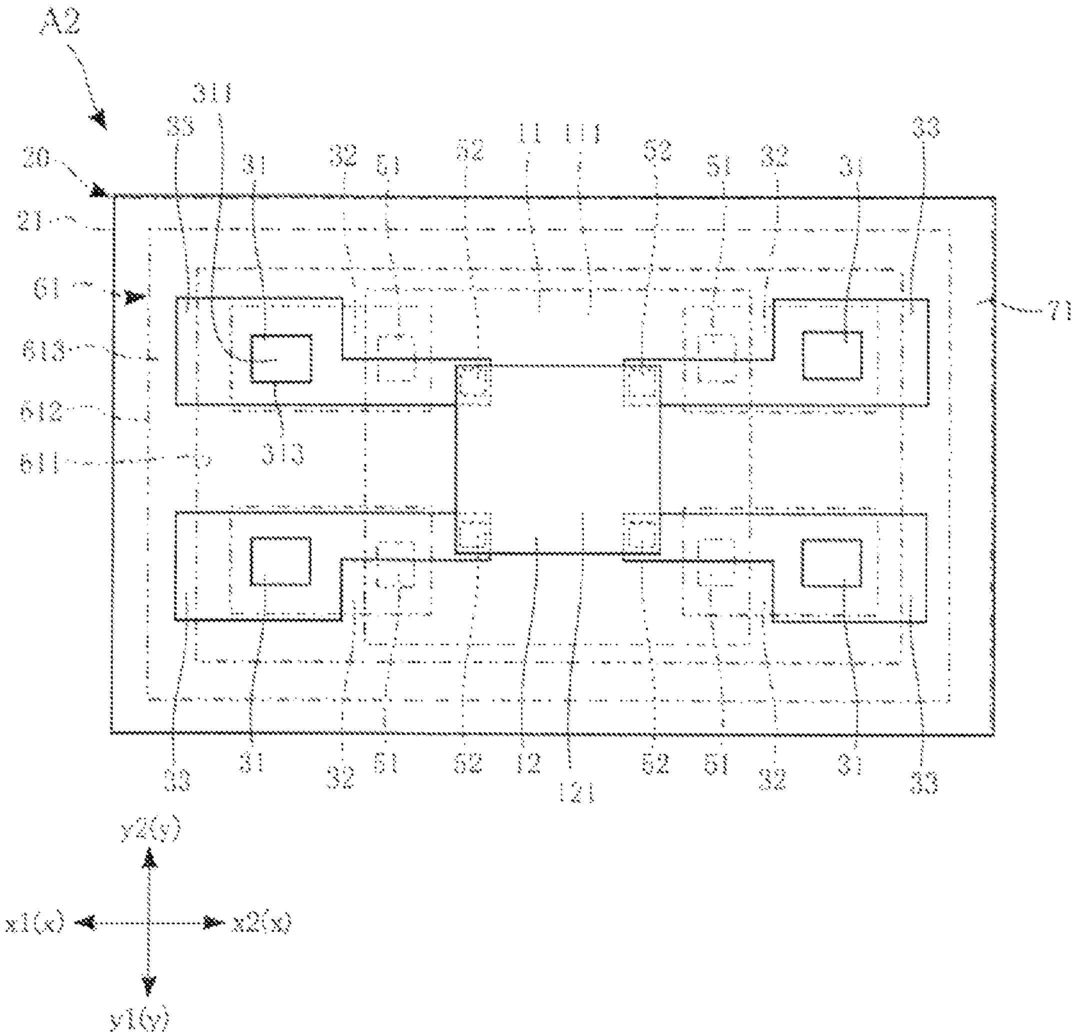
FIG. 19 is a top view of the electronic device according to the second embodiment of the present disclosure.
Figure 20:
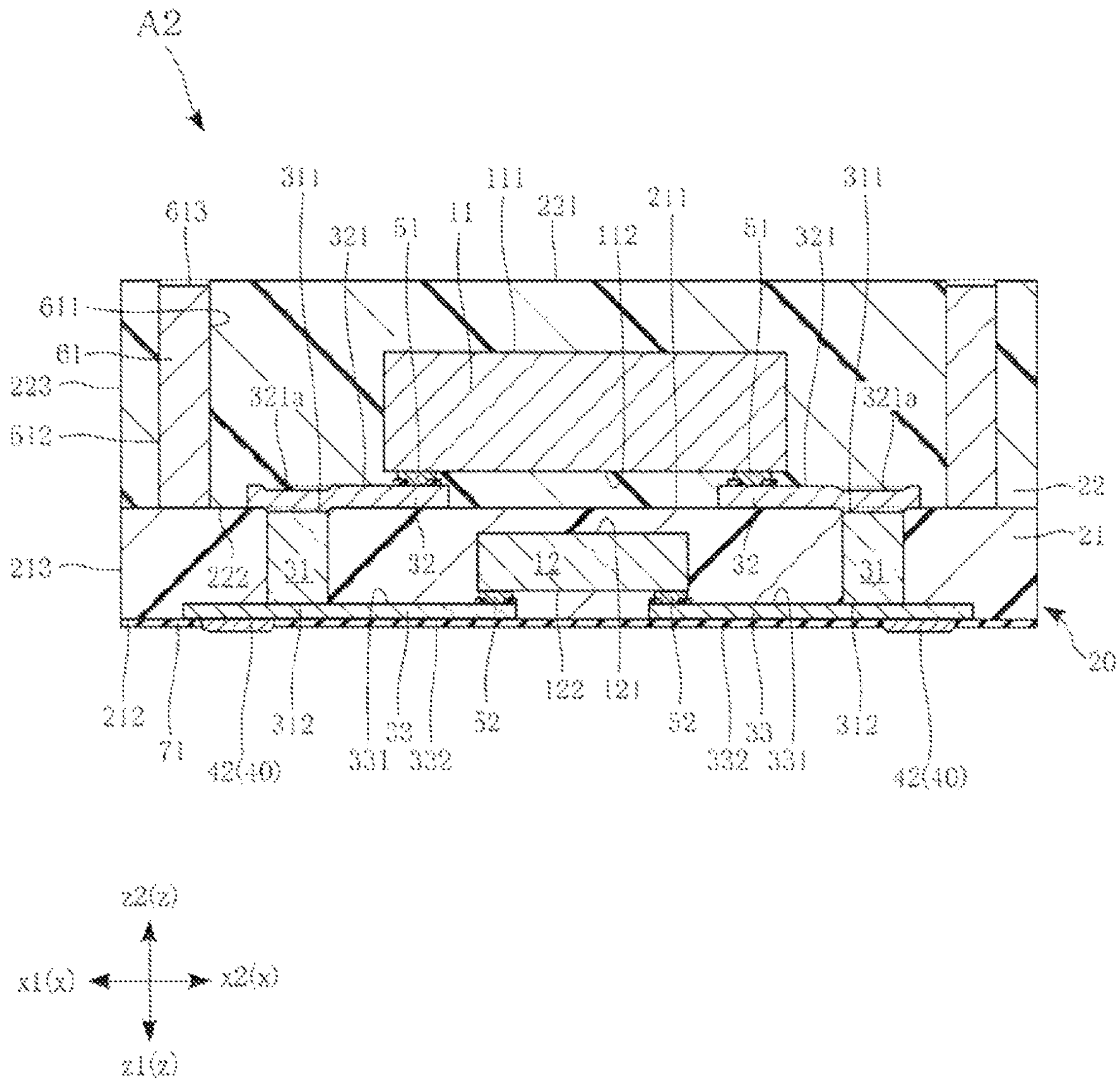
FIG. 20 is a cross-sectional view taken along line XX-XX of FIG. 18.
Figure 21:
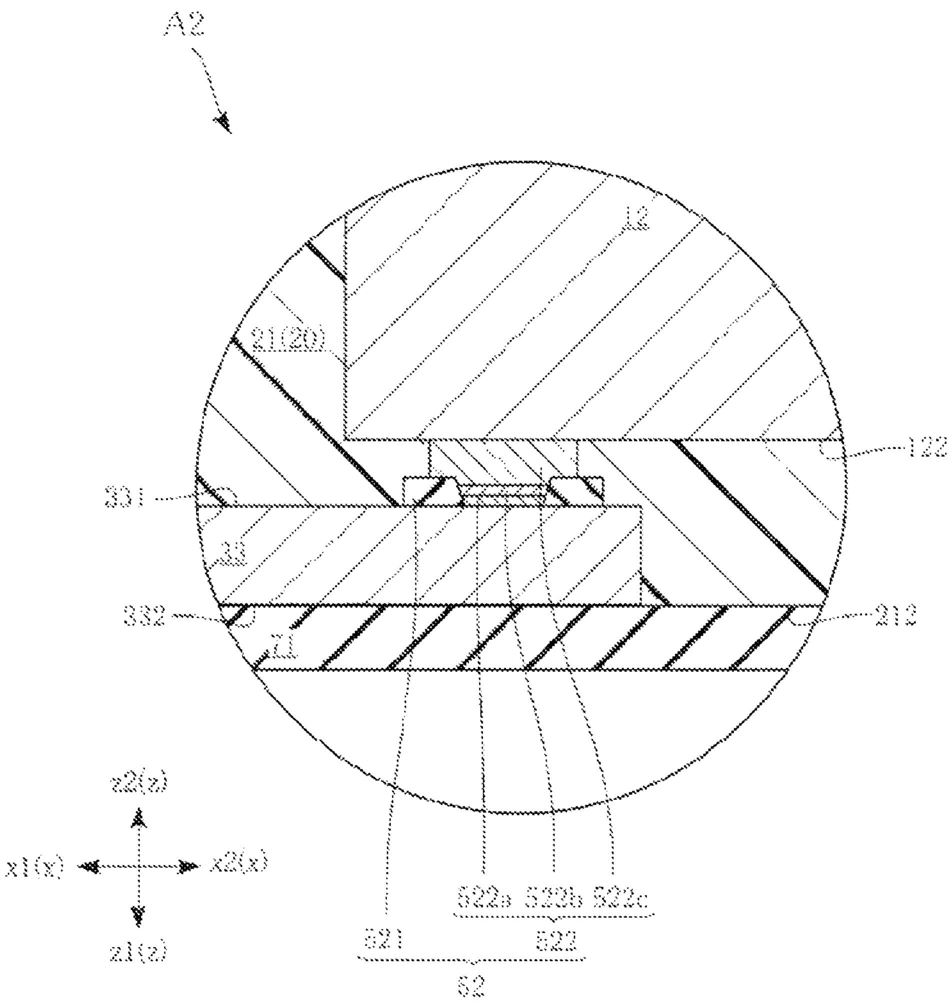
FIG. 21 is a partial enlarged cross-sectional view of a part of FIG. 20.

FIG. 18 is a top view of the electronic device A2 and depicts the hermetic seal resin 20 with an imaginary line (a double-dot and dash line). FIG. 19 is a top view of the electronic device A2 and depicts the electronic component 11, the hermetic seal resin 20, the wiring layers 32, the connecting portions 51 and the frame-shaped conductor 61 with an imaginary line (a double-dot and dash line). FIG. 20 is a top view taken along line XX-XX of FIG. 18. FIG. 21 is a partial enlarged cross-sectional view of a part of FIG. 20.

Referring to FIG. 18~FIG. 21, the electronic device A2 comprises the electronic components 11, 12, the hermetic seal resin 20 (first resin layer 21 and second resin layer 22), a plurality of columnar conductors 31, a plurality of wiring layers 32, 33, a plurality of external electrodes 40, a plurality of connecting portions 51, 52, the frame-shaped conductor 61 and an external protective film 71. Therefore, as shown in FIG. 18~FIG. 21, unlike the electronic device A1, the electronic device A2 further comprises the electronic component 12, the plurality of wiring layers 33, the plurality of connecting portions 52 and the external protective film 71.

The electronic component 12 and the electronic component 11 together are crucial to the functioning of the electronic device A2. In this embodiment, both the electronic component 12 and the electronic component 11 are semiconductor components which comprise the same semiconductor. Like the electronic component 11, the electronic component 12 is, for example, a component for use in voltage control, such as LSI (Large Scale Integration), IC (integrated circuit), and LDO (Low Drop Out), a component for use in amplification, such as an operational amplifier, or a discrete component, such as a transistor and a diode. The electronic component 12 comprises a semiconductor. The component is a passive component, for example, a resistor, an inductor, and a capacitor. When viewed from above, the electronic component 12 is rectangular in shape. When viewed from above, the electronic component 12 is smaller than the electronic component 11 and falls within the outline of the electronic component 11. The electronic component 12 is closer to direction z1 than the electronic component 11 in direction z. When viewed from above, the electronic component 12 is larger than the electronic component 11 in a variant embodiment. The electronic component 12 is electrically connected and joined to the wiring layers 33 by the connecting portions 52. The electronic component 12 can be surface mounted. The electronic component 12 is covered by the first resin layer 21. The electronic component 12 is equivalent to "a second electronic component" recited in the claims. As shown in FIG. 20, the electronic component 12 has a component main surface 121 and a component inner surface 122.

The component main surface 121 and the component inner surface 122 are spaced apart from each other in direction z and face opposite sides. The component main surface 121 faces direction z2. The component inner surface 122 faces direction z1. The component main surface 121 is covered by the first resin layer 21. A plurality of electrode pads (not shown) is formed on the component inner surface 122. The plurality of electrode pads each comprise aluminum (A1), for example. The electrode pads are terminals in the electronic component 12. FIG. 18 and FIG. 19 is not restrictive of the quantity and position of the plurality of electrode pads. The component main surface 121 is equivalent to "a second component main surface" recited in the claims.

In this embodiment, the columnar conductors 31 are formed on the wiring layers 33, respectively. The columnar conductor inner surfaces 312 of the columnar conductors 31 are in contact with the wiring layers 33, respectively. In this embodiment, the columnar conductors 31 are made of Cu. Each columnar conductor 31 comprises a basal layer and a plated layer which are laminated to each other. Under the aforesaid condition, the basal layer comprises Ti layer and Cu layer, with the Ti layer formed on the wiring layers 33, and the Cu layer formed on the Ti layer. The plated layer comprises Cu and is formed on the Cu layer of the basal layer.

The wiring layers 33 electrically connect the electronic component 12 to the columnar conductors 31, respectively. The wiring layers 33 each comprise a basal layer and a plated layer which are laminated to each other. The basal layer comprises a Ti layer and a Cu layer which are laminated to each other and is approximately 200~800 nm thick. The plated layer, for example, comprises Cu and is configured to be thicker than the basal layer. The above description is not restrictive of what material the wiring layers 33 are made of. FIG. 18 and FIG. 19 are not restrictive of the size of the wiring layers 33. The wiring layers 33 are each equivalent to “a second wiring layer” recited in the claims.

The wiring layers 33 each have a wiring layer main surface 331 and a wiring layer inner surface 332. The wiring layer main surface 331 and the wiring layer inner surface 332 are spaced apart and face opposite sides in direction z. The wiring layer main surface 331 faces direction z2, and the wiring layer inner surface 332 faces direction z1. The wiring layer main surface 331 is covered by the first resin layer 21. The columnar conductors 31 and the connecting portions 52 are formed, one by one, on each wiring layer main surface 331. A part of the wiring layer main surface 331 is in contact with the columnar conductor inner surface 312. The wiring layer inner surface 332 is exposed from the first resin layer 21 (first resin layer inner surface 212). In this embodiment, the wiring layer inner surface 332 and the first resin layer inner surface 212 are coplanar. A part of the wiring layer inner surface 332 is in contact with the external electrode 40. The wiring layer main surface 331 and the wiring layer inner surface 332 are equivalent to “a second wiring layer main surface” and “a second wiring layer inner surface” recited in the claims, respectively.

In this embodiment, the plurality of external electrodes 40 does not include a plurality of columnar conductor covering portions 41 but comprises a plurality of wiring layer covering portions 42.

Each wiring layer covering portion 42 covers a part of a corresponding one of the wiring layer inner surfaces 332. The wiring layer covering portions 42 are in contact with the wiring layer inner surfaces 332, respectively. In this embodiment, the electronic component 11 is electrically connected to the wiring layer covering portions 42 by the connecting portions 51, the wiring layers 32, the columnar conductors 31 and the wiring layers 33, respectively. The electronic component 12 is electrically connected to the wiring layer covering portions 42 by the connecting portions 52 and the wiring layers 33, respectively. Therefore, the wiring layer covering portions 42 are terminals electrically connected to both the electronic component 11 and the electronic component 12. The wiring layer covering portions 42 are each equivalent to “a second wiring layer covering portion” recited in the claims.

The connecting portions 52 are conductive connecting elements formed between the electronic component 12 (electrode pads) and the wiring layers 33. The electronic component 12 is fixed to the plurality of wiring layers 33 by the plurality of connecting portions 52 and thus mounted on the wiring layers 33. The connecting portions 52 ensure that the electronic component 12 is electrically connected to the wiring layers 33. In this embodiment, as shown in FIG. 21, the connecting portion 52 comprises an insulating layer 521 and a connecting layer 522.

Referring to FIG. 21, the insulating layers 521 are formed on the wiring layers 33, respectively. The insulating layer 521 and the insulating layer 511 are of the same structure. When viewed from above, the insulating layer 521 is centrally-opened and frame-shaped. When viewed from above, the insulating layer 521 has the shape of a rectangular frame. When viewed from above, the insulating layer 521 does not necessarily have the shape of a rectangular frame but can also have the shape of a circular frame, an elliptical frame or a polygonal frame. When viewed from above, the insulating layer 521 includes the connecting layer 522. The insulating layer 521 is, for example, made of polyimide resin, but the present disclosure is not limited thereto.

Owing to the connecting layers 522, the electronic component 12 is electrically connected and joined to the wiring layers 33. The connecting layers 522 are formed on the wiring layers 33 (wiring layer main surfaces 331), respectively. The connecting layers 522 and the connecting layers 512 are of the same structure. The connecting layers 522 cover the open parts of the insulating layers 521. In this embodiment, the open parts of the insulating layers 521 are filled with parts of the connecting layers 522, respectively. In this embodiment, as shown in FIG. 21, each connecting layer 522 comprises a first layer **522*a*, a second layer 522*b* and a third layer 522*c* which are laminated to each other. The first layer 522*a*, the second layer 522*b* and the third layer 522*c* are of the same structure as the first layer 512*a*, the second layer 512*b* and the third layer 512*c* of the connecting layer 512 of each connecting portion 51**, respectively.

The external protective film 71 has an insulative resin film. The external protective film 71 is, for example, made of polymeric resin. Examples of the polymeric resin include polyimide resin and phenol-based resin. The present disclosure is not restrictive of what material the external protective film 71 is made of; hence, the external protective film 71 will work, provided that the material which the external protective film 71 is made of is insulative resin. The external protective film 71 at the very least covers the wiring layer inner surfaces 332 exposed from the wiring layer covering portions 42 of the external electrode 40. In this embodiment, the external protective film 71 covers the wiring layer inner surfaces 332 exposed from the wiring layer covering portions 42 of the external electrode 40 and the whole of the first resin layer inner surface 212. The external protective film 71 is equivalent to “a protective film” recited in the claims.

Referring to FIG. 22~FIG. 29, an example of the manufacturing method of the electronic device A2 according to the second embodiment is described below. FIG. 22~FIG. 29 are cross-sectional views of a step of the manufacturing method of the electronic device A2. A step disclosed in the second embodiment is not described whenever the step is disclosed in the second embodiment in a way identical or similar to the first embodiment.

First, like the first embodiment, the second embodiment includes a supporting substrate preparing step for preparing the supporting substrate 800.

Afterward, as shown in FIG. 22~FIG. 26, the wiring layers 833, the connecting portions 852 and the columnar conductors 831 are formed. The wiring layers 833, the connecting portions 852 and the columnar conductors 831 correspond to the wiring layers 32, the connecting portions 52 and the columnar conductors 31 of the electronic device A2, respectively. The wiring layers 833, the connecting portions 852 and the columnar conductors 831 are formed in five steps described below.

Figure 22:
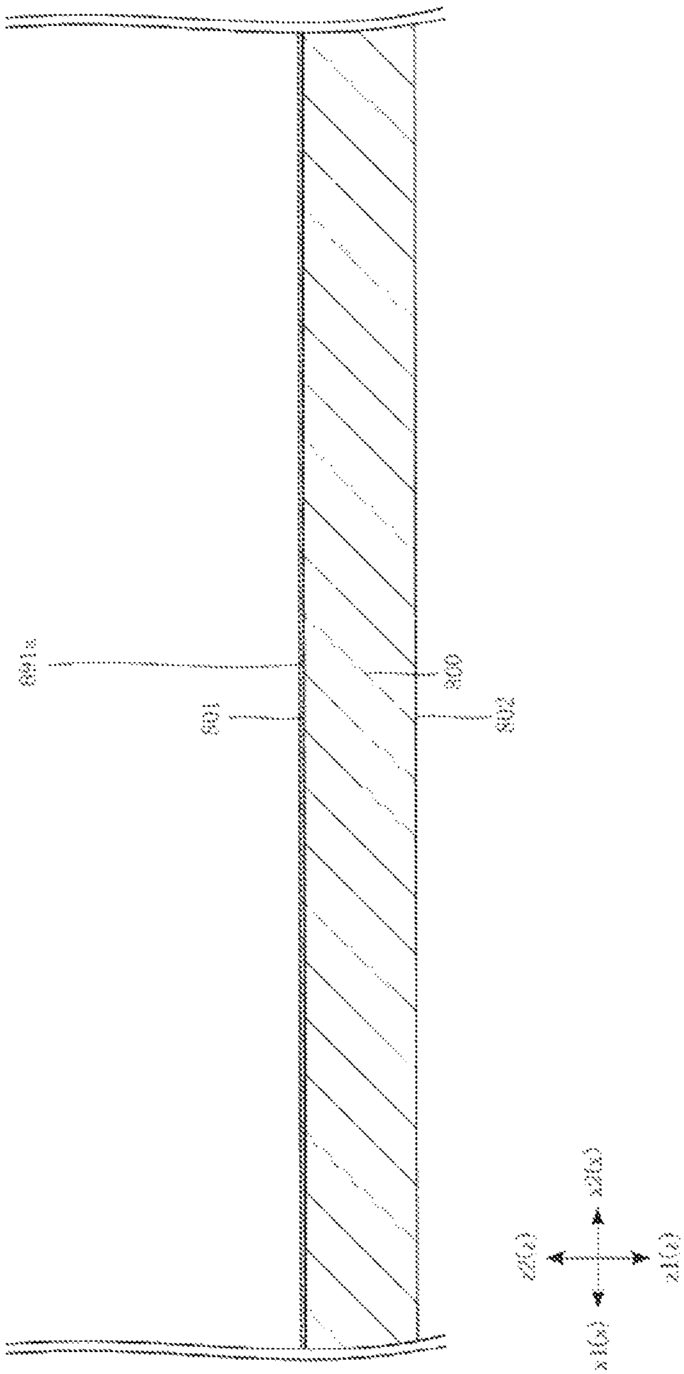
FIG. 22 is a cross-sectional view illustrative of a step of the manufacturing method of the electronic device according to the second embodiment of the present disclosure.

In the first step, as shown in FIG. 22, a basal layer 891*a* is formed. The basal layer 891*a* is, for example, formed by sputtering. In the basal layer 891*a* forming step, after the Ti layer for covering the whole of the supporting substrate main surface 801 has been formed, the Cu layer in contact with the Ti layer is formed. The basal layer 891*a* is formed of a Ti layer and a Cu layer which are laminated to each other.

Figure 23:
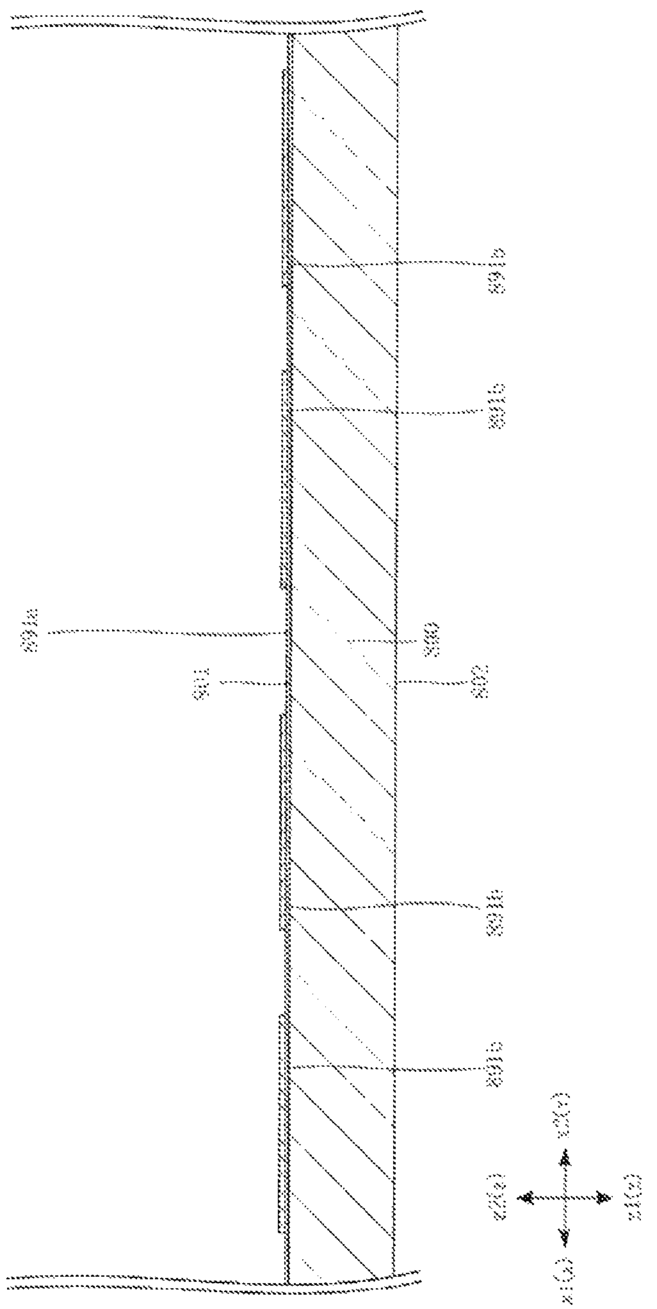
FIG. 23 is a cross-sectional view illustrative of a step of the manufacturing method of the electronic device according to the second embodiment of the present disclosure.

In the second step, as shown in FIG. 23, a plated layer 891*b* is formed. The photoresist pattern is formed on the plated layer 891*b* by photolithography and electroplating. In a step of forming the plated layer 891*b*, the photosensitive photoresist is coated on the whole of the basal layer 891*a* and thereby undergoes exposure and development so as to pattern the photoresist layer. Therefore, the photoresist pattern is formed, and a part (which forms the plated layer 891*b*) of the basal layer 891*a* is exposed from the photoresist pattern. After that, the basal layer 891*a* functions as a conducting path whereby electroplating is carried out, and thus the plated layer 891*b* is emanated from the basal layer 891*a* exposed from the photoresist pattern. In this embodiment, for example, the metal layer functioning as the plated layer 891*b* and comprising Cu is emanated. At this point, the plated layer 891*b* is integrally formed with the basal layer 891*a*. Afterward, the photoresist layer formed in this step is entirely removed. Therefore, the plated layer 891*b* shown in FIG. 23 is formed. Afterward, the plated layer 891*b* and the basal layer 891*a* covered by the plated layer 891*b* become the wiring layers 833. The wiring layers 833 correspond to the wiring layers 33 of the electronic device A2.

Figure 24:
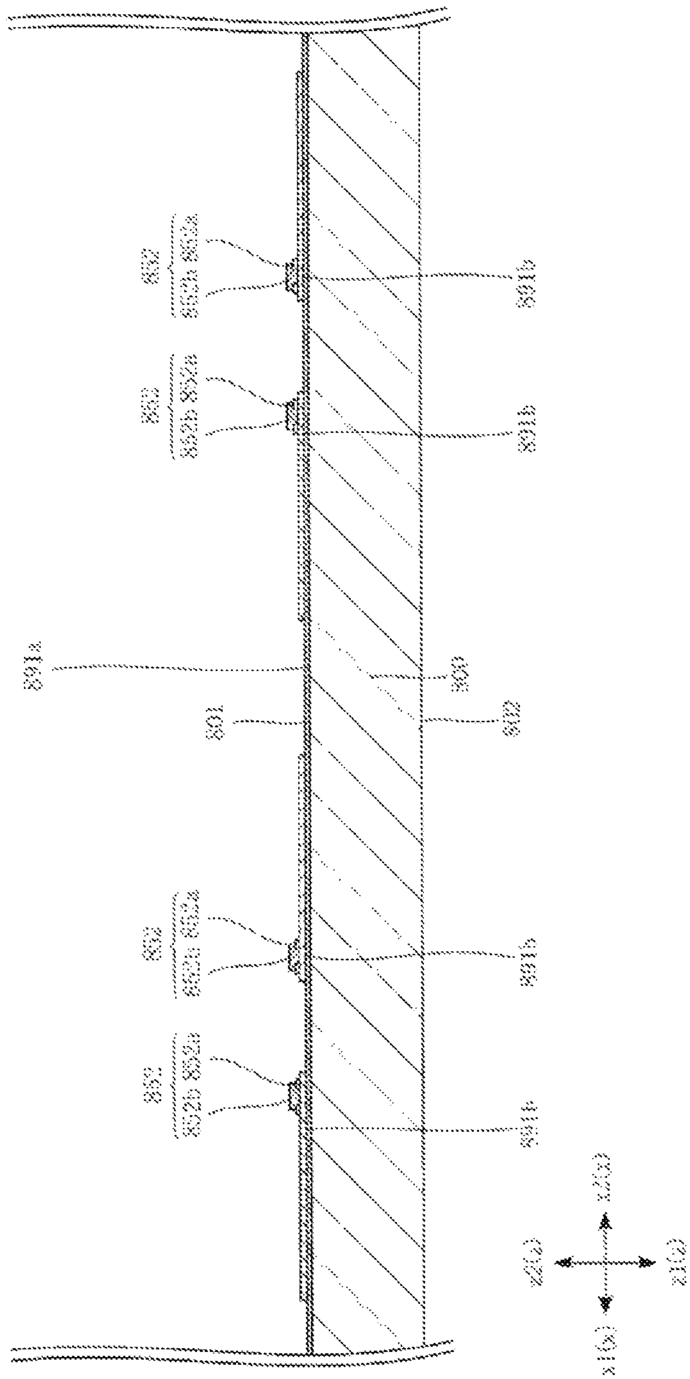
FIG. 24 is a cross-sectional view illustrative of a step of the manufacturing method of the electronic device according to the second embodiment of the present disclosure.

In the third step, as shown in FIG. 24, the connecting portions 852 are formed. In this embodiment, an insulating layer 852*a* and the connecting layers 852*b* are formed to function as the connecting portions 852. In a step of forming the insulating layer 852*a*, photosensitive polyimide is coated on the whole of the plated layer 891*b* and the whole of the basal layer 891*a* exposed from the plated layer 891*b*. The photosensitive polyimide is, for example, coated with a spin coater. Then, the photosensitive polyimide thus coated undergoes exposure and development to form the frame-shaped insulating layer 852*a*. After that, in a step of forming the connecting layers 852*b*, the photoresist pattern for forming the connecting layers 852*b* is formed. The formation of the photoresist pattern entails coating the photosensitive photoresist and performing exposure and development on the coated photosensitive photoresist to pattern the photoresist layer. Therefore, the photoresist pattern is formed, and a part (which forms the connecting layer 852*b*) of the plated layer 891*b* is exposed from the photoresist pattern. The exposed part is located on the inner side of the frame-shaped insulating layer 852*a* when viewed from above. After that, the basal layer 891*a* and plated layer 891*b* function as a conducting path whereby electroplating is carried out, and thus the connecting layer 852*b* is emanated from the plated layer 891*b* exposed from the photoresist pattern. In this embodiment, the connecting layer 852*b* is formed of a Cu-containing metal layer, a Ni-containing metal layer and a Sn-containing alloy layer by sequential lamination. The Sn-containing alloy layer is, for example, made of Sn—Sb based alloy or Sn—Ag based alloy which is typical of lead-free solder. Afterward, the photoresist pattern formed in this step is removed. Therefore, as shown in FIG. 24, the connecting portions 852 each comprising an insulating layer 852*a* and a connecting layer 852*b* are formed. The connecting portions 852 correspond to the connecting portions 52 of the electronic device A2.

Figure 25:
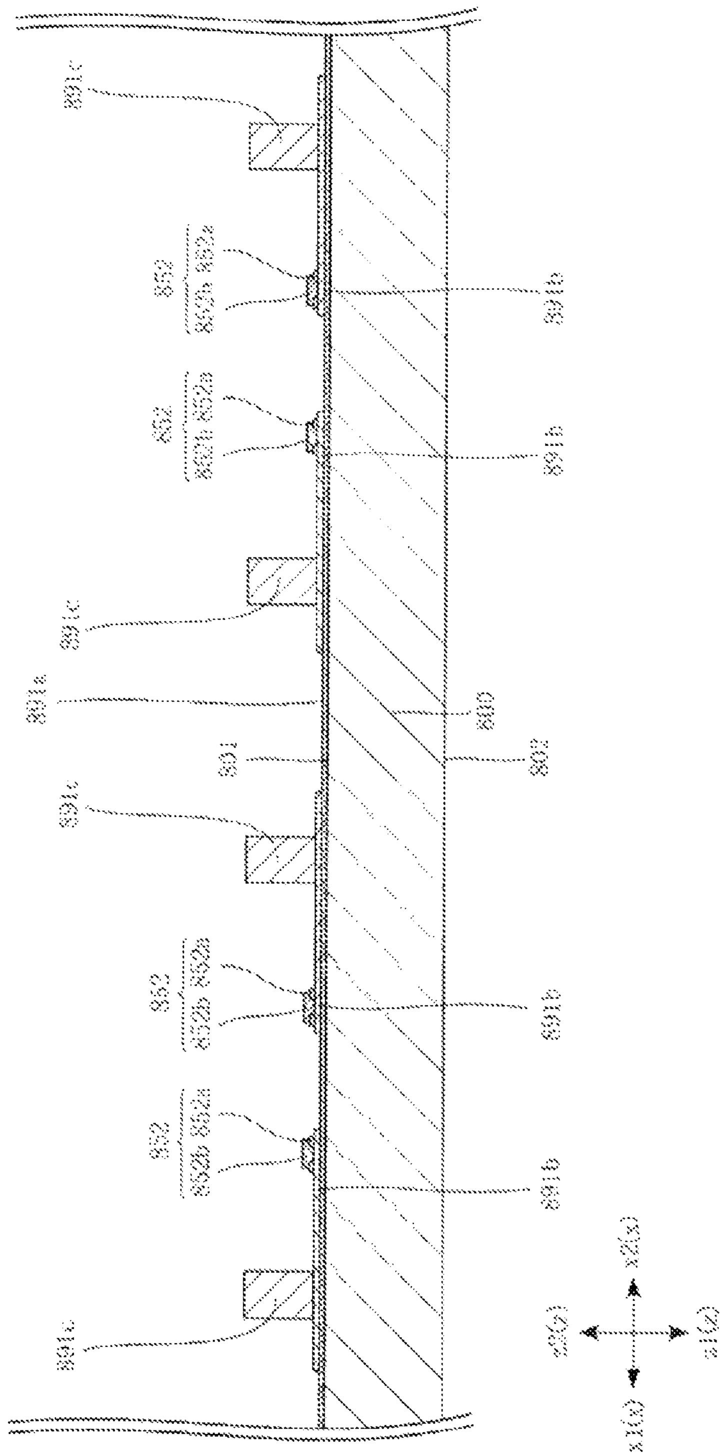
FIG. 25 is a cross-sectional view illustrative of a step of the manufacturing method of the electronic device according to the second embodiment of the present disclosure.

In the fourth step, as shown in FIG. 25, a plated layer 891*c* is formed. For example, the photoresist pattern is formed on the plated layer 891*c* by photolithography and electroplating. The plated layer 891*c* is formed in the same way as the plated layer 891*b*. In a step of forming the plated layer 891*c*, the photoresist pattern for forming the plated layer 891*c* is formed. Therefore, a part (which forms the plated layer 891*c*) of the plated layer 891*b* is exposed from the photoresist pattern thus formed. After that, the basal layer 891*a* and the plated layer 891*b* function as a conducting path whereby electroplating is carried out, and thus the plated layer 891*c* is emanated from the plated layer 891*b* exposed from the photoresist pattern. In this embodiment, for example, the metal layer functioning as the plated layer 891*c* and comprising Cu is emanated. Afterward, the photoresist pattern formed in this step is removed. Therefore, the plated layer 891*c* shown in FIG. 25 is formed. In this embodiment, the plated layer 891*c* becomes the columnar conductor 831.

Figure 26:
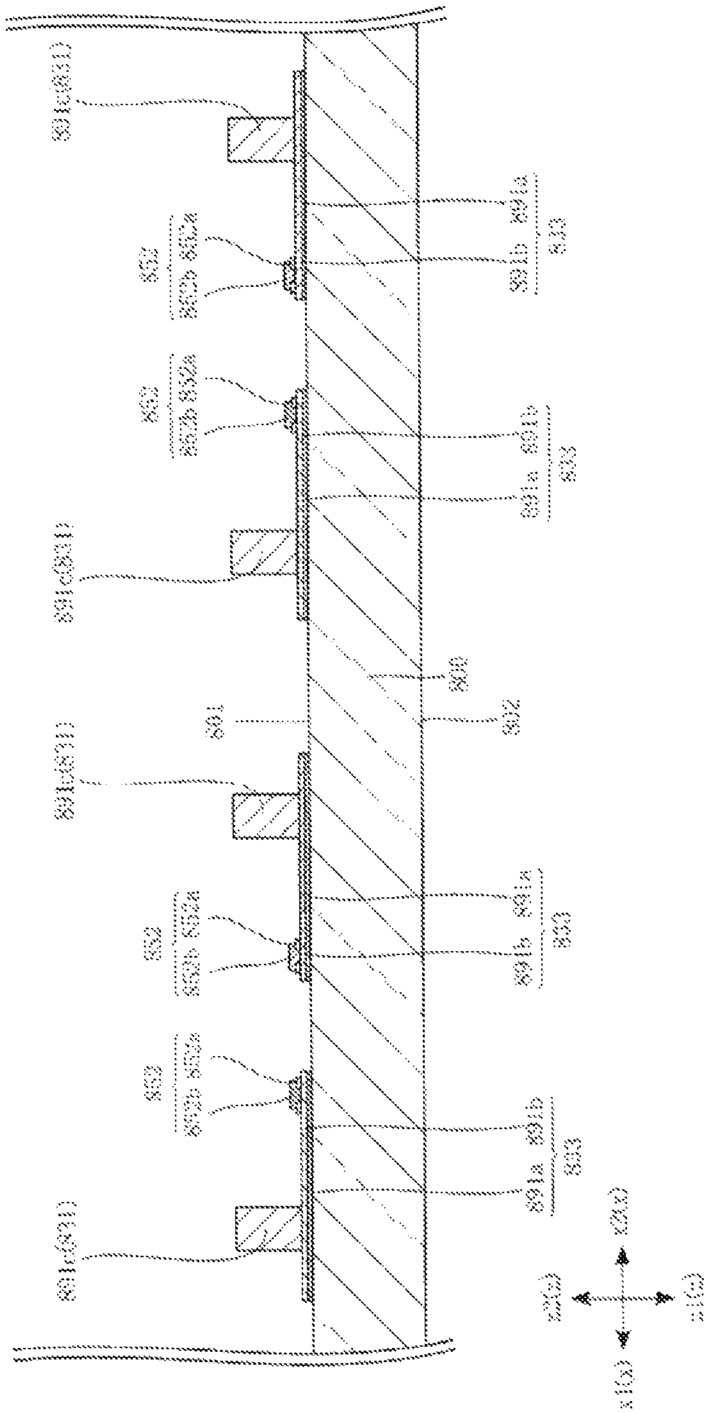
FIG. 26 is a cross-sectional view illustrative of a step of the manufacturing method of the electronic device according to the second embodiment of the present disclosure.
Figure 27:
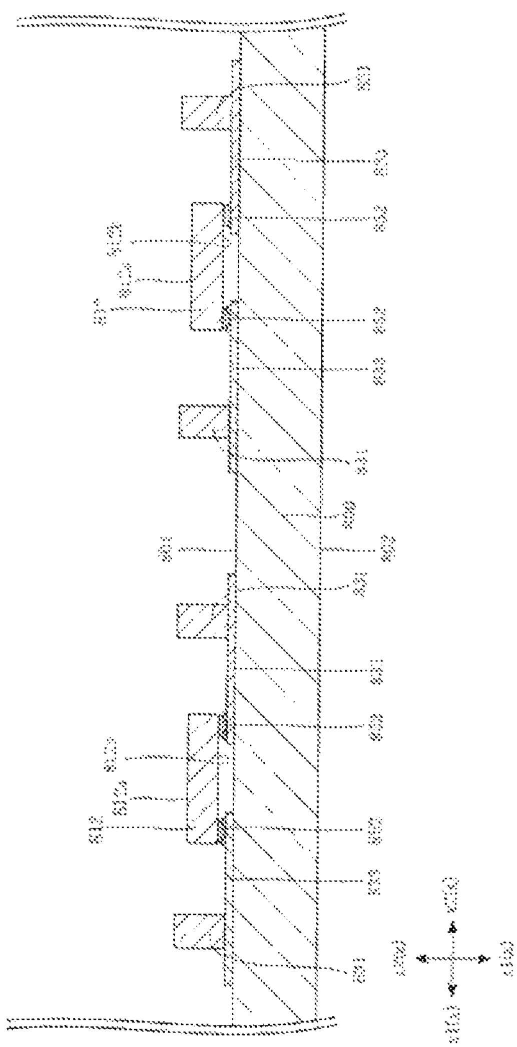
FIG. 27 is a cross-sectional view illustrative of a step of the manufacturing method of the electronic device according to the second embodiment of the present disclosure.
Figure 28:
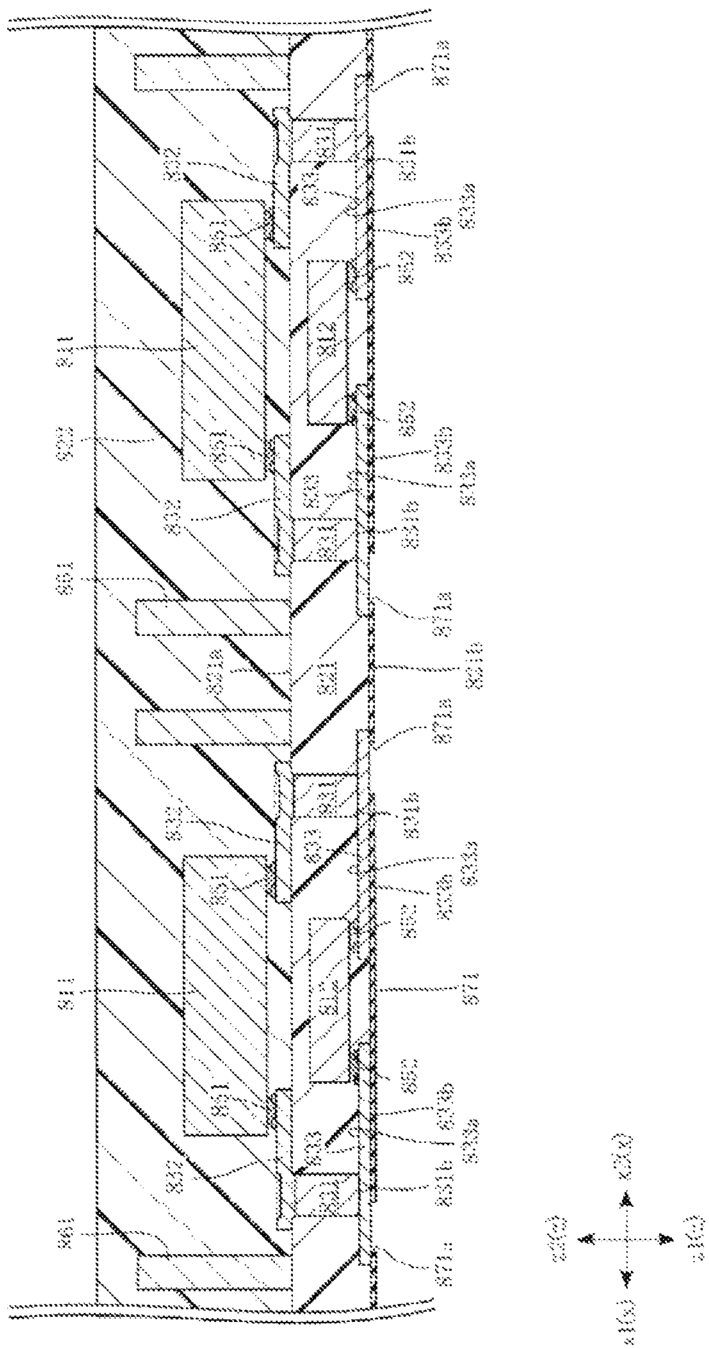
FIG. 28 is a cross-sectional view illustrative of a step of the manufacturing method of the electronic device according to the second embodiment of the present disclosure.
Figure 29:
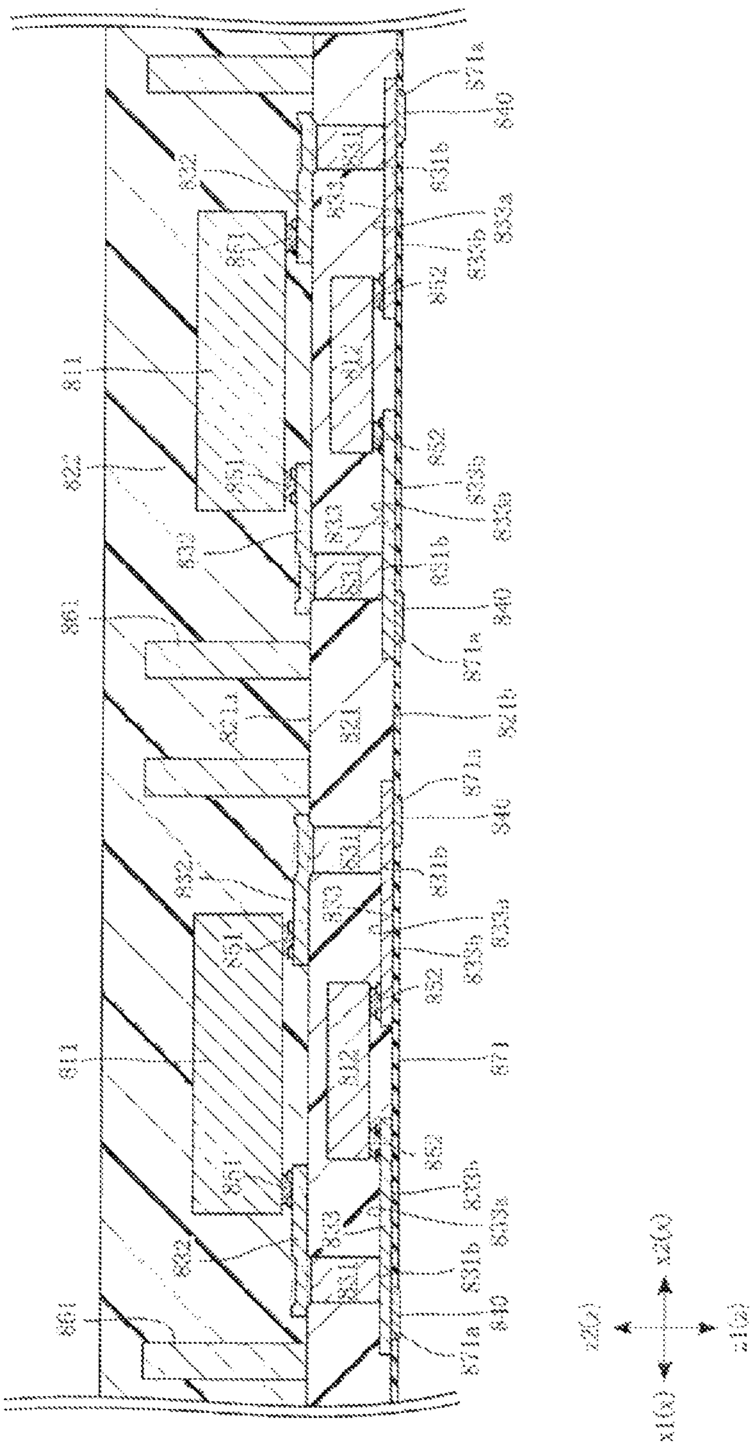
FIG. 29 is a cross-sectional view illustrative of a step of the manufacturing method of the electronic device according to the second embodiment of the present disclosure.

In the fifth step, as shown in FIG. 26, the useless basal layer 891*a* is removed. In this embodiment, the basal layer 891*a* not covered by the plated layer 891*b* is regarded as the useless basal layer 891*a* and thus removed. Both the removal of the useless basal layer 891*a* and the removal of the useless basal layer 890*a* are carried out by wet etching. Given the useless basal layer 891*a* removing step, as shown in FIG. 26, the wiring layers 833 are formed, using the plated layer 891*b* and the basal layer 891*a* covered by the plated layer 891*b*. As shown in FIG. 27~FIG. 29, the plated layer 891*b* and the basal layer 891*a* covered by the plated layer 891*b* are integrally expressed as the wiring layers 833, and the plated layer 891*c* is expressed as the columnar conductor 831.

As shown in FIG. 26, the wiring layers 833, the connecting portions 852, and the columnar conductors 831 are formed by the aforesaid five steps. In this embodiment, the step of forming the basal layer 891*a*, the step of forming the plated layer 891*c*, and the step of removing the useless basal layer 891*a* are combined to become a step combo equivalent to "a second wiring layer forming step" recited in the claims. The step of forming the basal layer 891*a*, the step of forming the plated layer 891*c*, and the step of removing the useless basal layer 891*a* are combined to become a step combo equivalent to "a first conductor forming step" recited in the claims.

Afterward, as shown in FIG. 27, the electronic component 812 is mounted. The electronic component 812 corresponds to the electronic component 12 of the electronic device A2. The electronic component 812 has a component main surface 812*a* facing direction z2 and a component inner surface 812*b* facing direction z1, with electrode pads (not shown) formed on the component inner surface 812*b*. A step of mounting the electronic component 812 (a second electronic component mounting step) is carried out by flip-chip bonding. After flux has been coated on the electronic component 812, for example, the electronic component 812 is temporarily mounted on the connecting portions 852 with a flip-chip bonder. At this point, the connecting portions 852 are formed between the wiring layers 833 and formed between electrode pads (not shown) on the component inner surface 812*b* of the electronic component 812. Afterward, the connecting layers 852*b* of the connecting portions 852 are melted by reflow soldering and thus coupled to the electrode pads. Then, the connecting layers 852*b* of the connecting portions 852 are cooled and solidified. Therefore, the electronic component 812 is mounted on the wiring layers 833 such that the wiring layers 833 and the electrode pads of the electronic component 812 are electrically connected by the connecting portions 852, respectively.

Afterward, like the manufacturing method of the electronic device A1, the manufacturing method of the electronic device A2 entails carrying out the first resin layer forming step, the first resin layer grinding step, the wiring layers 832 forming step, the connecting portions 851 forming step, the frame-shaped conductor 861 forming step, the first electronic component mounting step, the second resin layer forming step, and the supporting substrate removing step (see FIG. 6~FIG. 15). This embodiment dispenses with the columnar conductor forming step.

Afterward, as shown in FIG. 28, an external protective film 871 is formed. In a step of forming the external protective film 871 (an external protective film forming step), the polymeric resin which connects the wiring layer inner surface 833*b* and the first resin layer inner surface 821*b* is formed, except for a part (reserved for lateral formation of the external electrode 840) of the wiring layer inner surface 833*b*. In this embodiment, examples of the polymeric resin include polyimide resin and phenol-based resin. The external protective film 871 thus formed has an opening portion 871*a* which a part of each wiring layer inner surface 833*b* is exposed from.

Afterward, as shown in FIG. 29, the external electrode 840 is formed. Like the external electrode forming step in the first embodiment, the external electrode forming step in this embodiment requires electroless plating. A Ni layer, a Pd layer and a Au layer are sequentially laminated to part of each wiring layer inner surface 833*b* exposed from the opening portion 871*a* of the external protective film 871. Therefore, the external electrode 840 is of a structure formed by lamination of the Ni layer, Pd layer and Au layer.

Afterward, like the first embodiment, the second embodiment entails carrying out the second resin layer grinding step and the singulation step. Therefore, the electronic device A2 shown in FIG. 18~FIG. 21 is manufactured. The above description of the manufacturing method of the electronic device A2 merely serves exemplary purposes, and thus the present disclosure is not limited thereto. For example, when a connecting part, such as a solder bump, is formed on electrode pads of the electronic component 812, the connecting layers 852*b* of the connecting portions 852 are formed without carrying out the step of forming the connecting layers 852*b*.

The effect and advantage of the electronic device A2 and the manufacturing method of the electronic device A2 according to the second embodiment are described below.

Like the electronic device A1, the electronic device A2 comprises the first resin layer 21 and the second resin layer 22. The first resin layer 21 spaces apart the wiring layers 32 to underpin the electronic component 11. The second resin layer 22 is formed on the first resin layer 21 and covers the electronic component 11. Therefore, like the first embodiment, the second embodiment is effective in reducing the difference in thermal expansion coefficient between the supporting part (first resin layer 21) and the protective part (second resin layer 22). Therefore, like the first embodiment, the second embodiment is effective in reducing the thermal stress on the interface between the supporting part and the protective part, and thus the protective part is less likely to be stripped away from the supporting part, Therefore, the reliability of the electronic device A2 is enhanced.

If the electronic devices A1, A2 have an identical or similar technical feature in common, the technical feature will have the same effect on the electronic devices A1, A2.

The electronic device A2 comprises a plurality of electronic components 11, 12. The electronic components 11 are covered by the second resin layer 22, and the electronic components 12 are covered by the first resin layer 21. The first resin layer 21 is laminated to the second resin layer 22 in direction z. Therefore, the electronic components 11 and the electronic components 12 become structures capable of polyphasic mounting in direction z. Therefore, the electronic components 11, 12 overlap in direction z, and thus the electronic device A2 looks smaller when viewed from above. The formation of the electronic components 11, 12 involves forming the first resin layer 21 and second resin layer 22 in a polyphasic manner. None of the electronic components 11, 12 includes a semiconductor substrate, and thus the processing of a semiconductor substrate is not required, thereby rendering polyphasic formation of the electronic components 11, 12 easy.

Figure 30:
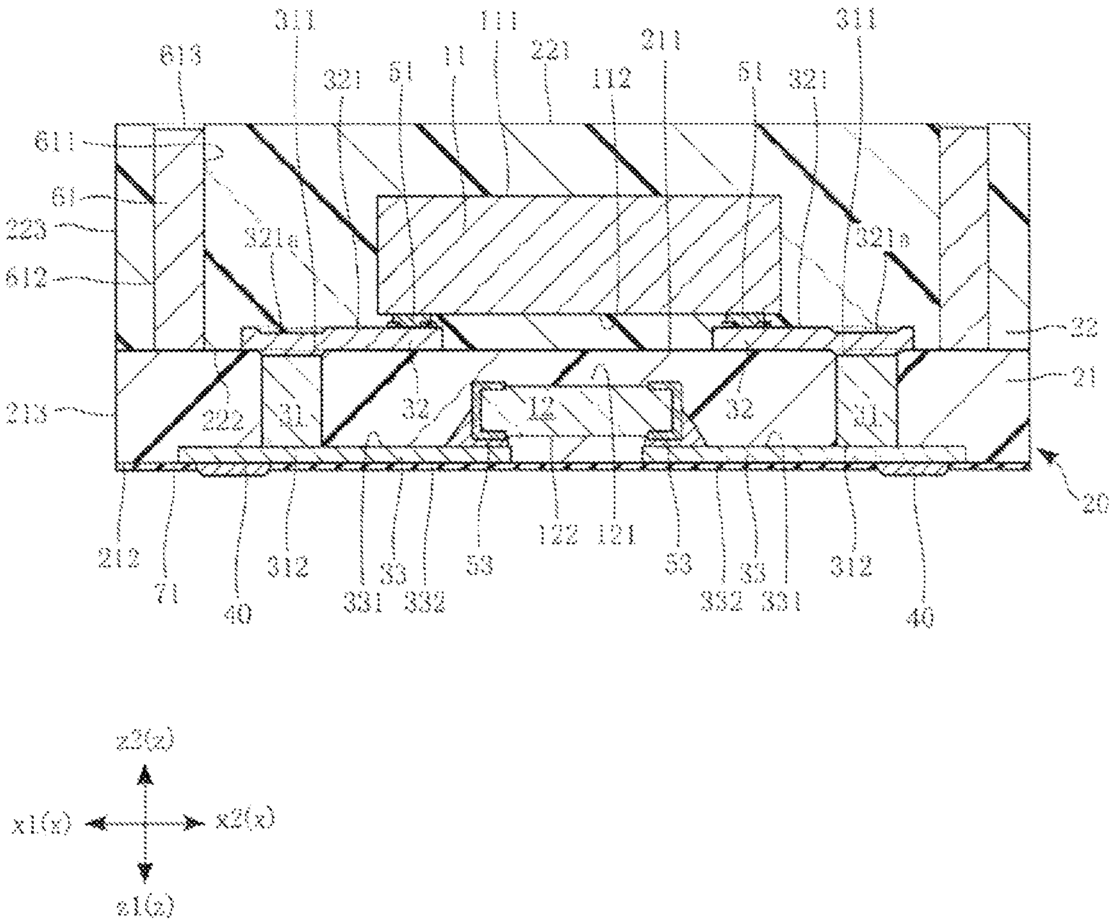
FIG. 30 is a cross-sectional view of the electronic device according to a variant example of the second embodiment of the present disclosure.

The second embodiment is not restrictive of the structure of the electronic component 12. FIG. 30 shows the electronic device with the electronic component 12 of a variant structure. FIG. 30 is a cross-sectional view of the electronic device according to this variant embodiment and corresponds to the cross-sectional view of FIG. 20. As shown in FIG. 30, in this variant embodiment, electrodes are formed at two ends of the electronic component 12 in direction x. Examples of the electronic component 12 of the aforesaid structure include a chip capacitor and a chip resistor. As shown in FIG. 30, the electronic component 12 is joined to the wiring layers 833 by the connecting portions 53. The connecting portions 53 are conductive connecting elements in the form of solder paste or silver solder paste. Fillets are formed at the connecting portions 53.

Third Embodiment

Figure 31:
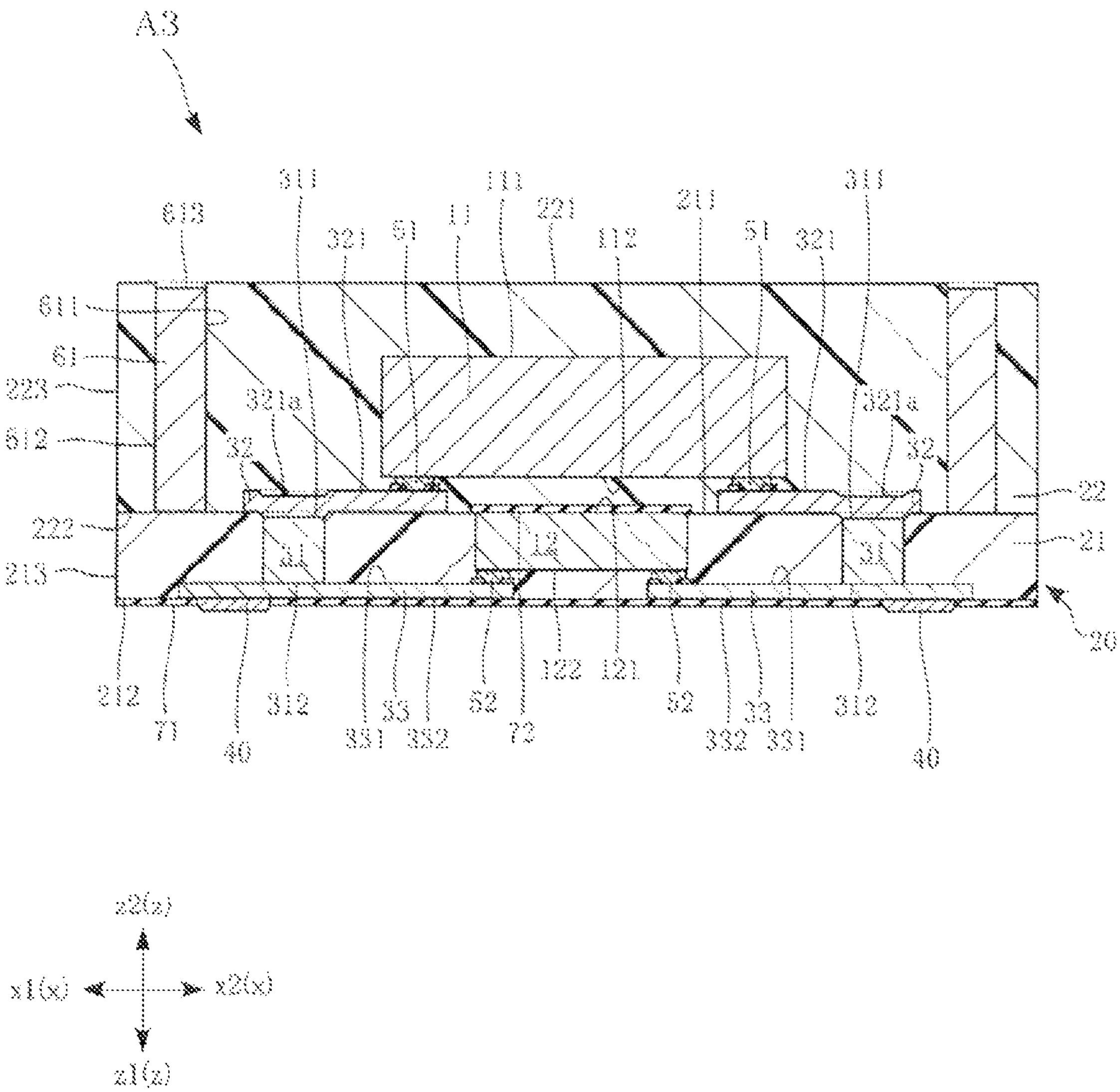
FIG. 31 is a cross-sectional view of the electronic device according to the third embodiment of the present disclosure.

FIG. 31 illustrates an electronic device according to the third embodiment of the present disclosure. The main feature which distinguishes an electronic device A3 of the third embodiment from the electronic device A2 is that the component main surface 121 is exposed from the first resin layer 21.

FIG. 31 is a cross-sectional view of the electronic device A3 and corresponds to the cross-sectional view of the electronic device A2 shown in FIG. 20.

Regarding the electronic device A3, the component main surface 121 of the electronic component 12 is exposed from the first resin layer main surface 211 of the first resin layer 21. In this embodiment, the component main surface 121 and the first resin layer main surface 211 are coplanar. To allow the component main surface 121 to be exposed from the first resin layer main surface 211, for example, the first resin layer grinding step involves grinding the first resin layer 821 until the component main surface 812*a* of the electronic component 812 is exposed.

The component protective film 72 is insulative film. The component protective film 72 covers the component main surface 121 of the electronic component 12. When viewed from above, the component protective film 72 overlaps the electronic component 12. Both the component protective film 72 and the external protective film 71 are made of polymeric resin. The above description is not restrictive of the material which the component protective film 72 is made of. The formation of the component protective film 72, for example, occurs after the first resin layer grinding step but before the step of forming the basal layer 891*a*. This timing merely serves exemplary purposes and thus is not restrictive of the formation of the component protective film 72. In this embodiment, the electronic device A3 comprises the component protective film 72; however, in a variant embodiment, the electronic device A3 does not include the component protective film 72.

The effect and advantage of the electronic device A3 and the manufacturing method of the electronic device A3 according to the third embodiment are described below.

Like the electronic device A1, the electronic device A3 comprises the first resin layer 21 and the second resin layer 22. The first resin layer 21 spaces apart the wiring layers 32 to underpin the electronic component 11. The second resin layer 22 is formed on the first resin layer 21 and covers the electronic component 11. Therefore, like the first embodiment, the third embodiment is effective in reducing the difference in thermal expansion coefficient between the supporting part (first resin layer 21) and the protective part (second resin layer 22). Therefore, like the first embodiment, the third embodiment is effective in reducing the thermal stress on the interface between the supporting part and the protective part, and thus the protective part is less likely to be stripped away from the supporting part, Therefore, the reliability of the electronic device A3 is enhanced.

The electronic device A3 can have a structural feature identical or similar to that of the electronic devices A1, A2 to bring about an effect which the electronic device A3 and the electronic device A1, A2 have in common.

Regarding the electronic device A3, in the first resin layer grinding step, the first resin layer 821 is ground until the component main surface 812*a* of the electronic component 812 is exposed. Given the structural feature, the direction-z dimension of the electronic device A3 decreases. Therefore, the electronic device A3 is downsized.

The electronic device A3 comprises a component protective film 72 for covering the component main surface 121 of the electronic component 12. In the electronic device A3, the component main surface 121 of the electronic component 12 is exposed from the first resin layer 21, and thus a conductor is likely to be inadvertently formed on the component main surface 121 during the manufacturing process of the electronic device A3. Therefore, inadvertent short circuits are likely to occur to the electronic component 12. With the component protective film 72 being formed, the whole surface of the electronic component 12 is covered by the first resin layer 21 and component protective film 72, inadvertent short circuits are less likely to occur to the electronic component 12. Therefore, reliability of the electronic device A3 is enhanced.

Other variant embodiments of the electronic device of the present disclosure are described below. The variant embodiments described below can be appropriately combined.

Figure 32:
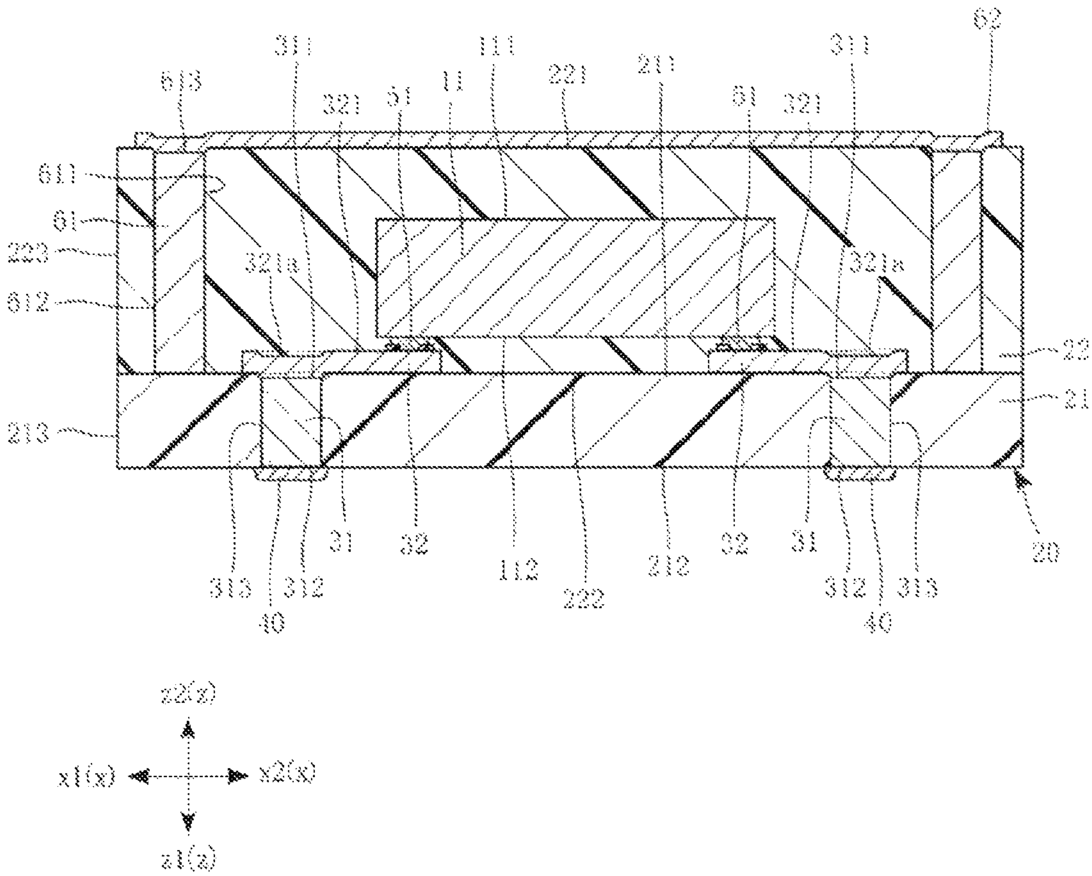
FIG. 32 is a cross-sectional view of the electronic device according to a variant embodiment of the present disclosure.

Regarding the electronic device of the present disclosure, a metal film can be formed on the second resin layer main surface 221 of the second resin layer 22. FIG. 32 shows that the electronic device A1 in the first embodiment comprises the metal film (metal film 62). FIG. 32 is a cross-sectional view of the electronic device in the variant embodiment and corresponds to the cross-sectional view of FIG. 3. The metal film 62 is, for example, formed by sequential lamination of a Ti layer, a Cu layer and a stainless steel layer. The metal film 62 is, for example, formed by sputtering. The above description is not restrictive of what material the metal film 62 is made of and how the metal film 62 is formed. The metal film 62 is in contact with the top surface 613 of the frame-shaped conductor 61. Therefore, in the presence of the metal film 62, the electronic component 11 is fully covered, and thus interference electromagnetic waves from the outside can be blocked. The electronic devices A2, A3 each comprise the metal film 62.

Figure 33:
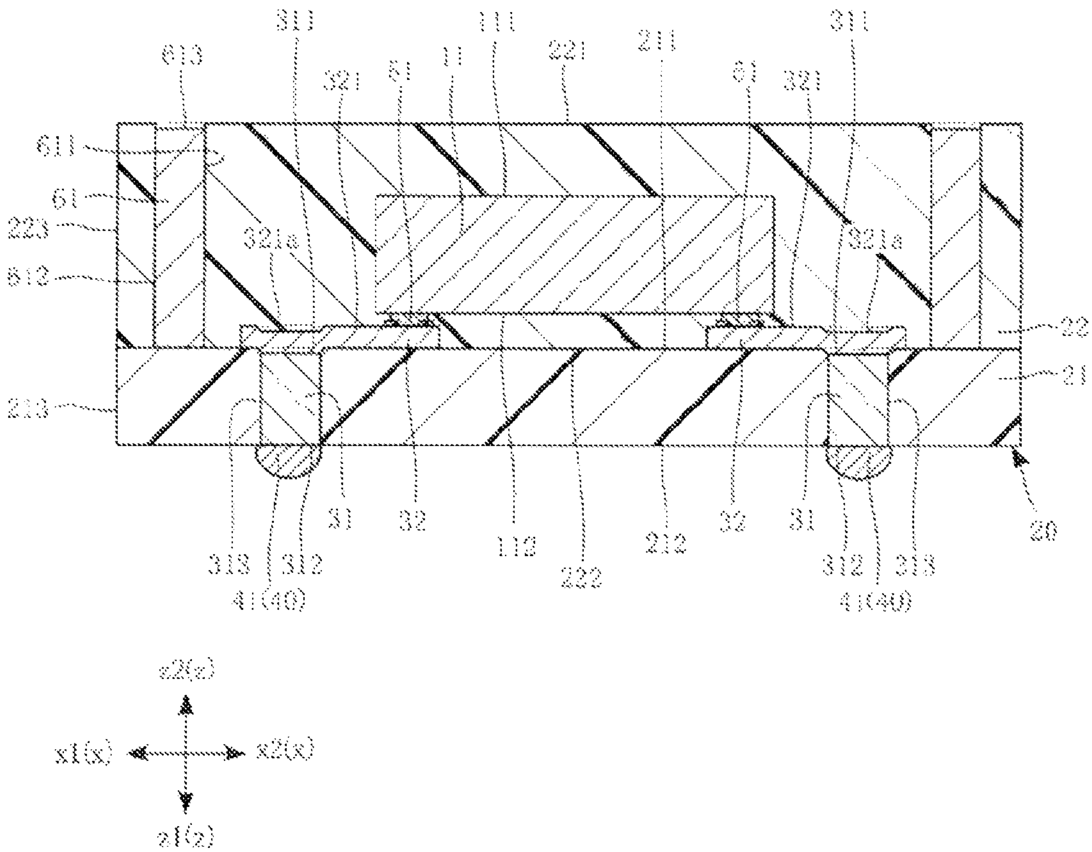
FIG. 33 is a cross-sectional view of the electronic device according to a variant embodiment of the present disclosure.

Regarding the electronic device of the present disclosure, the first, second and third embodiments are not restrictive of the structure of each external electrode 40. For example, each external electrode 40 can also be a ball-shaped solder bump (solder ball). FIG. 33 shows that, in the electronic device A1 of the first embodiment, the external electrodes 40 are solder balls. FIG. 33 is a cross-sectional view of the electronic device according to the variant embodiment and corresponds to the cross-sectional view of FIG. 3. In the electronic devices A2, A3, the external electrodes 40 are also solder balls.

Figure 34:
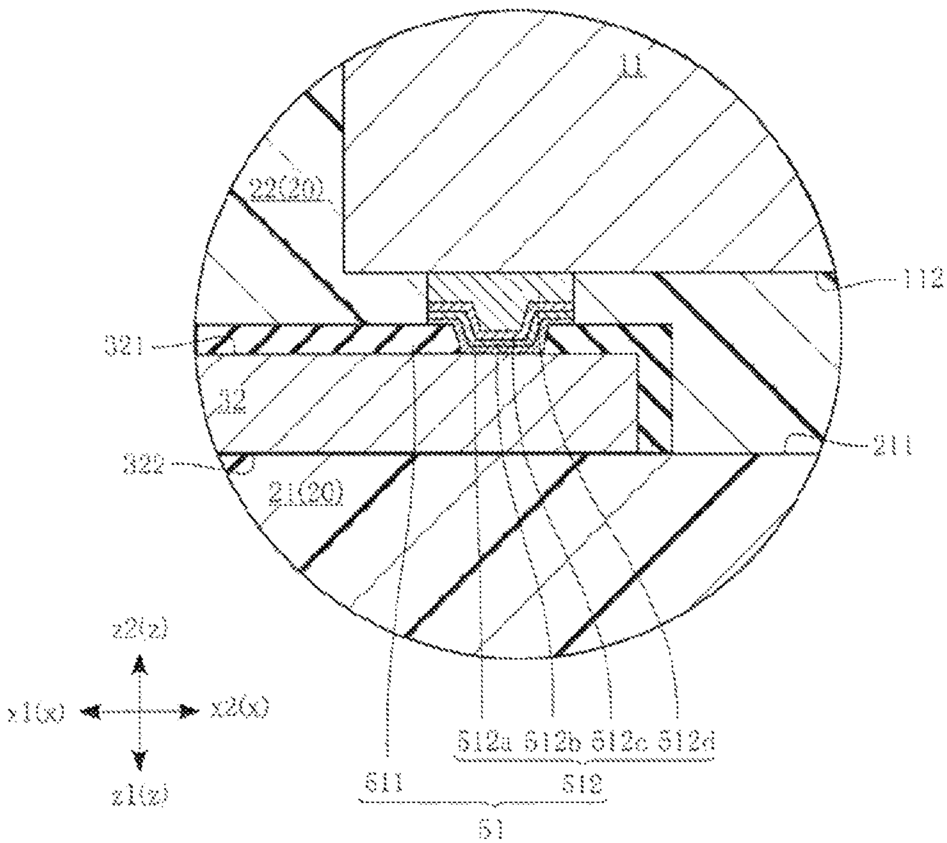
FIG. 34 is a partial enlarged cross-sectional view of the electronic device according to a variant embodiment of the present disclosure.
Figure 35:
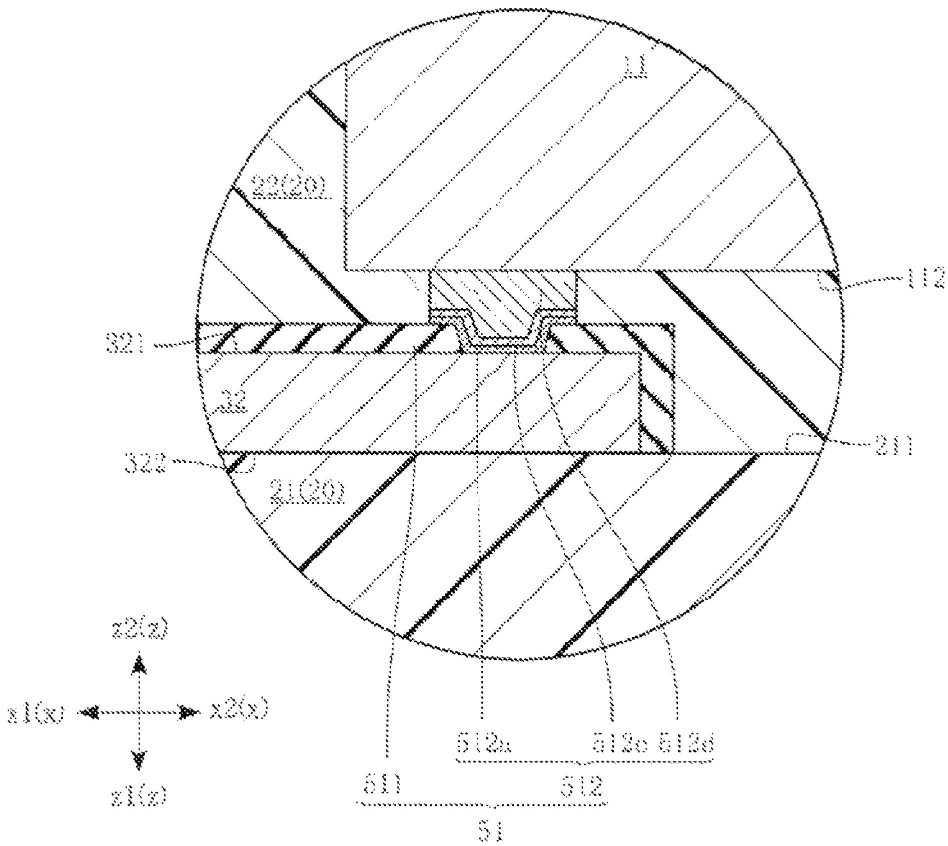
FIG. 35 is a partial enlarged cross-sectional view of the electronic device according to a variant embodiment of the present disclosure.
Figure 36:
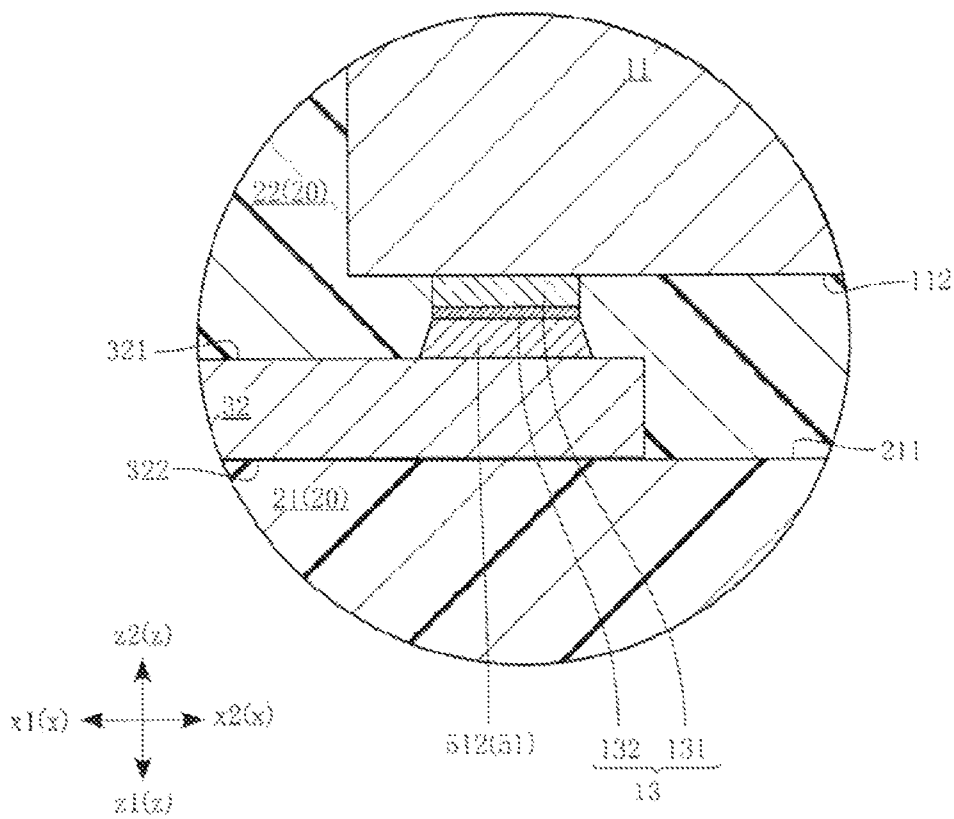
FIG. 36 is a partial enlarged cross-sectional view of the electronic device according to a variant embodiment of the present disclosure.

Regarding the electronic device of the present disclosure, the first, second and third embodiments are not restrictive of the structure of each connecting portion 51. FIG. 34~FIG. 36 shows different structures of the connecting portions 51 of the electronic device A1 according to the first embodiment. FIG. 34~FIG. 36 are partial enlarged cross-sectional views of the electronic device according to their respective variant embodiments and correspond to the partial enlarged cross-sectional view of FIG. 4. The connecting portions are not only found in the electronic device A1 but also found in the electronic devices A2, A3. The connecting portions 52 illustrated by the second embodiment and the third embodiment can also be of the same structure as the connecting portions 51 shown in FIG. 34~FIG. 36, respectively.

Referring to FIG. 34, the insulating layer 511 of the connecting portion 51 is, for example, flux which covers the wiring layers 32. A part of the insulating layer 511 above each wiring layer 32 is opened. The open part of the insulating layer 511 is filled with a part of the connecting layer 512. As shown in FIG. 34, the connecting layer 512 comprises a first layer 512*a*, a second layer 512*b*, a third layer 512*c* and a fourth layer 512*d* which are laminated to each other. The first layer 512*a* comprises a Ti layer and a Cu layer which are laminated to each other. The Ti layer is in contact with the wiring layers 32. The first layer 512*a* is, for example, formed by sputtering. The second layer 512*b* is made of Cu-containing metal. The third layer 512*c* is made of Ni-containing metal. The fourth layer 512*d* is, for example, made of Sn-containing metal. Examples of the alloy include Sn—Sb based alloy and Sn—Ag based alloy which are typical of lead-free solder. The second layer 512*b*, the third layer 512*c* and the fourth layer 512*d* are, for example, formed by electroplating, respectively.

Referring to FIG. 35, the connecting layer 512 of the connecting portion 51 comprises a first layer 512*a*, a third layer 512*c* and a fourth layer 512*d*. Hence, unlike FIG. 34, FIG. 35 shows that the connecting layer 512 of the connecting portion 51 does not include the second layer 512*b*. The insulating layer 511 shown in FIG. 35 is of the same structure as its counterpart in FIG. 34.

The connecting portion 51 shown in FIG. 36 does not include insulating layer 511 but includes the connecting layer 512. The connecting layer 512 is made of metal, such as Sn. The alloy is, for example, Sn—Sb based alloy or Sn—Ag based alloy which is typical of lead-free solder. FIG. 36 shows the electrode pad 13 of the electronic component 11. The electrode pad 13 comprises a first layer 131 and a second layer 132 which are laminated to each other. The first layer 131 is a metal layer which contains Cu, for example. The second layer 132 is a metal layer which contains Ni, for example. In a variant embodiment illustrated by FIG. 36, the connecting portion 51 includes the insulating layer 511.

Figure 37:
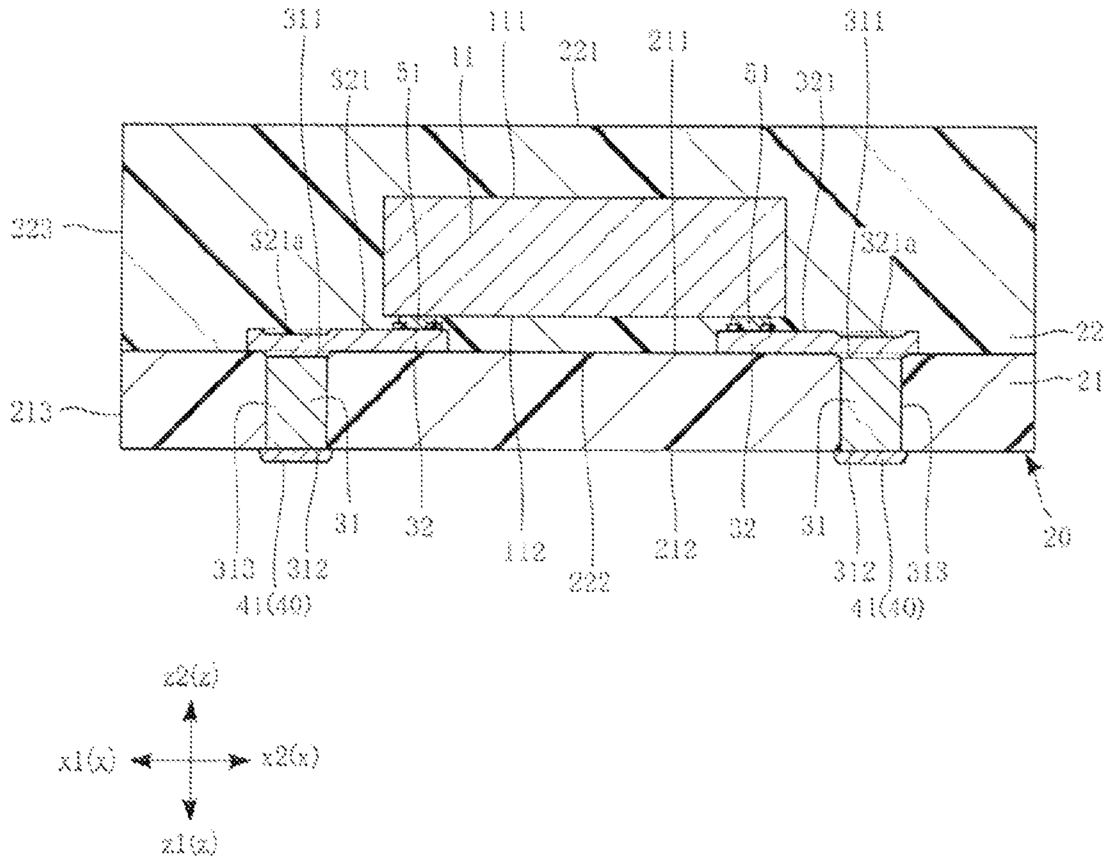
FIG. 37 is a cross-sectional view of the electronic device according to a variant embodiment of the present disclosure.

It is also feasible that the electronic device of the present disclosure dispenses with the frame-shaped conductor 61. FIG. 37 shows the electronic device according to this variant embodiment. FIG. 37 is a cross-sectional view of the electronic device according to this variant embodiment and corresponds to the cross-sectional view of FIG. 3. FIG. 37 shows that the electronic device A1 in the first embodiment dispenses with the frame-shaped conductor 61, and the electronic devices A2, A3 can also be of this same structure as the electronic device A1.

Figure 38:
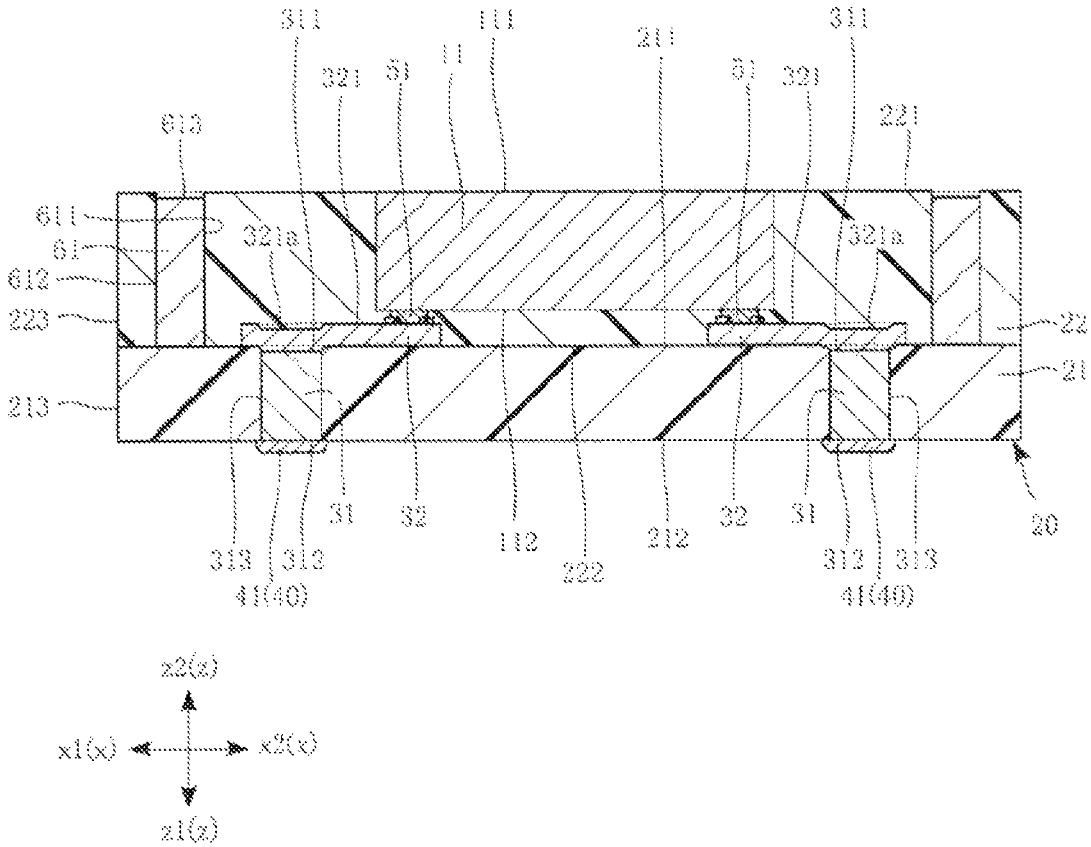
FIG. 38 is a cross-sectional view of the electronic device according to a variant embodiment of the present disclosure.

Regarding the electronic device of the present disclosure, the component main surface 111 of the electronic component 11 is exposed from the second resin layer main surface 221 of the second resin layer 22. FIG. 38 shows the electronic device in this variant embodiment. FIG. 38 is a cross-sectional view of the electronic device in this variant embodiment, and it corresponds to the cross section shown in FIG. 3. FIG. 38 shows that, in the electronic device A1 of the first embodiment, the component main surface 111 is exposed from the second resin layer main surface 221; this feature also occurs to the electronic devices A2, A3. For example, in the second resin layer grinding step, the second resin layer 822 is ground until the component main surface 811*a* of the electronic component 811 is exposed. In this variant embodiment, the component main surface 111 of the electronic component 11 is exposed from the electronic device, and thus a protective film for covering the component main surface 111 is formed in advance. In this variant embodiment, the second resin layer 22 is ground until the component main surface 111 of the electronic component 11 is exposed, and thus the thickness (in direction z) of the second resin layer 22 is reduced. With its thickness (in direction z) being reduced, the electronic device is downsized. Furthermore, the electronic component 11 can dissipate heat better, because the component main surface 111 of the electronic component 11 is exposed from the second resin layer 22.

Figure 39:
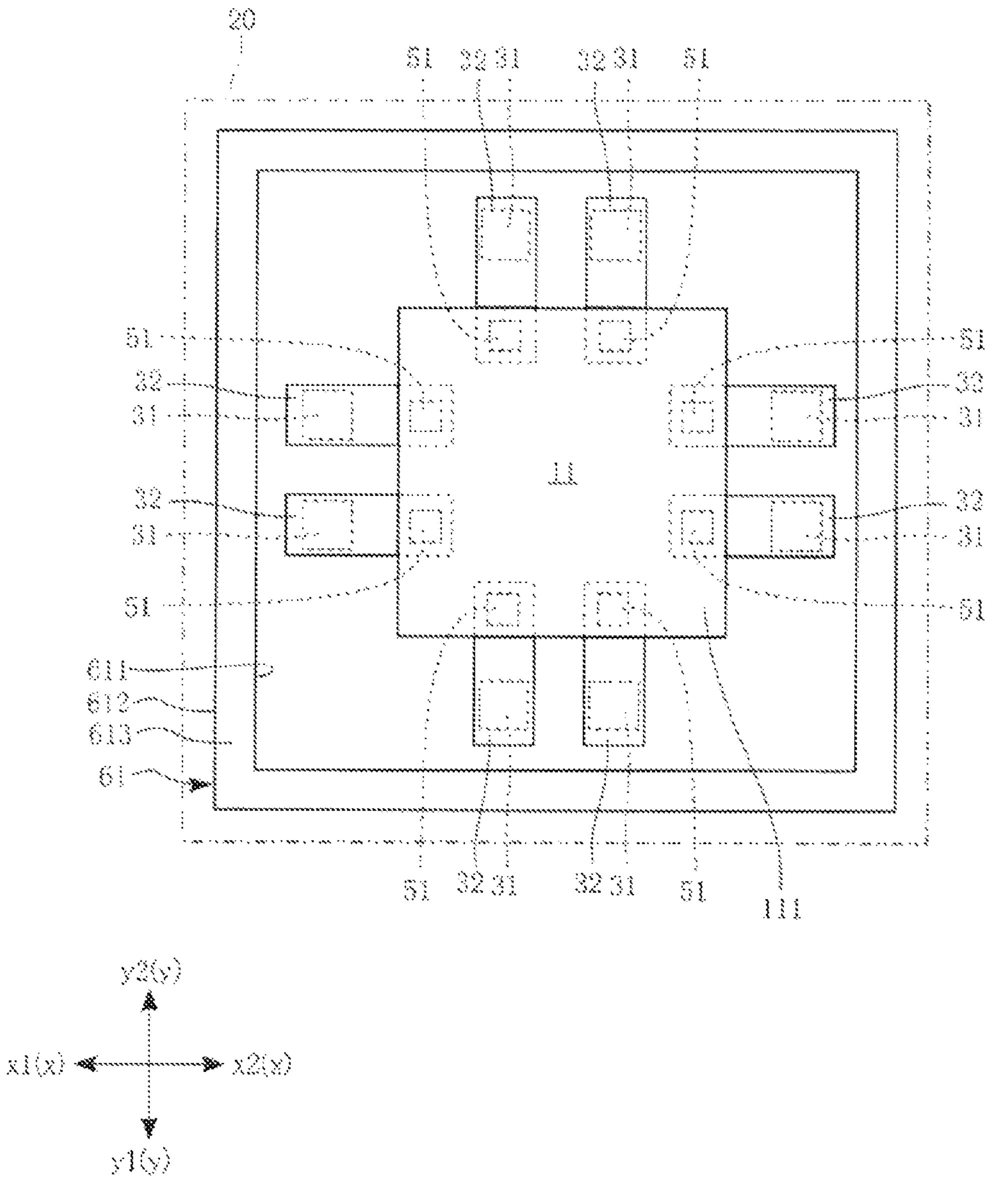
FIG. 39 is a top view of the electronic device according to a variant embodiment of the present disclosure.
Figure 40:
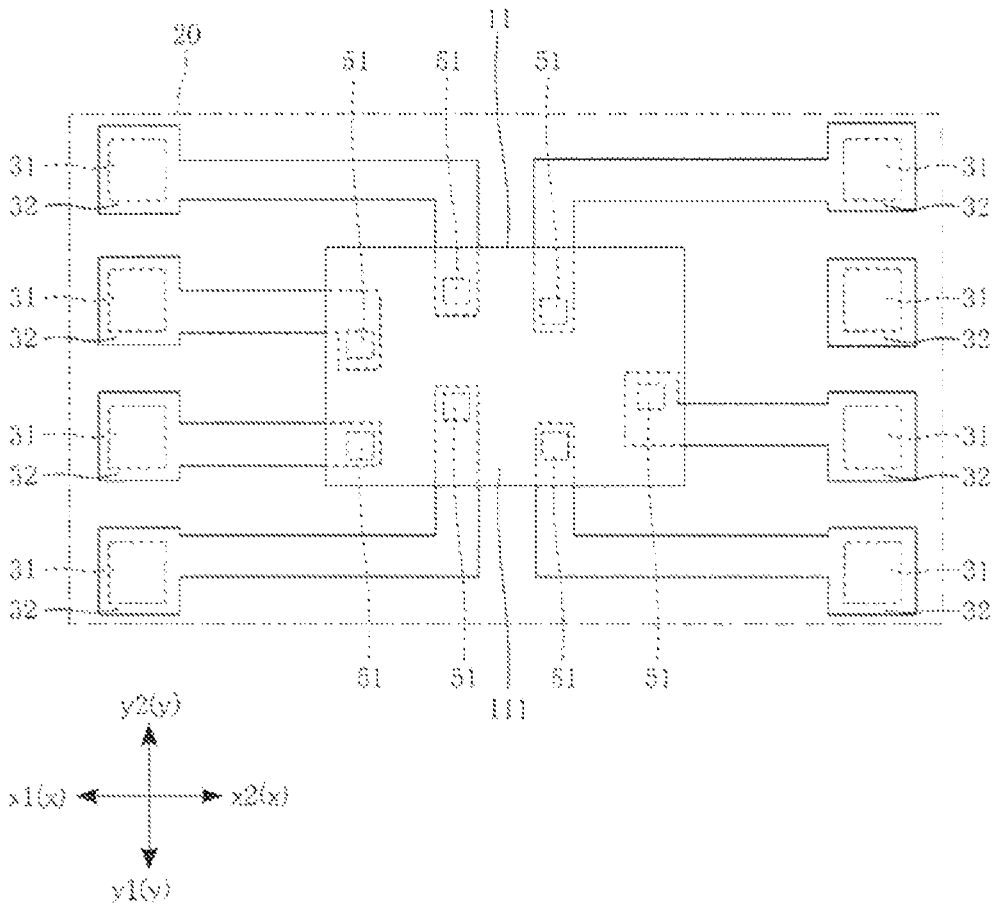
FIG. 40 is a top view of the electronic device according to a variant embodiment of the present disclosure.

Regarding the electronic device of the present disclosure, the first, second and third embodiments are not restrictive of the size of the wiring layers 32. For example, the size of the wiring layers 32 is subject to changes according to the quantity and position of electrode pads formed on the component inner surface 112 of the electronic component 11 and the quantity and position of terminals (external electrodes 40) of the electronic device. FIG. 39 and FIG. 40 show that the size of the wiring layers 32 of the electronic device A1 in the first embodiment differs. FIG. 39 and FIG. 40 are top views of the electronic device in this variant embodiment and merely serve exemplary purposes. As shown in FIG. 39 and FIG. 40, the electronic component 11 has eight electrode pads, the size of the wiring layers 32 is subject to changes according to the quantity of the electrode pads. Likewise, the size of the wiring layers 32 of the electronic devices A2, A3 is subject to changes.

Regarding the electronic device of the present disclosure, the second and third embodiments are not restrictive of the size of the wiring layers 33. The size of the wiring layers 33 and the size of the wiring layers 32 is subject to changes, for example, according to the quantity and position of the electrode pads of the electronic component 11, the quantity and position of the electrode pads of the electronic component 12, an electrical connection path of the electronic component 11 and the electronic component 12, and the quantity and position of terminals (external electrodes 40) of the electronic device.

Figure 41:
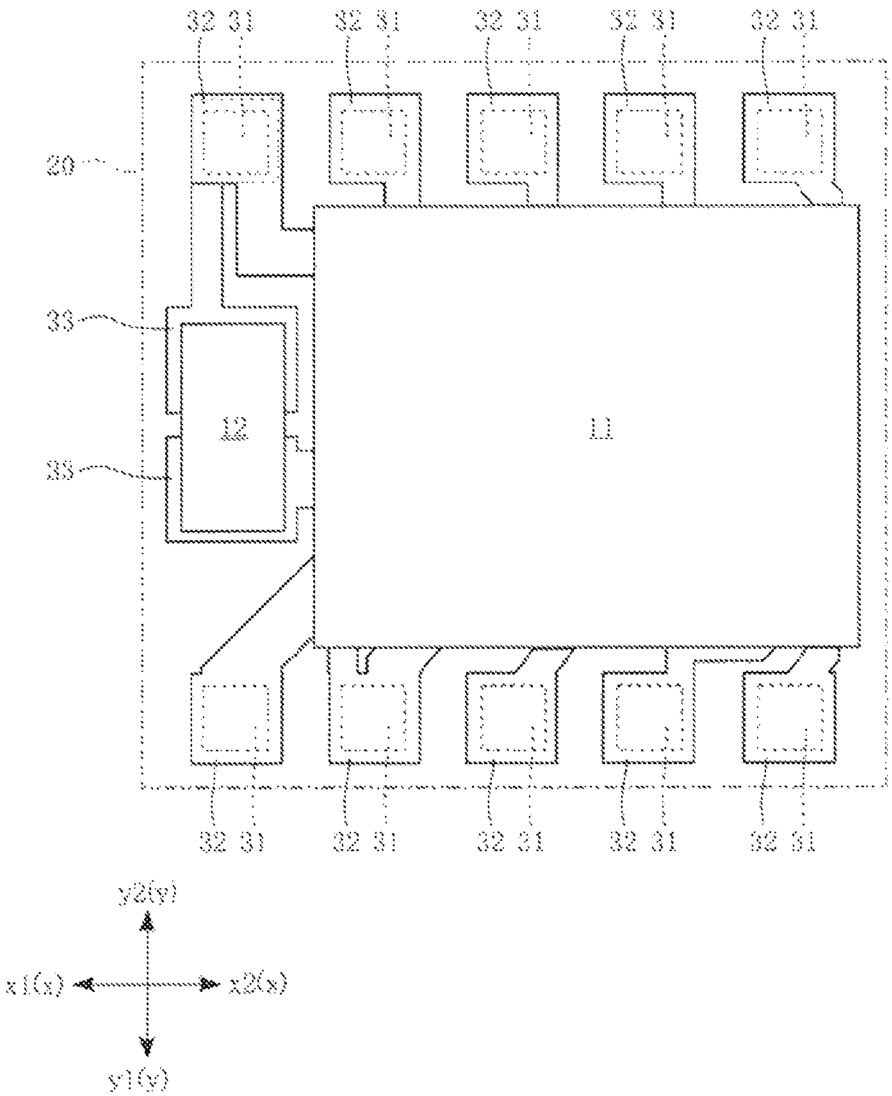
FIG. 41 is a top view of the electronic device according to a variant embodiment of the present disclosure.

Regarding the electronic device of the present disclosure, in a variant embodiment, the electronic component 11 does not overlap the electronic component 12 when viewed from above. FIG. 41 shows the electronic devices in the variant embodiment. FIG. 41 is a top view of the electronic device and depicts the hermetic seal resin 20 with an imaginary line. Referring to FIG. 41, as mentioned above, when viewed from above, the electronic component 11 does not overlap the electronic component 12, but the electronic components 11, 12 are aligned in direction x. Referring to FIG. 41, when viewed from above, the electronic components 11, 12 either overlap or do not overlap.

Figure 42:
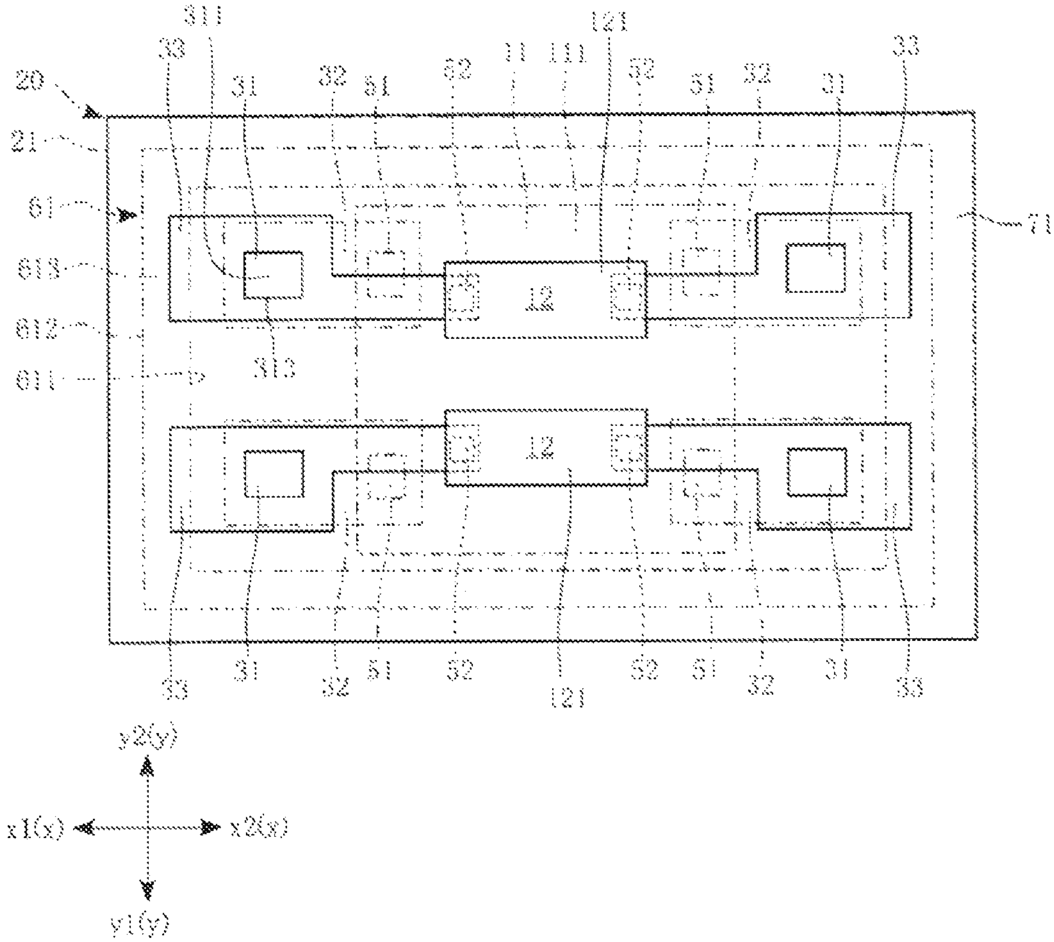
FIG. 42 is a top view of the electronic device according to a variant embodiment of the present disclosure.

Regarding the electronic device of the present disclosure, the present disclosure is not restrictive of the quantity of the electronic components 11 and the quantity of the electronic components 12. FIG. 42 shows the electronic devices in the variant embodiment. FIG. 42 is a top view of the electronic device and corresponds to FIG. 19 according to the second embodiment. Referring to FIG. 42, the electronic components 12 are in the number of two and are joined to the wiring layers 33, respectively. FIG. 42 shows two electronic components 12, but more than two electronic components 12 can be provided. The electronic components 11 can also be in the number of at least two.

Figure 43:
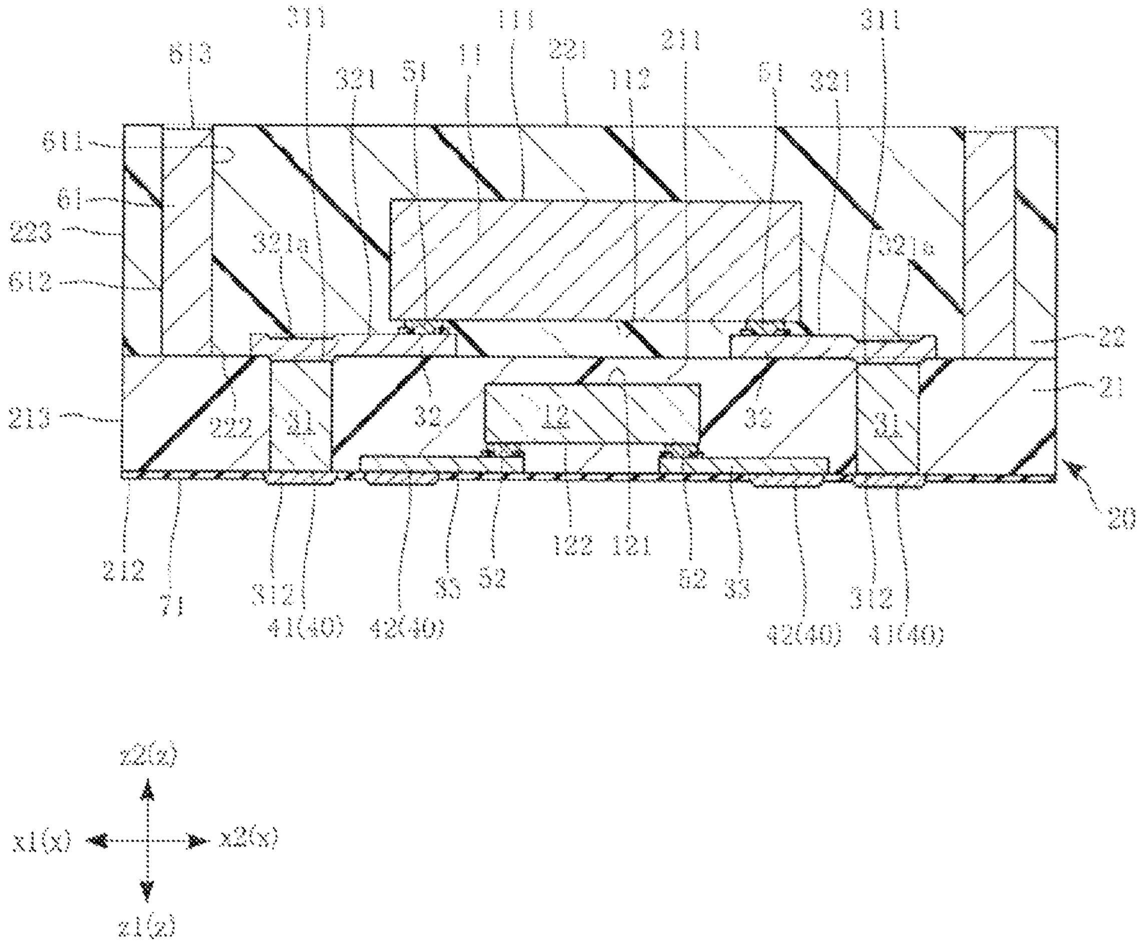
FIG. 43 is a cross-sectional view of the electronic device according to a variant embodiment of the present disclosure.
Figure 44:
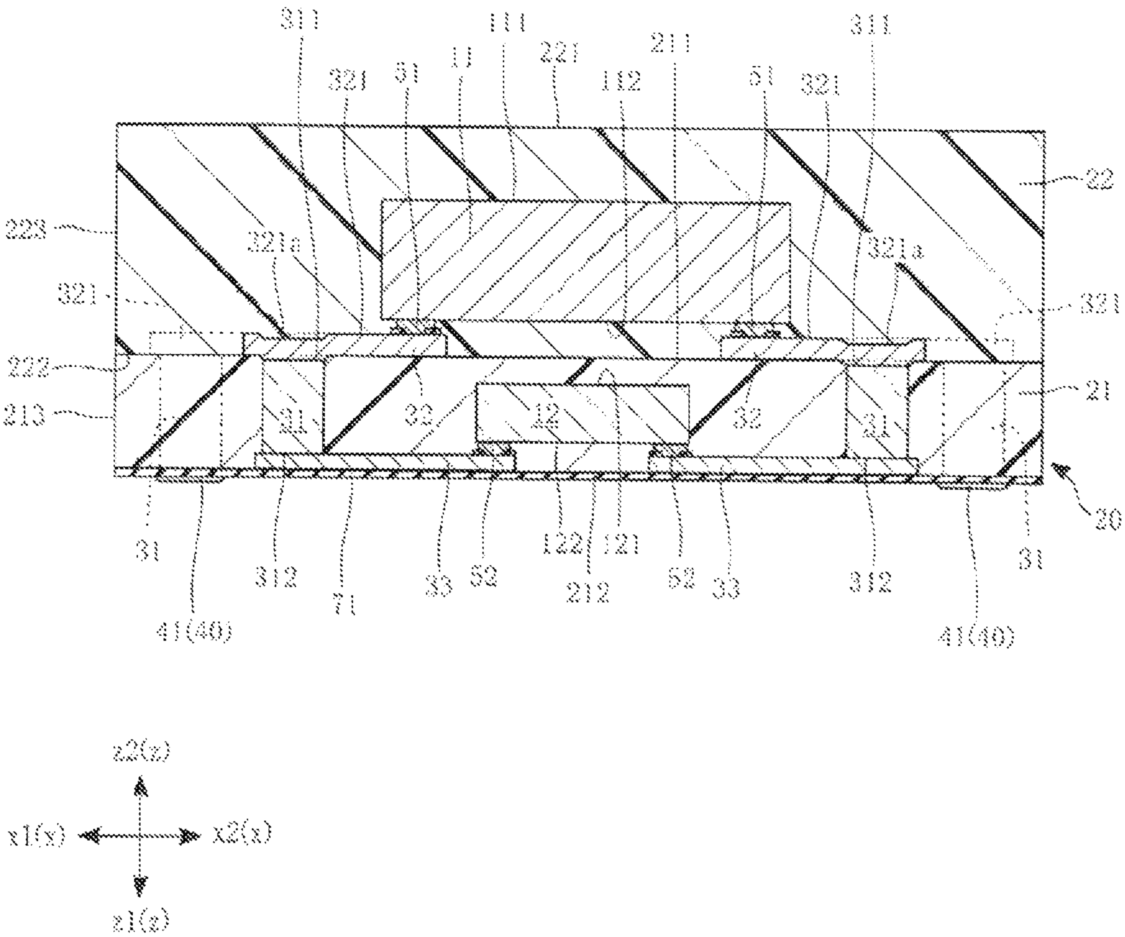
FIG. 44 is a cross-sectional view of the electronic device according to a variant embodiment of the present disclosure.

Regarding the electronic device of the present disclosure, the first, second and third embodiments are not restrictive of the structure of the external electrode 40. FIG. 43 shows that the external electrode 40 comprises columnar conductor covering portions 41 and wiring layer covering portions 42. FIG. 44 shows that, in the electronic device A2 of the second embodiment, the external electrode 40 does not include the wiring layer covering portions 42 but comprises the columnar conductor covering portions 41. FIG. 43 and FIG. 44 are cross-sectional views of the electronic device according to this variant embodiment and correspond to the cross-sectional view of FIG. 20. Referring to FIG. 43, the columnar conductors 31 are not formed on the wiring layers 33, whereas the electronic component 11 and the electronic component 12 are not electrically connected inside the electronic device. The electronic component 11 is electrically connected to the columnar conductor covering portions 41 (external electrode 40) by the connecting portions 51, the wiring layers 32 and the columnar conductors 31. The electronic component 12 is electrically connected to the wiring layer covering portions 42 (external electrode 40) by the connecting portions 52 and the wiring layers 33. Therefore, in the electronic device shown in FIG. 43, the columnar conductor covering portions 41 are terminals electrically connected to the electronic component 11, and the wiring layer covering portions 42 are terminals electrically connected to the electronic component 12. Referring to FIG. 44, the first columnar conductor 31 penetrates in direction z from the first resin layer main surface 211 of the first resin layer 21 to the first resin layer inner surface 212, and the second columnar conductor 31 is formed on the wiring layers 33. The electronic component 11 is electrically connected to the columnar conductor covering portions 41 (external electrode 40) by the connecting portions 51, wiring layers 32 and first columnar conductor 31. The electronic component 12 is electrically connected to the columnar conductor covering portions 41 (external electrode 40) by the connecting portions 52, wiring layers 33, second columnar conductor 31, wiring layers 32 and first columnar conductor 31. Therefore, in the electronic device shown in FIG. 44, the wiring layer covering portions 42 (external electrode 40) are each a terminal electrically connected to the electronic component 11 and the electronic component 12.

Regarding the electronic device of the present disclosure, the structure of the hermetic seal resin 20 is not restricted to the first, second and third embodiments, and thus the hermetic seal resin 20 can be formed by laminating the first resin layer 21, the second resin layer 22, and at least one resin layer to each other. Under the aforesaid condition, each resin layer has a conductor penetrating the resin layer, an electronic component covered by the resin layer, and wiring layers electrically connected to the electronic component, so as to achieve a mounting structure for mounting in more phases than the electronic devices A2, A3.

The aforesaid embodiment is not restrictive of the electronic device and the manufacturing method of the electronic device. The structural features of constituent elements of the electronic device of the present disclosure and specific process flows of the steps of the manufacturing method of the electronic device according to the present disclosure are subject to changes.

The electronic device of the present disclosure and the manufacturing method of the electronic device according to the present disclosure are illustrated by embodiments related to remarks as follows:

[Remark 1]

An electronic device, comprising:

- a first resin layer, having a first resin layer main surface and a first resin layer inner surface, the first resin layer main surface and the first resin layer inner surface face opposite sides in a first direction;
- a first conductor, having a first conductor main surface and a first conductor inner surface, the first conductor main surface and the first conductor inner surface face opposite sides in the first direction, and the first conductor penetrates the first resin layer in the first direction;
- a a first wiring layer, straddling the first resin layer main surface and the first conductor main surface;
- a first electronic component, in the first direction having a first component main surface facing the same side as the first resin layer main surface and a first component inner surface facing the same side as the first resin layer inner surface, and electrically connected with the first wiring layer;
- a second resin layer, having a second resin layer main surface facing the same direction as the first resin layer main surface and a second resin layer inner surface being in contact with the first resin layer main surface, and covering the first wiring layer and the first electronic component; and
- an external electrode, disposed closer to the side where the first resin layer inner surface faces than the first resin layer and electrically connected to the first conductor.

[Remark 2]

Regarding the electronic device described in remark 1, a grinding mark is formed on the first resin layer main surface.

[Remark 3]

Regarding the electronic device described in remark 2, the first conductor main surface dents relative to the first resin layer main surface.

[Remark 4]

The electronic device described in any one of remark 1 through remark 3 further comprises a second wiring layer, having a second wiring layer main surface and a second wiring layer inner surface, the second wiring layer main surface and the second wiring layer inner surface face opposite sides in the first direction, and the second wiring layer inner surface being exposed from the first resin layer inner surface.

[Remark 5]

The electronic device described in remark 4 further comprises a second electronic component different from the first electronic component and electrically connected to the second wiring layers, wherein at least a part of the second electronic component is covered by the first resin layer.

[Remark 6]

Regarding the electronic device described in remark 5, the second electronic component has a second component main surface facing the same direction as the first component main surface, and the second component main surface and the first resin layer main surface are coplanar.

[Remark 7]

Regarding the electronic device described in any one of remark 1 through remark 6, the external electrode comprises a first conductor covering portion for covering the first conductor inner surface.

[Remark 8]

Regarding the electronic device described in any one of remark 4 through remark 6, the external electrode comprises a second wiring layer covering portion for covering a part of the second wiring layer inner surface.

[Remark 9]

The electronic device described in remark 8 further comprises a protective film for covering a portion of the second wiring layer inner surface, the portion being exposed from the external electrode.

[Remark 10]

Regarding the electronic device described in remark 8 or remark 9, the first conductor inner surface is in contact with the second wiring layer main surface.

[Remark 11]

The electronic device described in any one of remark 1 through remark 10 further comprises a conductive connecting layer for connecting the first electronic component with the first wiring layers;

- wherein a part of the first wiring layer overlaps the first electronic component when viewed in the first direction, and
- wherein the conductive connecting layer lies between the first component inner surface and the first wiring layer.

[Remark 12]

The electronic device described in any one of remark 1 through remark 11 further comprises a second conductor penetrating the second resin layer in the first direction and the second conductor is disposed on a periphery of the first electronic component when viewed in the first direction.

[Remark 13]

Regarding the electronic device described in remark 12, the second conductor and the first wiring layer are spaced apart from each other when viewed in the first direction.

[Remark 14]

Regarding the electronic device described in remark 13, the second conductor surrounds the first electronic component when viewed in the first direction.

[Remark 15]

Regarding the electronic device described in any one of remark 12 through remark 14, the second conductor has a second conductor main surface facing the same direction as the second resin layer main surface in the first direction, and the second conductor main surface is exposed from the second resin layer main surface.

[Remark 16]

The electronic device described in remark 15 further comprises a metal film overlapping the first electronic component and formed on the second resin layer main surface when viewed in the first direction.

[Remark 17]

Regarding the electronic device described in remark 16, the metal film is in contact with the second conductor main surface.

[Remark 18]

Regarding the electronic device described in any one of remark 15 through remark 17, the second conductor main surface dents relative to the second resin layer main surface.

[Remark 19]

Regarding the electronic device described in any one of remark 1 through remark 18, the first electronic component is a semiconductor component which comprises a semiconductor.

[Remark 20]

A manufacturing method of an electronic device, comprising:

- a supporting substrate preparing step, preparing a supporting substrate having a substrate main surface and a substrate inner surface, the substrate main surface and the substrate inner surface face opposite sides in a first direction;
- a first conductor forming step, forming a first conductor on the substrate main surface;
- a first resin layer forming step, forming a first resin layer for covering the first conductor;
- a first resin layer grinding step, grinding the first resin layer in the first direction from a side which the substrate main surface faces to a side which the substrate inner surface faces such that a portion of the first conductor is exposed from the first resin layer, so as to respectively form a first conductor main surface and a first resin layer main surface, the first conductor main surface and the first resin layer main surface face the same side as the substrate main surface in the first direction;
- a first wiring layer forming step, forming a first wiring layer straddling the first resin layer main surface and the first conductor main surface;
- a first electronic component mounting step, electrically connecting a first electronic component on the first wiring layer;
- a second resin layer forming step, forming a second resin layer for covering the first wiring layers and the first electronic component;
- a supporting substrate removing step, removing the supporting substrate to expose a first resin layer inner surface facing opposite side with the first resin layer main surface in the first direction; and
- an external electrode forming step, forming an external electrode, the external electrode is disposed closer to the side where the first resin layer inner surface faces than the first resin layer, and the external electrode is electrically connected to the first conductor.

[Remark 21]

Regarding the method described in remark 20, after the supporting substrate preparing step and before the first conductor forming step, further comprises: a second wiring layer forming step, forming a second wiring layer for covering a part of the substrate main surface, and in the first conductor forming step, forming the first conductor on the second wiring layer.

[Remark 22]

The method described in remark 21 further comprises a second electronic component mounting step for electrically connecting a second electronic component on the second wiring layer.

[Remark 23]

The method described in any one of remark 20 through remark 22 after the first resin layer grinding step and before the second resin layer forming step, further comprises a second conductor forming step, forming a second conductor on a part of the first resin layer.

What is claimed is:

1. An electronic device, comprising:

- a first resin layer having a first resin layer main surface and a first resin layer inner surface, the first resin layer main surface and the first resin layer inner surface face opposite sides in a first direction;
- a first conductor having a first conductor main surface and a first conductor inner surface, the first conductor main surface and the first conductor inner surface face opposite sides in the first direction, and the first conductor penetrates the first resin layer in the first direction;
- a first wiring layer formed adjacent to the first resin layer main surface and connected to the first conductor main surface;
- a first electronic component having a first component main surface facing same side as the first resin layer main surface in the first direction and a first component inner surface facing same side as the first resin layer inner surface, and electrically connected with the first wiring layer;
- a second resin layer having a second resin layer main surface facing same direction as the first resin layer main surface and a second resin layer inner surface being in contact with the first resin layer main surface, and covering the first wiring layer and the first electronic component;
- an external electrode disposed closer to a side where the first resin layer inner surface faces than the first resin layer, and electrically connected to the first conductor; and
- a second conductor penetrating the second resin layer in the first direction, wherein
- the second conductor is disposed on a periphery of the first electronic component when viewed in the first direction.

2. The electronic device of claim 1, wherein a grinding mark is formed on the first resin layer main surface.

3. The electronic device of claim 2, wherein the first conductor main surface dents relative to the first resin layer main surface.

4. The electronic device of claim 1, further comprising:

- a second wiring layer having a second wiring layer main surface and a second wiring layer inner surface,
- the second wiring layer main surface and the second wiring layer inner surface facing opposite sides in the first direction, and
- the second wiring layer inner surface being exposed from the first resin layer inner surface.

5. The electronic device of claim 4, further comprising:

- a second electronic component is different from the first electronic component, wherein
- the second electronic component is electrically connected to the second wiring layer, and at least a part of the second electronic component is covered by the first resin layer.

6. The electronic device of claim 5, wherein the second electronic component has a second component main surface facing same direction as the first component main surface, and the second component main surface and the first resin layer main surface are coplanar.

7. The electronic device of claim 1, wherein the external electrode comprises a first conductor covering portion for covering the first conductor inner surface.

8. The electronic device of claim 4, wherein the external electrode comprises a second wiring layer covering portion for covering a part of the second wiring layer inner surface.

9. The electronic device of claim 8, further comprising:

a protective film covering a portion of the second wiring layer inner surface, the portion being exposed from the external electrode.

10. The electronic device of claim 8, wherein the first conductor inner surface is in contact with the second wiring layer main surface.

11. The electronic device of claim 1, further comprising:

a conductive connecting layer connecting the first electronic component with the first wiring layer, wherein a part of the first wiring layer overlaps the first electronic component when viewed in the first direction, and wherein the conductive connecting layer lies between the first component inner surface and the first wiring layer.

12. The electronic device of claim 1, wherein the second conductor is spaced apart from the first wiring layer when viewed in the first direction.

13. The electronic device of claim 12, wherein the second conductor surrounds the first electronic component when viewed in the first direction.

14. The electronic device of claim 1, wherein the second conductor has a second conductor main surface facing a same direction as the second resin layer main surface in the first direction, and the second conductor main surface is exposed from the second resin layer main surface.

* * * * *